(12) United States Patent
Miwa et al.

(10) Patent No.: US 11,422,165 B2
(45) Date of Patent: Aug. 23, 2022

(54) CURRENT SENSOR

(71) Applicant: DENSO CORPORATION, Kariya (JP)

(72) Inventors: Hiroaki Miwa, Kariya (JP); Akito Sasaki, Kariya (JP); Ryosuke Sakai, Kariya (JP); Takuma Esaka, Kariya (JP); Tatsuaki Sugito, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/023,994

(22) Filed: Sep. 17, 2020

(65) Prior Publication Data

US 2021/0003616 A1 Jan. 7, 2021

Related U.S. Application Data

(63) Continuation of application No. PCT/JP2019/001757, filed on Jan. 22, 2019.

(30) Foreign Application Priority Data

Mar. 20, 2018 (JP) .............................. JP2018-052963

(51) Int. Cl.
*G01R 15/20* (2006.01)
*G01R 19/00* (2006.01)

(52) U.S. Cl.
CPC ......... *G01R 15/205* (2013.01); *G01R 15/207* (2013.01); *G01R 19/0092* (2013.01)

(58) Field of Classification Search
CPC . G01R 15/205; G01R 15/207; G01R 19/0092
See application file for complete search history.

(56) References Cited

U.S. PATENT DOCUMENTS

| | | | |
|---|---|---|---|
| 2011/0050222 A1* | 3/2011 | Ueno ................... | G01R 15/207 324/253 |
| 2014/0049255 A1 | 2/2014 | Kitamoto | |
| | | (Continued) | |

FOREIGN PATENT DOCUMENTS

| | | |
|---|---|---|
| JP | 2000-213944 A | 8/2000 |
| JP | 2002-340942 A | 11/2002 |
| | (Continued) | |

OTHER PUBLICATIONS

U.S. Appl. No. 17/022,190, filed Sep. 16, 2020, Esaka et al.
(Continued)

*Primary Examiner* — Dominic E Hawkins
(74) *Attorney, Agent, or Firm* — Posz Law Group, PLC

(57) ABSTRACT

A current sensor includes a plurality of individual sensors and a wiring case. Each of the individual sensors includes an electrical-conduction member through which a measurement current to be measured flows, a magnetoelectric converter and an insulating sensor housing. The magnetoelectric converter converts a measurement magnetic field caused by a flow of the measurement current into an electric signal. The sensor housing accommodates the electrical-conduction member and the magnetoelectric converter therein. The wiring case is larger than the sensor housing. The wiring case includes an insulating integrated housing in which the plurality of individual sensors is fixed, and an input/output wiring disposed in the integrated housing and electrically connected to the megnetoelectric converter of each of the plurality of individual sensors.

3 Claims, 42 Drawing Sheets

(56) References Cited

U.S. PATENT DOCUMENTS

| | | |
|---|---|---|
| 2014/0070801 A1 | 3/2014 | Tamura |
| 2015/0260762 A1* | 9/2015 | Sakamoto ............... G01R 1/18 324/117 R |
| 2015/0276817 A1 | 10/2015 | Sekimoto et al. |
| 2016/0258985 A1 | 9/2016 | Nomura et al. |
| 2017/0242058 A1 | 8/2017 | Kawanami et al. |
| 2017/0285076 A1 | 10/2017 | Okuyama et al. |
| 2017/0343584 A1 | 11/2017 | Abe |

FOREIGN PATENT DOCUMENTS

| | | |
|---|---|---|
| JP | 2005-195427 A | 7/2005 |
| JP | 2010-014477 A | 1/2010 |
| JP | 2013-015358 A | 1/2013 |
| JP | 2013-145165 A | 7/2013 |
| JP | 2014-041049 A | 3/2014 |
| JP | 2015-049053 A | 3/2015 |
| JP | 2015-049184 A | 3/2015 |
| JP | 2015-108554 A | 6/2015 |
| JP | 2015-135288 A | 7/2015 |
| JP | 2015-190781 A | 11/2015 |
| JP | 2016-070744 A | 5/2016 |
| JP | 2017-072467 A | 4/2017 |
| JP | 2017-102022 A | 6/2017 |
| JP | 2017-156319 A | 9/2017 |
| JP | 2019-164077 A | 9/2019 |
| JP | 2019-164080 A | 9/2019 |
| JP | 2019-164081 A | 9/2019 |

OTHER PUBLICATIONS

U.S. Appl. No. 17/022,861, filed Sep. 16, 2020, Esaka et al.
U.S. Appl. No. 17/023,508, filed Sep. 17, 2020, Esaka et al.
U.S. Appl. No. 17/023,568, filed Sep. 17, 2020, Sasaki et al.

* cited by examiner

FIG. 17
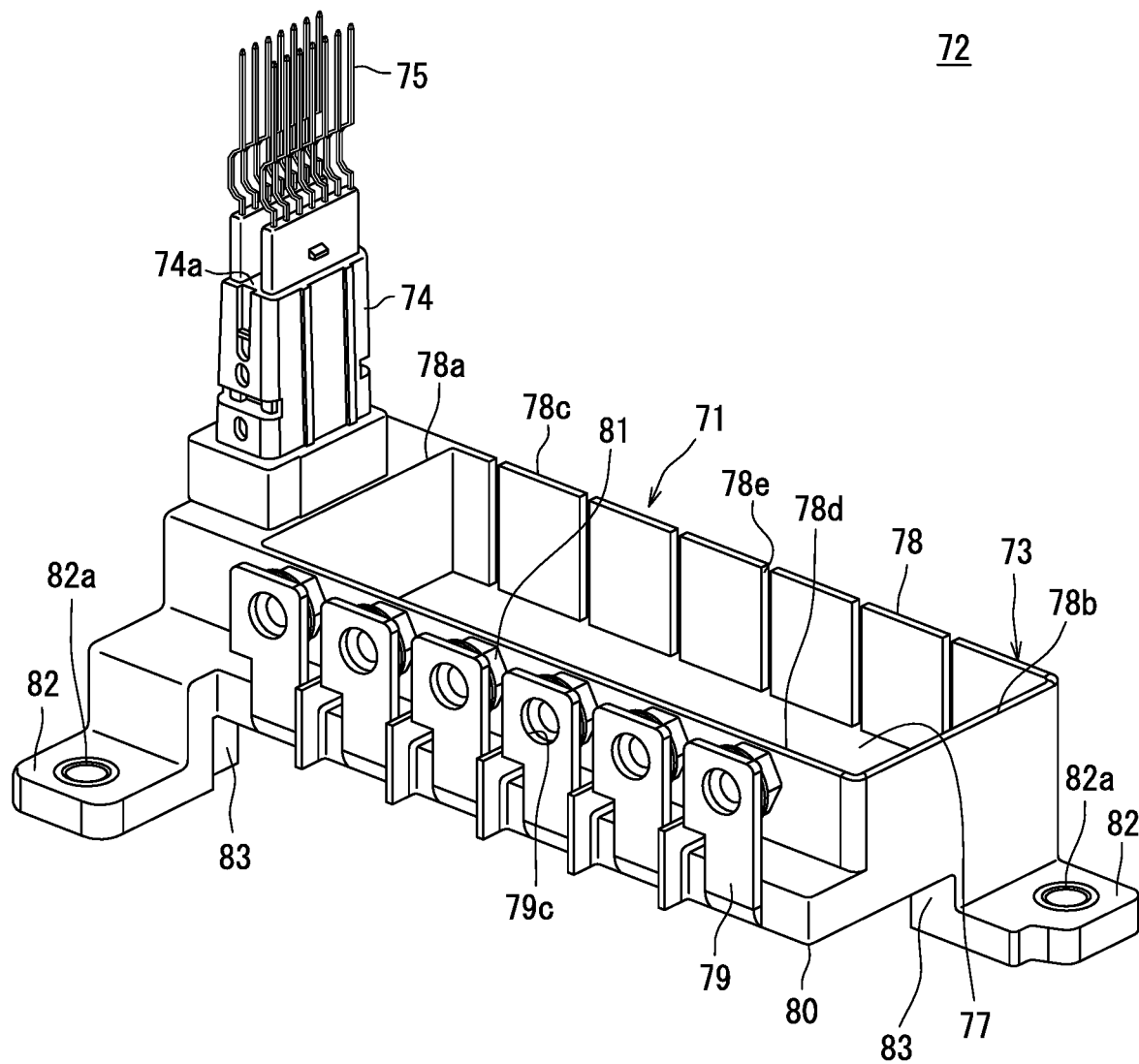
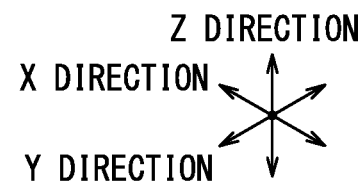

FIG. 18
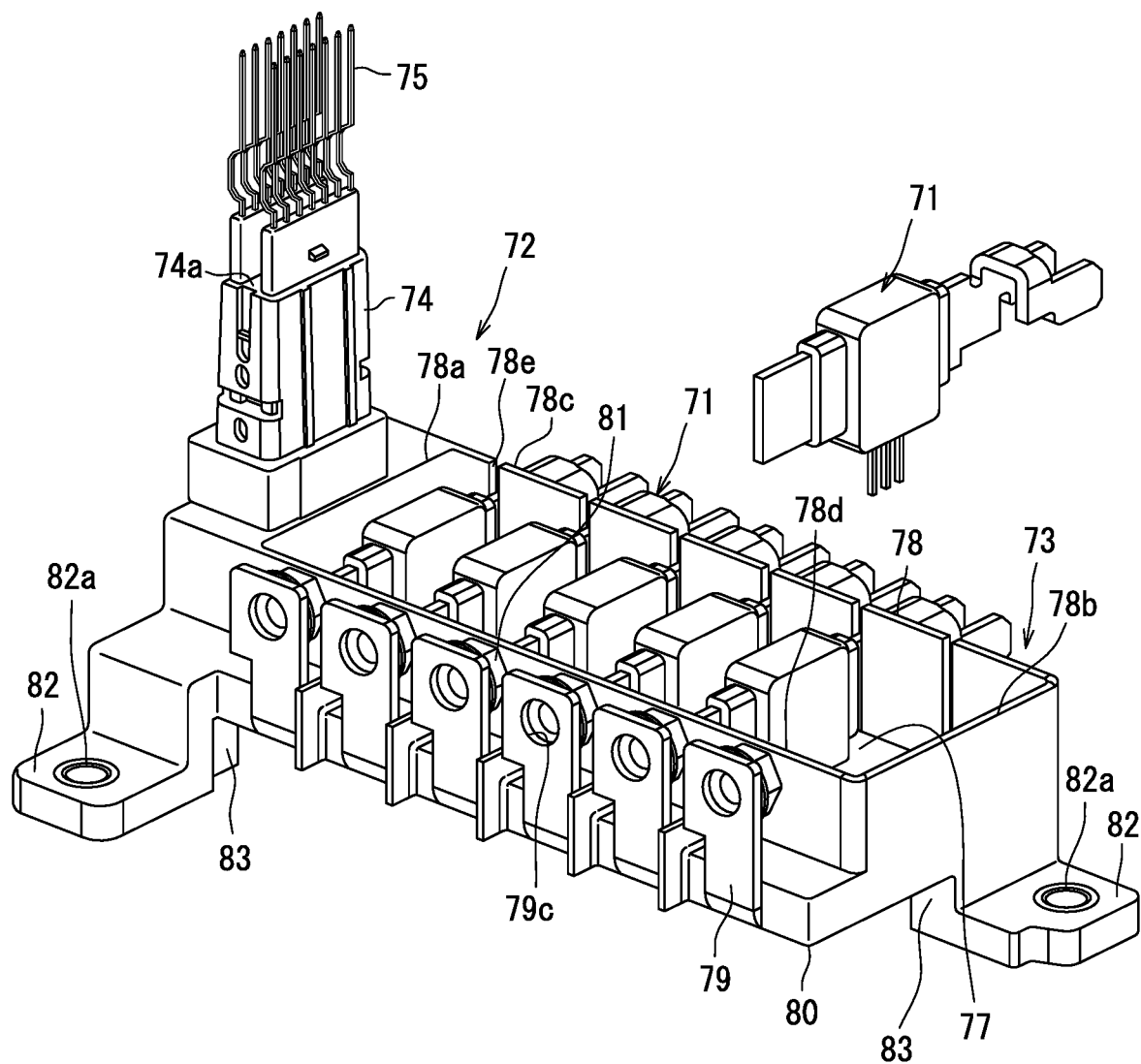
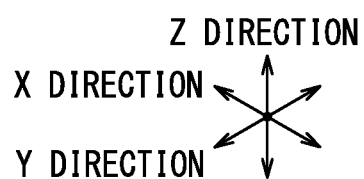

FIG. 19
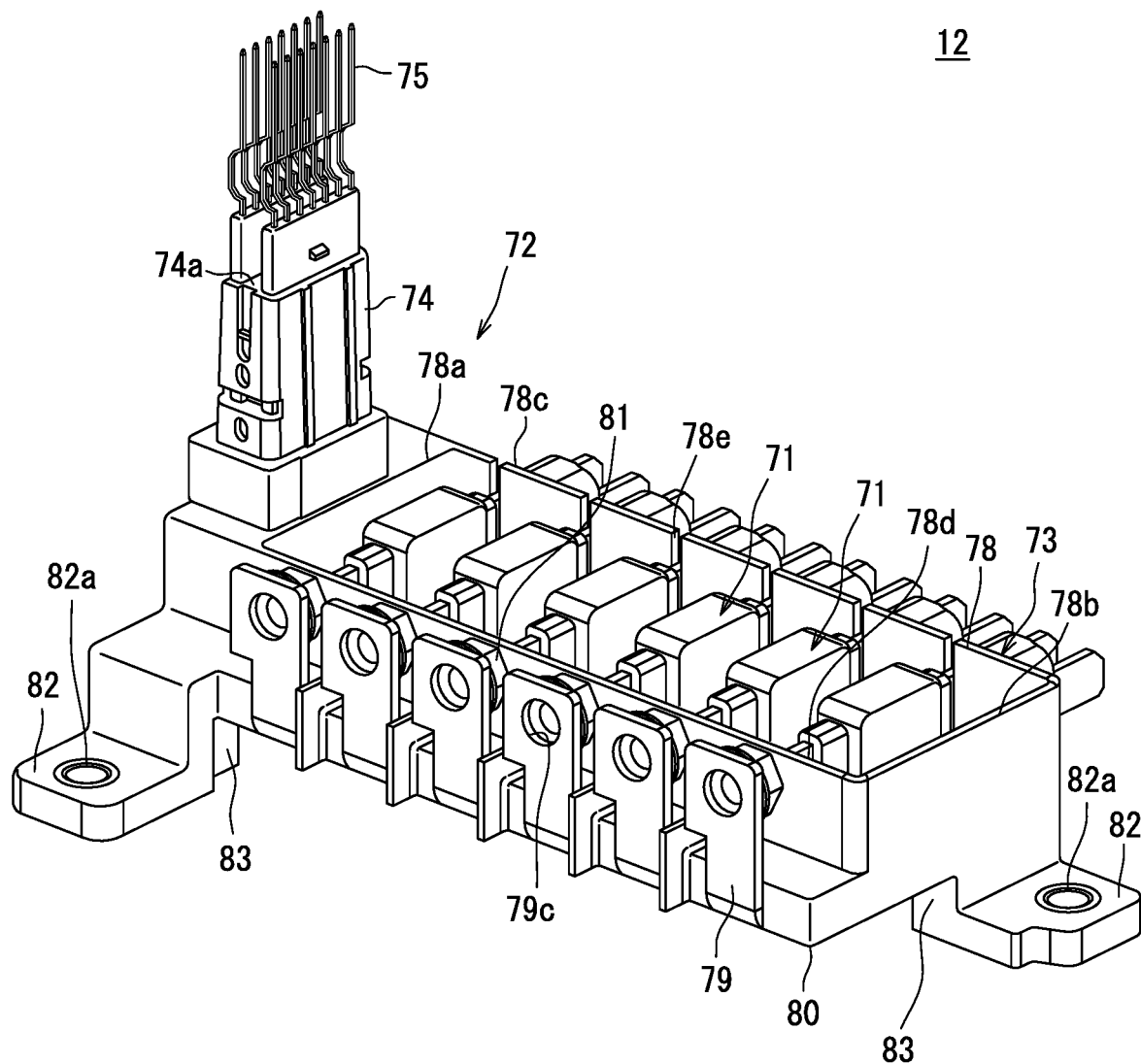
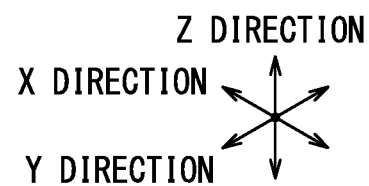

CURRENT SENSOR

CROSS REFERENCE TO RELATED APPLICATIONS

The present application is a continuation application of International Patent Application No. PCT/JP2019/001757 filed on Jan. 22, 2019, which designated the U.S. and claims the benefit of priority from Japanese Patent Application No. 2018-052963 filed on Mar. 20, 2018. The entire disclosures of all of the above applications are incorporated herein by reference.

TECHNICAL FIELD

The present disclosure relates to a current sensor to detect a measurement current to be measured.

BACKGROUND

A current detection system, such as a current sensor, generally detects a current by converting a magnetic field caused with a current flowing through a bus bar into an electric signal.

SUMMARY

The present disclosure describes a current sensor including a plurality of individual sensors and a wiring case. Each of the individual sensors includes an electrical-conduction member, a magnetoelectric converter and an insulating sensor housing. The magnetoelectric converter converts a measurement magnetic field caused by a flow of a measurement current in the electrical-conduction member into an electric signal. The sensor housing accommodates the electrical-conduction member and the magnetoelectric converter therein. The wiring case is larger than the sensor housing. The wiring case includes an insulating integrated housing in which the plurality of individual sensors is fixed, and an input/output wiring disposed in the integrated housing and electrically connected to the magnetoelectric converter of each of the plurality of individual sensors.

BRIEF DESCRIPTION OF DRAWINGS

Objects, features and advantages of the present disclosure will become more apparent from the following detailed description made with reference to the accompanying drawings, in which:

FIG. 17 is a perspective view of a wiring case;
FIG. 18 is a perspective view for explaining assembling of the individual sensor to the wiring case;
FIG. 19 is a perspective view of a second current sensor.

DETAILED DESCRIPTION

According to an embodiment of the present disclosure, a current sensor includes a plurality of individual sensors and a wiring case. Each of the plurality of individual sensors includes an electrical-conduction member through which a measurement current to be measured flows, a magnetoelectric converter, and an insulating sensor housing. The magnetoelectric converter converts a measurement magnetic field caused by a flow of the measurement current into an electric signal. The insulating sensor housing accommodates the electrical-conduction member and the magnetoelectric converter therein. The wiring case is larger than the sensor housing. The wiring case includes an insulating integrated housing and an input-output wiring. The plurality of individual sensors is fixed in the integrated housing. The input/output wiring is disposed in the integrated housing and electrically connected to the magnetoelectric converter of each of the plurality of individual sensors.

The electrical-conduction member is likely to cause misalignment relative to a housing due to a manufacturing error of a housing and creep of the housing with time deterioration. Such misalignments increases with an increase in the size of the housing.

In the above-described configuration, the electrical-conduction member is accommodated in the sensor housing, which is smaller than the integrated housing. Therefore, an occurrence of misalignment of the electrical-conduction member and the magnetoelectric converter due to the manufacturing error or creep with time deterioration will be suppressed. As a result, the degradation of the detection accuracy of the measured current can be suppressed.

Hereinafter, embodiments of the present disclosure will be further described with reference to the drawings.

First Embodiment

<In-Vehicle System>

Figure 1:
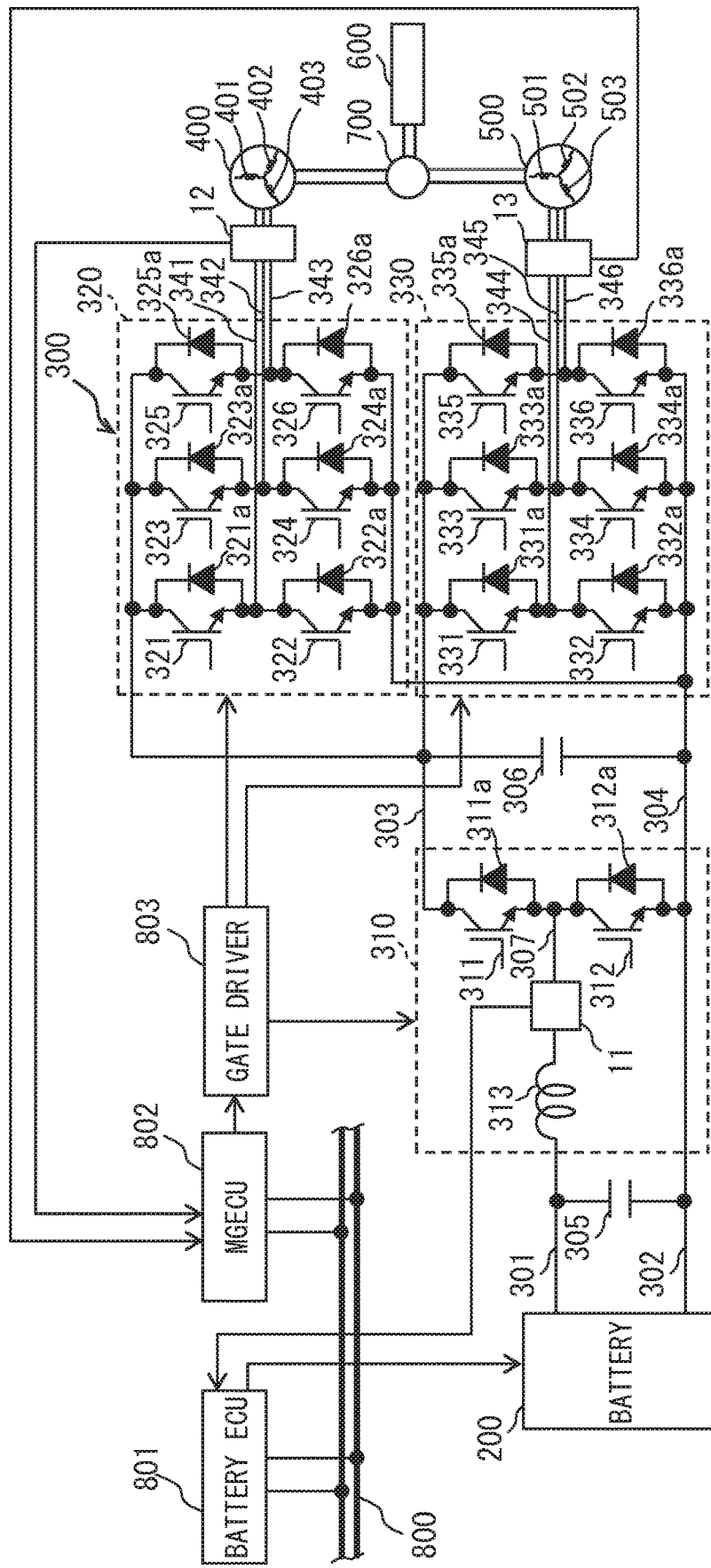
FIG. 1 is a block diagram for explaining an in-vehicle system.

First, an in-vehicle system 100 to which a current sensor is applied will be described. The in-vehicle system 100 forms a hybrid system. As shown in FIG. 1, the in-vehicle system 100 has a battery 200, a power converter 300, a first motor 400, a second motor 500, an engine 600, and a power divider 700.

The in-vehicle system 100 has multiple ECUs. FIG. 1 illustrates a battery ECU 801 and an MG ECU 802 as representatives of the multiple ECUs. The multiple ECUs mutually transmit and receive a signal(s) via a bus wiring 800, and perform cooperative control on a hybrid vehicle. With this cooperative control, regeneration and power running of the first motor 400, power generation of the second motor 500, and output of the engine 600 and the like are controlled in correspondence with a SOC of the battery 200. SOC is an abbreviation for a state of charge. ECU is an abbreviation for an electronic control unit.

Note that the ECU has at least one calculation processing unit (CPU), and at least one memory device (MMR) as a storage medium to hold a program and data. The ECU is provided with a microcomputer having a computer-readable storage medium. The storage medium is a non-transitory substantive storage medium to non-temporarily hold a computer-readable program. The storage medium may be provided by a semiconductor memory, a magnetic disk or the like. Hereinafter, the constituent elements of the in-vehicle system 100 will be individually summarized.

The battery 200 has multiple rechargeable batteries. The multiple rechargeable batteries form a serially-connected battery stack. As a rechargeable battery, a lithium ion rechargeable battery, a nickel-metal hydride rechargeable battery, an organic radical battery and the like may be employed.

The rechargeable battery generates an electromotive voltage by chemical reaction. The rechargeable battery has a property that deterioration accelerates when the charge amount is too large or too small. In other words, the rechargeable battery has a property that deterioration accelerates when the SOC is overcharge or overdischarge.

The SOC of the battery 200 corresponds to the SOC of the above-described battery stack. The SOC of the battery stack is the total sum of the SOCs of the multiple rechargeable batteries. The overcharge and overdischarge of the SOC of the battery stack can be avoided by the above-described cooperative control. On the other hand, the overcharge and overdischarge of the respective SOCs of the multiple rechargeable batteries can be avoided by equalization processing of equalizing the respective SOCs of the multiple rechargeable batteries.

The equalization processing is performed by individually charging/discharging the multiple rechargeable batteries. The battery 200 includes a switch to individually charge/discharge the multiple rechargeable batteries. Further, the battery 200 includes a voltage sensor, a temperature sensor and the like to detect the respective SOCs of the multiple rechargeable batteries. The battery ECU 801 controls to open and close the switch based on outputs from these sensors and a first current sensor 11 to be described later. With this configuration, the respective SOCs of the multiple rechargeable batteries are equalized.

The power converter 300 performs power conversion between the battery 200 and the first motor 400. Further, the power converter 300 also performs power conversion between the battery 200 and the second motor 500. The power converter 300 converts direct current power of the battery 200 into alternating current power at a voltage level appropriate to power running of the first motor 400 and the second motor 500. The power converter 300 converts alternating current power generated by power generation with the first motor 400 and the second motor 500 into direct current power at a voltage level appropriate to charging of the battery 200. The power converter 300 will be described in detail later.

The first motor 400, the second motor 500, and the engine 600 are connected to the power divider 700. The first motor 400 is directly connected to an output shaft of a hybrid vehicle, which is not illustrated. The rotational energy of the first motor 400 is transmitted via the output shaft to a running wheel. On the contrary, the rotational energy of the running wheel is transmitted via the output shaft to the first motor 400.

Power running of the first motor 400 is performed with the alternating current power supplied from the power converter 300. Rotational energy generated by the power running is distributed with the power divider 700 to the engine 600 and the output shaft of the hybrid vehicle. With this configuration, cranking of a crankshaft and application of a propulsive force to the running wheel are performed. Further, regeneration of the first motor 400 is performed with the rotational energy transmitted from the running wheel. Alternating current power generated by the regeneration is converted with the power converter 300 into direct current power and voltage-reduced. This direct current power is supplied to the battery 200. Further, the direct current power is also supplied to various electric load mounted on the hybrid vehicle.

Power generation of the second motor 500 is performed with the rotational energy supplied from the engine 600. Alternating current power generated by the power generation is converted with the power converter 300 into direct current power and voltage-reduced. This direct current power is supplied to the battery 200 and the various electric load.

The engine 600 generates rotational energy by combustion driving using fuel. The rotational energy is distributed via the power divider 700 to the second motor 500 and the output shaft. With this configuration, power generation of the second motor 500 and application of a propulsive force to the running wheel are performed.

The power divider 700 has a planetary gear mechanism. The power divider 700 has a ring gear, a planetary gear, a sun gear, and a planetary carrier.

The ring gear has a ring shape. Multiple teeth are formed to be arrayed in a circumferential direction respectively on an outer peripheral surface and an inner peripheral surface of the ring gear.

The planetary gear and the sun gear each have a disk shape. Multiple teeth are formed to be arrayed in the circumferential direction on the respective circumferential surfaces of the planetary gear and the sun gear.

The planetary carrier has a ring shape. Multiple planetary gears are connected to a flat surface connecting an outer peripheral surface and an inner peripheral surface of the planetary carrier. The respective flat surfaces of the planetary carrier and the planetary gear are opposite to each other.

The multiple planetary gears are positioned on the circumference about a rotational center of the planetary carrier. The multiple planetary gears are provided at an equal interval between adjacent gears. In the present embodiment, three planetary gears are arrayed at an interval of 120°.

The sun gear is provided at the center of the ring gear. The inner peripheral surface of the ring gear and the outer peripheral surface of the sun gear are opposite to each other. Three planetary gears are provided between the ring gear and the sun gear. The teeth of the respective three planetary gears are engaged with the respective teeth of the ring gear and the sun gear. With this configuration, the respective rotation of the ring gear, the rotation of the planetary gears, the rotation of the sun gear, and the rotation of the planetary carrier are mutually transmitted.

The output shaft of the first motor 400 is connected to the ring gear. The crankshaft of the engine 600 is connected to the planetary carrier. The output shaft of the second motor 500 is connected to the sun gear. With this configuration, the rotation speed of the first motor 400, the rotation speed of the engine 600, and the rotation speed of the second motor 500 are in a linear relationship in an alignment chart.

Torque is generated with the ring gear and the sun gear by supplying alternating current power from the power converter 300 to the first motor 400 and the second motor 500. Torque is generated with the planetary carrier by combustion driving with the engine 600. With this configuration, the power running and the regeneration of the first motor 400, the power generation of the second motor 500, and the application of a propulsive force to the running wheel, respectively, are performed.

The behavior of the first motor 400, the behavior of the second motor 500, and the behavior of the engine 600, respectively, are subjected to cooperative control with the multiple ECUs. For example, the MG ECU 802 determines a target torque for the first motor 400 and the second motor 500 based on the physical quantities detected with the various sensors mounted on the hybrid vehicle and vehicle information inputted from other ECUs, and the like. The MG ECU 802 performs vector control so as to bring the torque, respectively generated with the first motor 400 and the second motor 500, to the target torque.

<Power Converter>

Next, the power converter 300 will be described. The power converter 300 has a converter 310, a first inverter 320, and a second inverter 330. The converter 310 performs a function of stepping up and down the voltage level of direct current power. The first inverter 320 and the second inverter 330 perform a function of converting direct current power into alternating current power. The first inverter 320 and the second inverter 330 perform a function of converting alternating current power into direct current power.

In the in-vehicle system 100, the converter 310 boosts the direct current power of the battery 200 to a voltage level appropriate to power running of the first motor 400 and the second motor 500. The first inverter 320 and the second inverter 330 convert the direct current power into alternating current power. The alternating current power is supplied to the first motor 400 and the second motor 500. Further, the first inverter 320 and the second inverter 330 convert the alternating current power generated with the first motor 400 and the second motor 500 into direct current power. The converter 310 reduces the direct current power to a voltage level appropriate to charging of the battery 200.

As shown in FIG. 1, the converter 310 is electrically connected via a first power line 301 and a second power line 302 to the battery 200. The converter 310 is electrically connected via a third power line 303 and a fourth power line 304 to the first inverter 320 and the second inverter 330 respectively.

One end of the first power line 301 is electrically connected to the cathode of the battery 200. One end of the second power line 302 is electrically connected to the anode of the battery 200. The respective other ends of the first power line 301 and the second power line 302 are electrically connected to the converter 310.

A first smoothing capacitor 305 is connected to the first power line 301 and the second power line 302. One of two electrodes of the first smoothing capacitor 305 is connected to the third power line 303, and the other electrode is connected to the fourth power line 304.

Note that the battery 200 has a system main relay (SMR), which is not illustrated. The electric connection between the battery stack of the battery 200 and the power converter 300 is controlled by opening and closing of the system main relay. That is, continuation and interruption of power supply between the battery 200 and the power converter 300 is controlled by the opening and closing of the system main relay.

One end of the third power line 303 is electrically connected to a high side switch 311 of the converter 310. One end of the fourth power line 304 is electrically connected to the other end of the second power line 302. The respective other ends of the third power line 303 and the fourth power line 304 are electrically connected to the first inverter 320 and the second inverter 330 respectively.

A second smoothing capacitor 306 is connected to the third power line 303 and the fourth power line 304. One of two electrodes of the second smoothing capacitor 306 is connected to the third power line 303, and the other electrode is connected to the fourth power line 304.

The first inverter 320 is electrically connected via first energization bus bar 341 to third energization bus bar 343 to first U phase stator coil 401 to first W phase stator coil 403 of the first motor 400. The second inverter 330 is electrically connected via fourth energization bus bar 344 to sixth energization bus bar 346 to second U phase stator coil 501 to second W phase stator coil 503 of the second motor 500.

<Converter>

The converter 310 has the high side switch 311, a low side switch 312, a high side diode 311a, a low side diode 312a, and a reactor 313. As the high side switch 311 and the low side switch 312, an IGBT, a power MOSFET or the like may be employed. In the present embodiment, an n-channel type IGBT is employed as the high side switch 311 and the low side switch 312.

Note that when the high side switch 311 and the low side switch 312 are each provided by the MOSFET, a body diode is formed in the MOSFET.

Accordingly, the high side diode 311a and the low side diode 312a may be omitted. The semiconductor device forming the converter 310 may be manufactured with a semiconductor such as Si, or a wide gap semiconductor such SiC.

The high side diode 311a is connected in anti-parallel to the high side switch 311. That is, the cathode electrode of the high side diode 311a is connected to the collector electrode of the high side switch 311. The anode electrode of the high side diode 311a is connected to the emitter electrode of the high side switch 311.

Similarly, the low side diode 312a is connected in anti-parallel to the low side switch 312. The cathode electrode of the low side diode 312a is connected to the collector electrode of the low side switch 312. The anode electrode of the low side diode 312a is connected to the emitter electrode of the low side switch 312.

As shown in FIG. 1, the third power line 303 is electrically connected to the collector electrode of the high side switch 311. The emitter electrode of the high side switch 311 and the collector electrode of the low side switch 312 are connected to each other. The second power line 302 and the fourth power line 304 are electrically connected to the emitter electrode of the low side switch 312. With this configuration, the high side switch 311 and the low side switch 312 are connected in series, in order, from the third power line 303 toward the second power line 302. In other words, the high side switch 311 and the low side switch 312 are connected in series, in order, from the third power line 303 toward the fourth power line 304.

A middle point between the high side switch 311 and the low side switch 312, which are connected in series, is electrically connected to one end of the reactor 313 via the energization bus bar 307. The other end of the reactor 313 is electrically connected to the other end of the first power line 301.

With the above-described configuration, the direct current power of the battery 200 is supplied via the reactor 313 and the energization bus bar 307 to the middle point between the high side switch 311 and the low side switch 312, which are connected in series. The alternating current power of the motor, converted with at least one of the first inverter 320 and the second inverter 330 into the direct current power, is supplied to the collector electrode of the high side switch 311. The alternating current power of the motor, converted into the direct current power, is supplied via the high side switch 311, the energization bus bar 307, and the reactor 313, to the battery 200.

In this manner, the direct current power inputted to or outputted from the battery 200 flows through the energization bus bar 307. When the flowing physical quantities are limited, the direct current inputted to or outputted from the battery 200 flows through the energization bus bar 307.

The high side switch 311 and the low side switch 312 of the converter 310 are controlled to be open and closed with the MG ECU 802. The MG ECU 802 generates a control signal and outputs the control signal to a gate driver 803. The gate driver 803 amplifies the control signal and outputs the control signal to the gate electrode of the switch. With this configuration, the MG ECU 802 steps up or down the voltage level of the direct current power inputted into the converter 310.

The MG ECU 802 generates a pulse signal as a control signal. The MG ECU 802 controls the voltage stepping up and down levels of the direct current power by controlling the on duty ratio and frequency of the pulse signal. The voltage stepping up and down levels are determined in correspondence with the above-described target torque and the SOC of the battery 200.

When the direct current power of the battery 200 is stepped up, the MG ECU 802 alternately opens and closes the high side switch 311 and the low side switch 312 respectively. For this purpose, the MG ECU 802 inverts the voltage level of the control signal outputted to the high side switch 311 and the low side switch 312.

When a high level signal is inputted into the gate electrode of the high side switch 311, a low level signal is inputted into the gate electrode of the low side switch 312. In this case, the direct current power of the battery 200 is supplied via the reactor 313 and the high side switch 311 to the first inverter 320 and the second inverter 330. At this time, electrical energy is stored in the reactor 313 by flow of the current. Further, electric charge is stored in the second smoothing capacitor 306. The second smoothing capacitor 306 is charged.

When a low level signal is inputted into the gate electrode of the high side switch 311, a high level signal is inputted into the gate electrode of the low side switch 312. In this case, a closed loop passing through the first smoothing capacitor 305, the reactor 313, and the low side switch 312 is formed. As described above, since the electrical energy is stored in the reactor 313, the reactor 313 attempts to pass the current. The current caused by the electrical energy in the reactor 313 flows through the above-described closed loop.

In this case, supply of the direct current power via the high side switch 311 to the first inverter 320 and the second inverter 330 stops. However, the second smoothing capacitor 306 is charged. Accordingly, electric power is supplied from the second smoothing capacitor 306 to the first inverter 320 and the second inverter 330. The power supply to the first inverter 320 and the second inverter 330 is continued.

Thereafter, a high level signal is inputted into the high side switch 311, while a low level signal is inputted into the low side switch 312. At this time, the electrical energy stored in the reactor 313 is supplied, together with the direct current power of the battery 200, as direct current power, to the first inverter 320 and the second inverter 330. With this configuration, the direct current power of the battery 200, stepped up in a time-average manner, is supplied to the first inverter 320 and the second inverter 330. Further, the charging of the second smoothing capacitor 306 is recovered, and the charging amount is increased. The voltage level of the direct current power supplied from the second smoothing capacitor 306 to the first inverter 320 and the second inverter 330 is raised.

When the direct current power supplied from at least one of the first inverter 320 and the second inverter 330 is stepped down, the MG ECU 802 fixes the control signal outputted to the low side switch 312 at the low level. At the same time, the MG ECU 802 switches the control signal outputted to the high side switch 311 to the high level and the low level sequentially.

When a high level signal is inputted into the gate electrode of the high side switch 311, the direct current power of at least one of the first inverter 320 and the second inverter 330 is supplied via the high side switch 311 and the reactor 313 to the battery 200.

When a low level signal is inputted into the gate electrode of the high side switch 311, the direct current power of at least one of the first inverter 320 and the second inverter 330 is not supplied to the battery 200. As a result, the direct current power reduced in a time-average manner is supplied to the battery 200.

To be more exact, when a high level signal is inputted into the gate electrode of the high side switch 311 as described above, the first smoothing capacitor 305 is charged. Electrical energy is stored in the reactor 313. Thereafter, when a low level signal is inputted into the gate electrode of the high side switch 311 and the output voltage and time constant of the second smoothing capacitor 306 and those of the battery 200 are different, charging/discharging is performed between the second smoothing capacitor 306 and the battery 200. Further, a diode, which is not illustrated, connects the first power line 301 and the second power line 302. The anode electrode of the diode is connected to the second power line 302, and the cathode electrode of the diode is connected to the first power line 301. Accordingly, a closed loop passing through the diode, the reactor 313, and the first smoothing capacitor 305 is formed. The current caused by the electrical energy in the reactor 313 flows through the closed loop.

<Inverter>

The first inverter 320 has first switch 321 to sixth switch 326, and first diode 321a to sixth diode 326a. As the first switch 321 to the sixth switch 326, an IGBT, a power MOSFET or the like may be employed. In the present embodiment, an n-channel type IGBT is employed as the first switch 321 to the sixth switch 326. When the MOSFET is employed as these switches, the above-described diode may be omitted. The semiconductor device forming the first inverter 320 may be manufactured with a semiconductor such as Si, or a wide gap semiconductor such as SiC.

The first diode 321a to the sixth diode 326a corresponding to the first switch 321 to the sixth switch 326 are connected in anti-parallel. That is, assuming that k is a natural number of 1 to 6, the cathode electrode of the k-th diode is connected to the collector electrode of the k-th switch. The anode electrode of the k-th diode is connected to the emitter electrode of the k-th switch.

The first switch 321 and the second switch 322 are connected in series, in order, from the third power line 303 toward the fourth power line 304. The first switch 321 and the second switch 322 form a first U phase leg. One end of the first energization bus bar 341 is connected to a middle point between the first switch 321 and the second switch 322. The other end of the first energization bus bar 341 is connected to the first U phase stator coil 401 of the first motor 400.

The third switch 323 and the fourth switch 324 are connected in series, in order, from the third power line 303 toward the fourth power line 304. The third switch 323 and the fourth switch 324 form a first V phase leg. One end of the second energization bus bar 342 is connected to a middle point between the third switch 323 and the fourth switch 324. The other end of the second energization bus bar 342 is connected to the first V phase stator coil 402 of the first motor 400.

The fifth switch 325 and the sixth switch 326 are connected in series, in order, from the third power line 303 toward the fourth power line 304. The fifth switch 325 and the sixth switch 326 form a first W phase leg. One end of the third energization bus bar 343 is connected to a middle point between the fifth switch 325 and the sixth switch 326. The other end of the third energization bus bar 343 is connected to the first W phase stator coil 403 of the first motor 400.

The second inverter 330 has a similar configuration to that of the first inverter 320. The second inverter 330 has seventh switch 331 to twelfth switch 336 and seventh diode 331a to twelfth diode 336a.

The seventh diode 331a to the twelfth diode 336a corresponding to the seventh switch 331 to the twelfth switch 336 are inversely parallel-connected. Assuming that n is a natural number of 7 to 12, the cathode electrode of the n-th diode is connected to the collector electrode of the n-th switch. The anode electrode of the n-th diode is connected to the emitter electrode of the n-th switch.

The seventh switch 331 and the eighth switch 332 are connected in series between the third power line 303 and the fourth power line 304, and form a second U phase leg. One end of the fourth energization bus bar 344 is connected to a middle point between the seventh switch 331 and the eighth switch 332. The other end of the fourth energization bus bar 344 is connected to the second U phase stator coil 501 of the second motor 500.

The ninth switch 333 and the tenth switch 334 are connected in series between the third power line 303 and the fourth power line 304, and form a second V phase leg. One end of the fifth energization bus bar 345 is connected to a middle point between the ninth switch 333 and the tenth switch 334. The other end of the fifth energization bus bar 345 is connected to the second V phase stator coil 502 of the second motor 500.

The eleventh switch 335 and the twelfth switch 336 are connected in series between the third power line 303 and the fourth power line 304, and form a second W phase leg. One end of the sixth energization bus bar 346 is connected to a middle point between the eleventh switch 335 and the twelfth switch 336. The other end of the sixth energization bus bar 346 is connected to the second W phase stator coil 503 of the second motor 500.

As described above, the first inverter 320 and the second inverter 330 respectively have three phase legs corresponding to the respective U phase to W phase stator coils of the motor. The control signal of the MG ECU 802, amplified with the gate driver 803, is inputted into the gate electrode of the switch of the respective three phase legs.

When the motor is subjected to power running, the respective switches are PWM controlled by output of the control signal from the MG ECU 802. With this configuration, a three-phase alternating current is generated with the inverter. When the motor generates power, the MG ECU 802 stops, for example, output of the control signal. The alternating current power generated by power generation with the motor passes through the diode. As a result, the alternating current power is converted into direct current power.

The above-described alternating current power inputted to or outputted from the first motor 400 flows through the first energization bus bar 341 to the third energization bus bar 343 connecting the first inverter 320 to the first motor 400. Similarly, the alternating current power inputted to or outputted from the second motor 500 flows through the fourth energization bus bar 344 to the sixth energization bus bar 346 connecting the second inverter 330 to the second motor 500.

When the flowing physical quantities are limited, the alternating current inputted to or outputted from the first motor 400 flows through the first energization bus bar 341 to the third energization bus bar 343. The alternating current inputted to or outputted from the second motor 500 flows through the fourth energization bus bar 344 to the sixth energization bus bar 346.

<Current Sensor>

Next, a current sensor applied to the in-vehicle system 100 described above will be described.

As a current sensor, the first current sensor 11, a second current sensor 12, and a third current sensor 13 are provided. The first current sensor 11 detects a current which flows through the converter 310. The second current sensor 12 detects a current which flows through the first motor 400. The third current sensor 13 detects a current which flows through the second motor 500.

The first current sensor 11 is provided on the energization bus bar 307. As described above, the direct current inputted to or outputted from the battery 200 flows through the energization bus bar 307. The first current sensor 11 detects the direct current.

The direct current detected with the first current sensor 11 is inputted into the battery ECU 801. The battery ECU 801 monitors the SOC of the battery 200 based on the direct current detected with the first current sensor 11, the voltage of the battery stack detected with a voltage sensor, which is not illustrated, and the like.

The second current sensor 12 is provided on the first energization bus bar 341 to the third energization bus bar 343. As described above, the alternating current inputted to or outputted from the first motor 400 flows through the first energization bus bar 341 to the third energization bus bar 343. The second current sensor 12 detects the alternating current.

The alternating current detected with the second current sensor 12 is inputted into the MG ECU 802. The MG ECU 802 vector-controls the first motor 400 based on the alternating current detected with the second current sensor 12, the rotation angle of the first motor 400 detected with a rotation angle sensor, which is not illustrated, and the like.

The third current sensor 13 is provided on the fourth energization bus bar 344 to the sixth energization bus bar 346. As described above, the alternating current inputted to or outputted from the second motor 500 flows through the fourth energization bus bar 344 to the sixth energization bus bar 346. The third current sensor 13 detects the alternating current.

The alternating current detected with the third current sensor 13 is inputted into the MG ECU 802. The MG ECU 802 vector-controls the second motor 500 based on the alternating current detected with the third current sensor 13, the rotation angle of the second motor 500 detected with a rotation angle sensor, which is not illustrated, and the like.

Note that the first U phase stator coil 401, the first V phase stator coil 402, and the first W phase stator coil 403 of the first motor 400 are star-connected. Similarly, the second U phase stator coil 501, the second V phase stator coil 502, and the second W phase stator coil 503 of the second motor 500 are star-connected. Accordingly, by detecting the currents in the two of the three phase stator coils, it is possible to detect the current in the remaining one phase stator coil.

A structure where these three phase stator coils are delta-connected may be employed. In this structure, by detecting the currents in the two of the three phase stator coils, it is possible to detect the current in the remaining one phase stator coil.

The second current sensor 12 is provided on two of the first energization bus bar 341 to the third energization bus bar 343 connected to the first U phase stator coil 401 to the first W phase stator coil 403. More specifically, the second current sensor 12 is provided on the first energization bus bar 341 and the second energization bus bar 342.

Accordingly, the second current sensor 12 detects the current which flows through the first U phase stator coil 401 and the current which flows through the first V phase stator coil 402. The MG ECU 802 detects the current which flows through the first W phase stator coil 403 based on the current which flows through the first U phase stator coil 401 and the current which flows through the first V phase stator coil 402.

Similarly, the third current sensor 13 is provided on two of the fourth energization bus bar 344 to the sixth energization bus bar 346 connected to the second U phase stator coil 501 to the second W phase stator coil 503. More specifically, the third current sensor 13 is provided on the fourth energization bus bar 344 and the fifth energization bus bar 345.

Accordingly, the third current sensor 13 detects the current which flows through the second U phase stator coil 501 and the current which flows through the second V phase stator coil 502. The MG ECU 802 detects the current which flows through the second W phase stator coil 503 based on the current which flows through the second U phase stator coil 501 and the current which flows through the second V phase stator coil 502.

The above-described direct current inputted to or outputted from the battery 200 and the alternating currents inputted to or outputted from the first motor 400 and the second motor 500 respectively correspond to a measurement current to be measured. The magnetic field generated by flow of these currents corresponds to a measured magnetic field to be measured.

<First Current Sensor>

As described above, the first current sensor 11 is provided on the energization bus bar 307. The energization bus bar 307 is divided into a part adjacent to the reactor 313 and a part adjacent to the high side switch 311 (low side switch 312). The first current sensor 11 is provided on the energization bus bar 307, in a form of bridging the divided parts of the energization bus bar 307. With this configuration, the current which flows through the energization bus bar 307, i.e., the direct current inputted to or outputted from the battery 200 flows through the first current sensor 11.

The configuration where the energization bus bar 307 is divided into the part adjacent to the reactor 313 and the part adjacent to the high side switch 311 is merely an example. For example, when the energization bus bar 307 is not divided and connected only to the high side switch 311 side, the first current sensor 11 bridges the reactor 313 and the energization bus bar 307.

As shown in FIG. 2 to FIG. 5, the first current sensor 11 has a wiring board 20, an electrical-conduction bus bar 30, a shield 40, and a sensor housing 50. The electrical-conduction bus bar 30 bridges the above-described energization bus bar 307. Accordingly, the direct current flows through the electrical-conduction bus bar 30. The electrical-conduction bus bar 30 corresponds to an electrical-conduction member.

Figure 4:
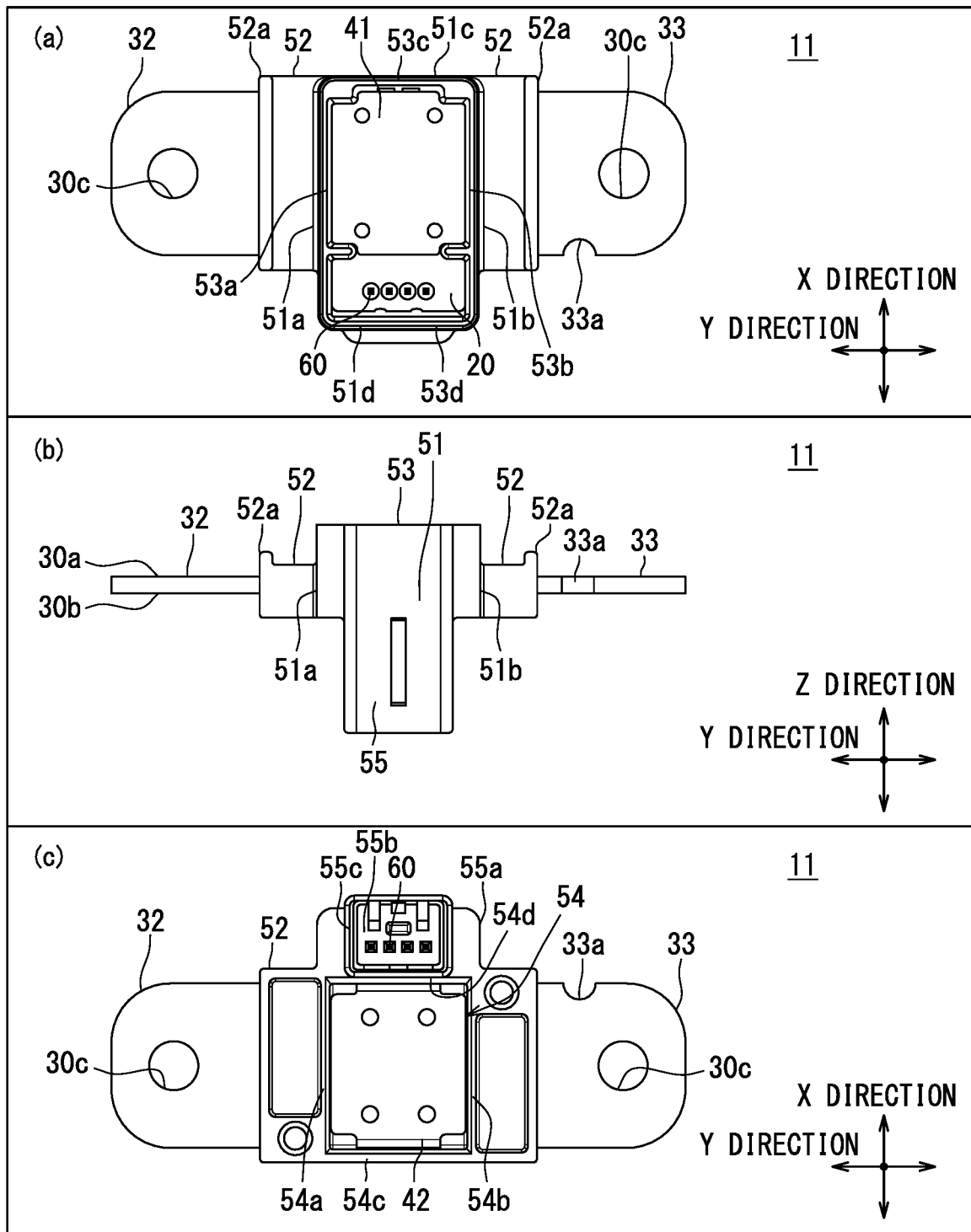
FIG. 4 illustrates diagrams showing the first current sensor.
Figure 5:
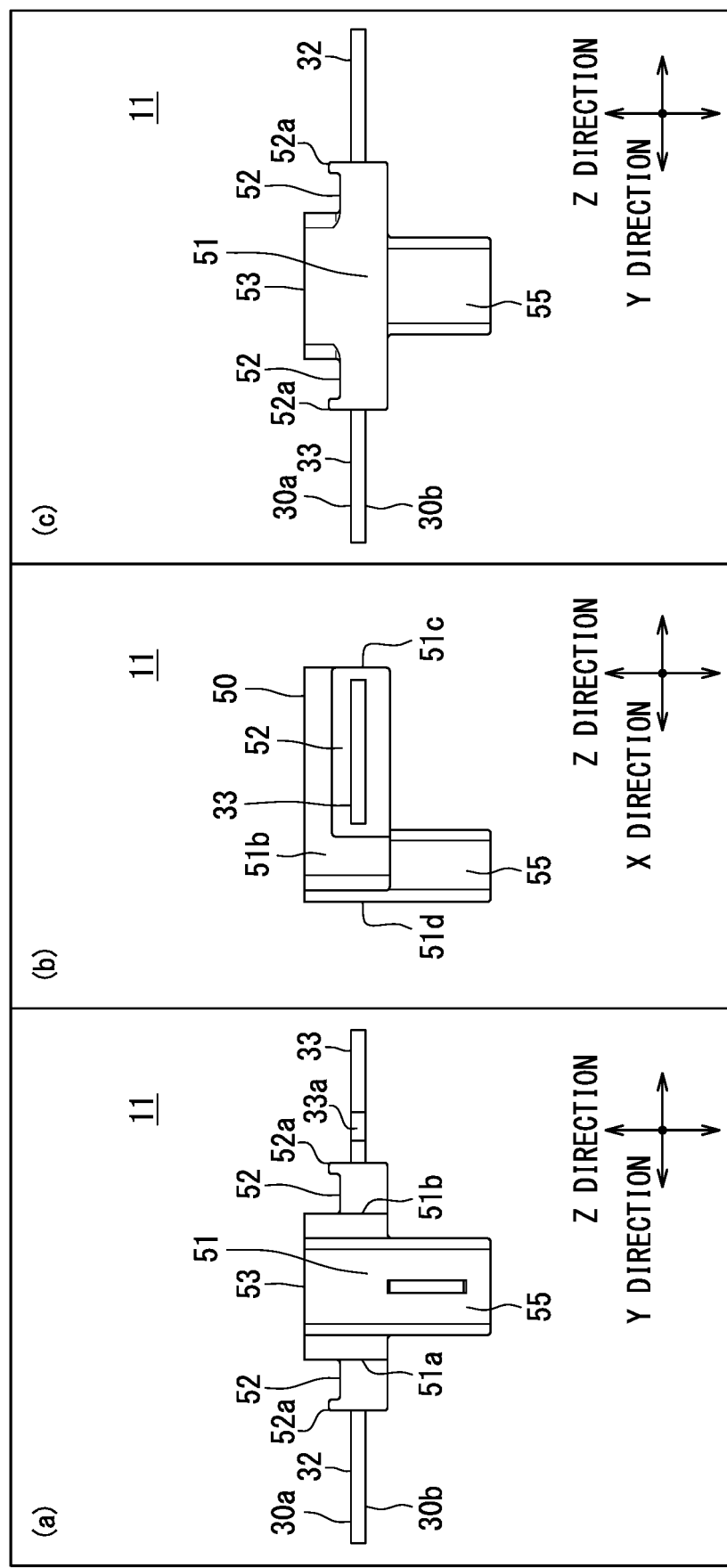
FIG. 5 illustrates diagrams showing the first current sensor.

In FIG. 4, (a) shows a top view of the first current sensor 11; (b) shows a front view of the first current sensor 11; and (c) shows a bottom view of the first current sensor 11. In FIG. 5, (a) shows a front view of the first current sensor 11;

(b) shows a side view of the first current sensor 11; and (c) shows a rear view of the first current sensor 11. Note that (b) of FIG. 4 and (a) of FIG. 5 show the same figure.

As clearly indicated in these figures, a part of the electrical-conduction bus bar 30 is insert-molded in the sensor housing 50. The wiring board 20 and the shield 40 are disposed in the sensor housing 50. The sensor housing 50 is made of an insulating resin material.

The wiring board 20 is fixed in the sensor housing 50 to be opposed to the part of the electrical-conduction bus bar 30 insert-molded in the sensor housing 50. A magnetoelectric converter 25, which will be described later, is mounted on the opposing part of the wiring board 20 to the electrical-conduction bus bar 30. The magnetoelectric converter 25 converts a magnetic field caused by the direct current which flows through the electrical-conduction bus bar 30 into an electric signal.

The shield 40 has a first shield 41 and a second shield 42. The first shield 41 and the second shield 42 are fixed, away from each other, to the sensor housing 50. The respective mutually opposing parts of the wiring board 20 and the electrical-conduction bus bar 30 are positioned between the first shield 41 and the second shield 42.

The first shield 41 and the second shield 42 are made of a material with higher magnetic permeability than that of the sensor housing 50. Accordingly, electromagnetic noise (external noise), which attempts to permeate from the outside of the first current sensor 11 into the inside, actively attempts to pass through the first shield 41 and the second shield 42. With this configuration, the input of the external noise into the magnetoelectric converter 25 is suppressed.

A connection terminal 60 shown in FIG. 4 is insert-molded in the sensor housing 50. The connection terminal 60 is electrically and mechanically connected to the wiring board 20 with solder 61. The connection terminal 60 is electrically connected via a wire harness or the like to the battery ECU 801. The electric signal converted with the magnetoelectric converter 25 is inputted via the connection terminal 60, a wire harness (not illustrated), and the like, into the battery ECU 801.

Next, the constituent elements of the first current sensor 11 will be individually described in detail. In the following description, three directions in mutual orthogonal relationship are referred to as x direction, y direction, and z direction. The x direction corresponds to a lateral direction. The y direction corresponds to an extension direction.

<Wiring Board>

Figure 6:
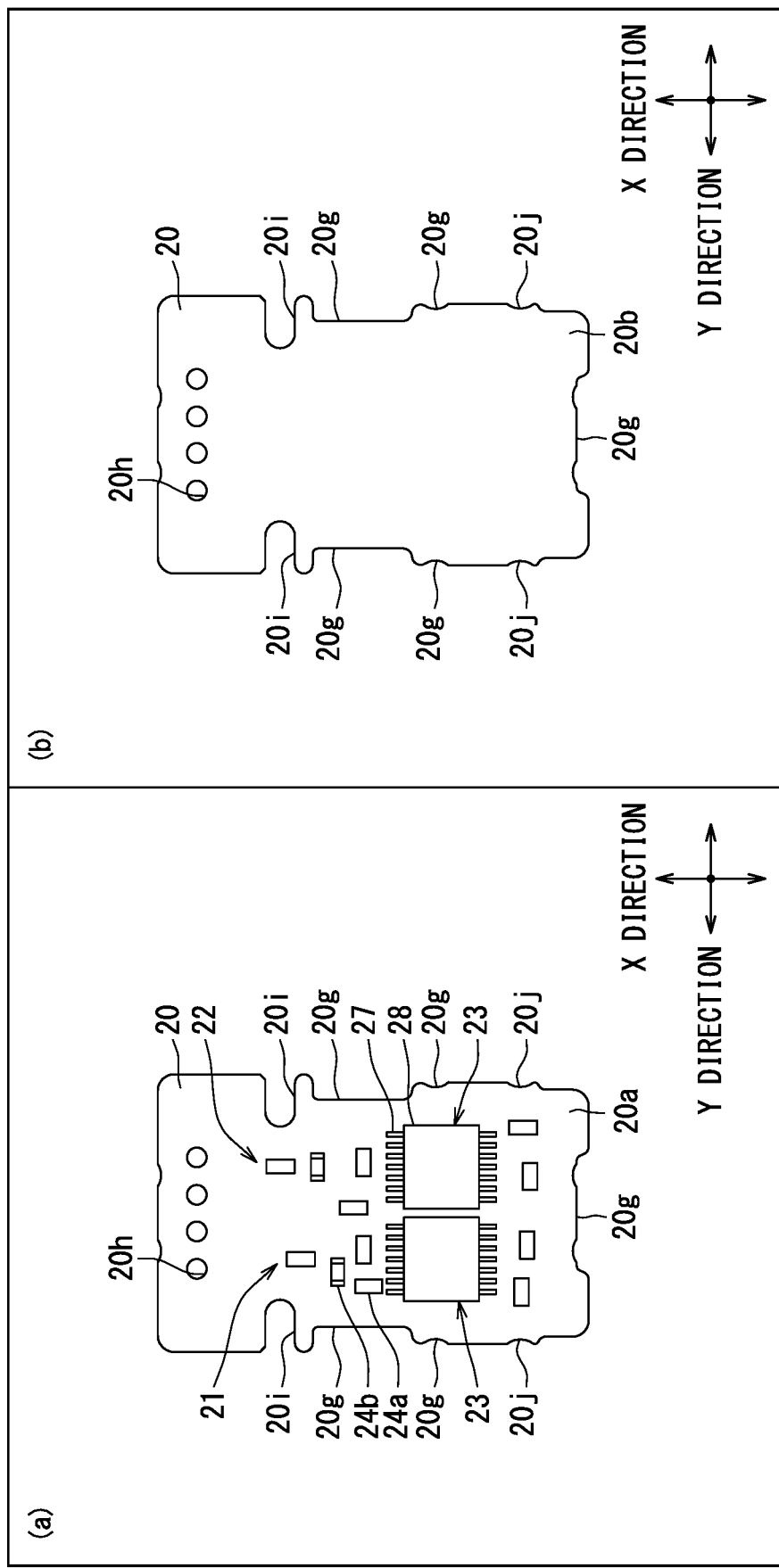
FIG. 6 illustrates diagrams showing a wiring board.

As shown in FIG. 6, the wiring board 20 has a flat plate shape. The wiring board 20 has a thin flat shape having a thickness in the z direction. The wiring board 20 is formed by laminating multiple insulating resin layers and conductive metal layers in the z direction. In the wiring board 20, an opposing surface 20a having the largest area and a rear surface 20b on the rear side of the opposing surface 20a face in the z direction. In FIG. 6, (a) shows a top view of the wiring board 20; and (b) shows a bottom view of the wiring board 20.

Figure 7:
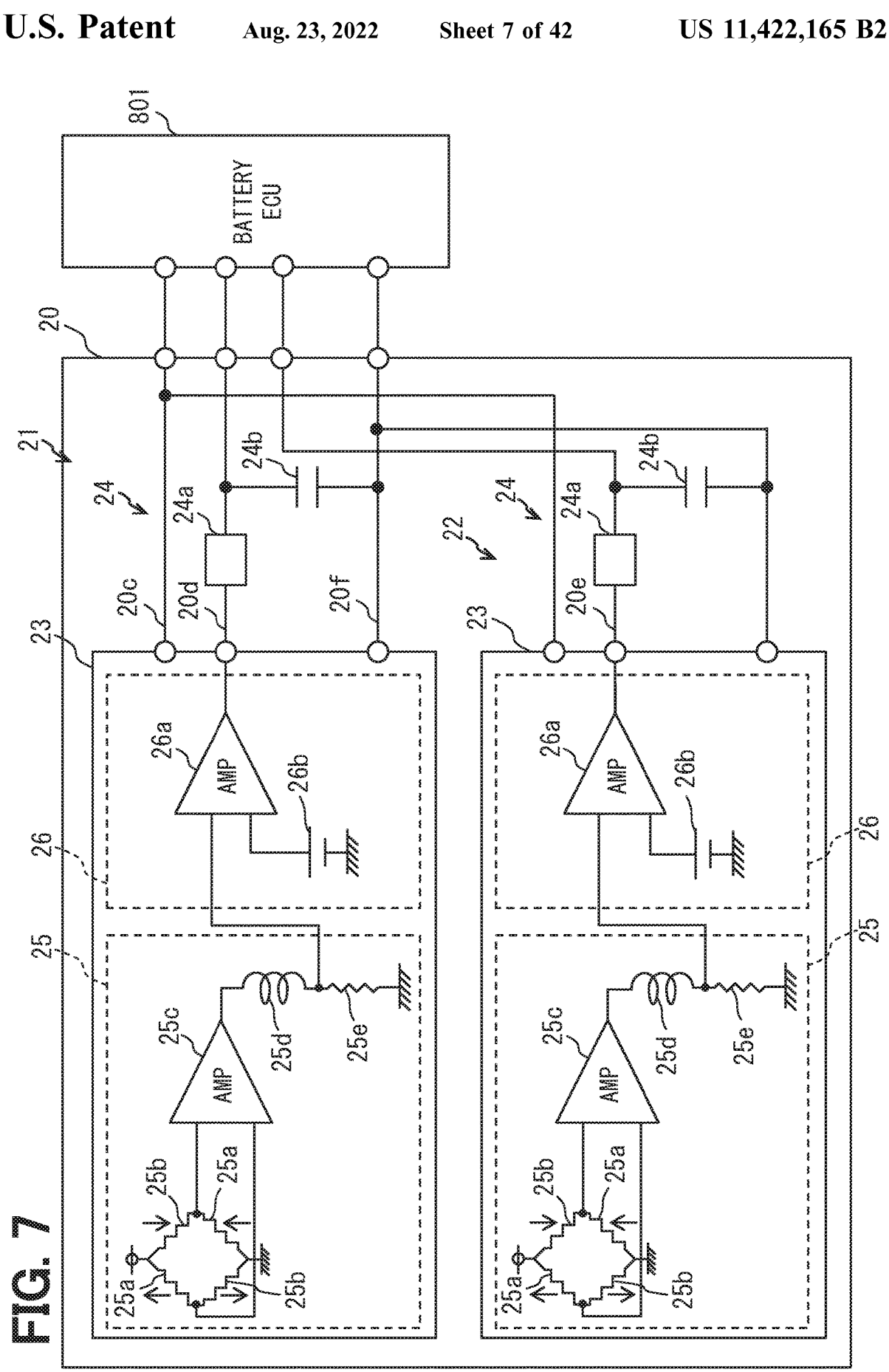
FIG. 7 is a block diagram for explaining a sensing unit.

A first sensing unit 21 and a second sensing unit 22 shown in (a) of FIG. 6 and in FIG. 7 are mounted on the opposing surface 20a of the wiring board 20. The first sensing unit 21 and the second sensing unit 22 each have an ASIC 23 and a filter 24. The ASIC 23 and the filter 24 are electrically connected to each other via a wiring pattern of the wiring board 20. The connection terminal 60 is electrically connected to the wiring pattern. ASIC is an abbreviation for application specific integrated circuit. Note that a structure where the first sensing unit 21 and the second sensing unit 22 are mounted on the rear surface 20b may be employed.

<ASIC>

The ASIC 23 has a magnetoelectric converter 25, a processing circuit 26, a connection pin 27, and a resin section 28. The magnetoelectric converter 25 and the processing circuit 26 are electrically connected to each other. One end of the connection pin 27 is electrically connected to the processing circuit 26. The other end of the connection pin 27 is electrically and mechanically connected to the wiring board 20. A part of the connection pin 27 including the one end, the processing circuit 26, and the magnetoelectric converter 25 are covered with the resin section 28. A part of the connection pin 27 including the other end is exposed from the resin section 28.

The magnetoelectric converter 25 has multiple magnetoresistive effect elements having a resistance value variable in correspondence with magnetic field (transmission magnetic field) which permeates the magnetoelectric converter 25 itself. In the magnetoresistive effect element, the resistance value varies in correspondence with transmission magnetic field along the opposing surface 20a. That is, the resistance value of the magnetoresistive effect element varies in correspondence with a component of the transmission magnetic field along the x direction and a component of the transmission magnetic field along the y direction.

On the other hand, the resistance value of the magnetoresistive effect element does not vary in correspondence with transmission magnetic field along the z direction. Accordingly, even when the external noise along the z direction permeates the magnetoresistive effect element, the resistance value of the magnetoresistive effect element does not vary.

The magnetoresistive effect element has a pinned layer, the magnetization direction of which is fixed, a free layer, the magnetization direction of which changes in correspondence with transmission magnetic field, and an intermediate layer provided between the pinned layer and the free layer. When the intermediate layer has a non-conductive property, the magnetoresistive effect element is a giant magnetoresistive effect element. When the intermediate layer has a conductive property, the magnetoresistive effect element is a tunnel magnetoresistive effect element. Note that the magnetoresistive effect element may be an anisotropic magnetoresistive effect element (AMR). Further, the magnetoelectric converter 25 may have a hall element in place of the magnetoresistive effect element.

The resistance value of the magnetoresistive effect element varies in accordance with angle formed with respective magnetization directions of the pinned layer and the free layer. The magnetization direction of the pinned layer is along the opposing surface 20a. The magnetization direction of the free layer is determined based on the transmission magnetic field along the opposing surface 20a. The resistance value of the magnetoresistive effect element is the minimum when the respective magnetization directions of the free layer and the fixed layer are in parallel. The resistance value of the magnetoresistive effect element is the maximum when the respective magnetization directions of the free layer and the fixed layer are antiparallel.

The magnetoelectric converter 25 has a first magnetoresistive effect element 25a and a second magnetoresistive effect element 25b as the above-described magnetoresistive effect elements. The magnetization direction of the pinned layer of the first magnetoresistive effect element 25a and the magnetization direction of the pinned layer of the second magnetoresistive effect element 25b are different by 90°.

The relationship of increase and decrease of resistance value is inverted between the magnetoresistive effect element 25a and the second magnetoresistive effect element 25b. When the resistance value of one of the first magnetoresistive effect element 25a and the second magnetoresistive effect element 25b is reduced, the resistance value of the other is increased by the equivalent amount to the reduced amount.

The magnetoelectric converter 25 have two first magnetoresistive effect elements 25a and two second magnetoresistive effect elements 25b. The first magnetoresistive effect element 25a and the second magnetoresistive effect element 25b are connected in series, in order, from a power source potential toward a reference potential, to form a first half bridge circuit. The second magnetoresistive effect element 25b and the first magnetoresistive effect element 25a are connected in series, in order, from the power source potential toward the reference potential, to form a second half bridge circuit.

Between the two half bridge circuits, the arrangement order of the first magnetoresistive effect element 25a and the second magnetoresistive effect element 25b is inverted. Accordingly, when a middle point potential of one of the two half bridge circuits is lowered, a middle point potential of the other is raised. In the magnetoelectric converter 25, a full bridge circuit is formed by combination of these two half bridge circuits.

The magnetoelectric converter 25 has, in addition to the magnetoresistive effect elements forming the above-described full bridge circuit, a differential amplifier 25c, a feedback coil 25d, and a shunt resistor 25e. The middle point potentials of the two half bridge circuits are inputted into an inverted input terminal and a non-inverted input terminal of the differential amplifier 25c. The feedback coil 25d and the shunt resistor 25e are connected in series, in order, from an output terminal of the differential amplifier 25c toward the reference potential.

With the above-described connection configuration, an output is made in correspondence with variation of the resistance values of the first magnetoresistive effect elements 25a and the second magnetoresistive effect elements 25b, forming the full bridge circuit, from the output terminal of the differential amplifier 25c. The variation of resistance value is caused by permeation of the magnetic field along the opposing surface 20a through the magnetoresistive effect element. The magnetic field (measurement current) caused by the current which flows through the electrical-conduction bus bar 30 permeates the magnetoresistive effect element. Accordingly, a current corresponding to the measurement current flows through the input terminal of the differential amplifier 25c.

The input terminal and the output terminal of the differential amplifier 25c are connected to each other via a feedback circuit, which is not illustrated. With this configuration, virtual short-circuit occurs in the differential amplifier 25c. The differential amplifier 25c operates so as to cause the inverted input terminal and the non-inverted input terminal to have the same potential. That is, the differential amplifier 25c operates such that the current which flows through the input terminal and the current which flows through the output terminal are zero. As a result, a current corresponding to the measurement current (feedback current) flows from the output terminal of the differential amplifier 25c.

The feedback current flows via the feedback coil 25d and the shunt resistor 25e between the output terminal of the differential amplifier 25c and the reference potential. An offset magnetic field is generated in the feedback coil 25d by the flow of the feedback current. The offset magnetic field permeates the magnetoelectric converter 25. With this permeation, the measurement current which permeates the magnetoelectric converter 25 is offset. The magnetoelectric converter 25 operates so as to bring the measurement current which permeates the magnetoelectric converter 25 itself and the offset magnetic field into equilibrium.

A feedback voltage corresponding to the current amount of the feedback current which generates the offset magnetic field is generated in a middle point between the feedback coil 25d and the shunt resistor 25e. The feedback voltage is outputted as an electric signal of detection of the measurement current, to the processing circuit 26 at the subsequent stage.

The processing circuit 26 has an adjustment amplifier 26a and a threshold power source 26b. The middle point between the feedback coil 25d and the shunt resistor 25e is connected to a non-inverted input terminal of the adjustment amplifier 26a. The threshold power source 26b is connected to an inverted input terminal of the adjustment amplifier 26a. With this configuration, a differential-amplified feedback voltage is outputted from the adjustment amplifier 26a.

The respective resistance values of the first magnetoresistive effect elements 25a and the second magnetoresistive effect elements 25b forming the full bridge circuit each have a temperature-dependent property. The output of the adjustment amplifier 26a varies in accordance with temperature change. The processing circuit 26 has a temperature detection element (not illustrated), a nonvolatile memory to store the relationship between the temperature and the resistance value of the magnetoresistive effect element, and the like. The nonvolatile memory is electrically rewritable. The gain and offset of the adjustment amplifier 26a are adjusted by rewriting values stored in the nonvolatile memory. With this configuration, the variation of output of the adjustment amplifier 26a due to temperature change is cancelled.

<Filter>

The filter 24 has a resistor 24a and a capacitor 24b. As shown in FIG. 7, a power source wiring 20c, a first output wiring 20d, a second output wiring 20e, and a ground wiring 20f, as wiring patterns, are formed on the wiring board 20.

The ASIC 23 of the first sensing unit 21 is connected to the power source wiring 20c, the first output wiring 20d, and the ground wiring 20f, respectively. An output terminal of the adjustment amplifier 26a of the ASIC 23 of the first sensing unit 21 is connected to the first output wiring 20d.

The resistor 24a of the filter 24 of the first sensing unit 21 is provided on the first output wiring 20d. The capacitor 24b connects the first output wiring 20d and the ground wiring 20f. With this configuration, the filter 24 of the first sensing unit 21 forms a low-pass filter with the resistor 24a and the capacitor 24b. An output from the ASIC 23 of the first sensing unit 21 is provided via the low-pass filter to the battery ECU 801. With this configuration, an output of the first sensing unit 21, from which high-frequency noise is eliminated, is provided to the battery ECU 801.

The ASIC 23 of the second sensing unit 22 is connected to the power source wiring 20c, the second output wiring 20e, and the ground wiring 20f, respectively. The output terminal of the adjustment amplifier 26a of the ASIC 23 of the first sensing unit 21 is connected to the second output wiring 20e.

The resistor 24a of the filter 24 of the second sensing unit 22 is provided on the second output wiring 20e. The capacitor 24b connects the second output wiring 20e and the ground wiring 20f. With this configuration, the filter 24 of the second sensing unit 22 forms a low-pass filter with the resistor 24a and the capacitor 24b. An output from the ASIC 23 of the second sensing unit 22 is provided via the low-pass filter to the battery ECU 801. An output of the second sensing unit 22, from which high-frequency noise is eliminated, is provided to the battery ECU 801.

As described above, the first sensing unit 21 and the second sensing unit 22 of the present embodiment have the same configuration. The respective magnetoelectric converters 25 of the first sensing unit 21 and the second sensing unit 22 are aligned in the y direction. As described later, the magnetic field which permeates the respective magnetoelectric converter 25 of the first sensing unit 21 and the magnetic field which permeates the respective magnetoelectric converter 25 of the second sensing unit 22 are the same.

Accordingly, the electric signal provided from the first sensing unit 21 to the battery ECU 801 and the electric signal provided from the second sensing unit 22 to the battery ECU 801 are the same. The battery ECU 801 determines whether or not an abnormality occurs in one of the first sensing unit 21 and the second sensing unit 22 by comparing the two electric signals provided. In this manner, the first current sensor 11 according to the preset embodiment has redundancy.

Note that the above-described shunt resistor 25e may be provided in the resin section 28, or may be provided outside of the resin section 28. When the shunt resistor 25e is provided outside of the resin section 28, the shunt resistor 25e is mounted on the wiring board 20. Then the shunt resistor 25e is externally attached to the ASIC 23.

Further, as long as at least one of these four resistors is a magnetoresistive effect element, the respective four resistors forming the full bridge circuit are not necessarily magnetoresistive effect elements. In place of the full bridge circuit, only one half bridge circuit may be formed.

When the above-described redundancy is not required, as the first current sensor 11, a configuration having one of the first sensing unit 21 and the second sensing unit 22 may be employed.

<Electrical-Conduction Bus Bar>

The electrical-conduction bus bar 30 is made of a conductive material such as copper, brass, or aluminum. The electrical-conduction bus bar 30 may be manufactured by the following methods, for example. The electrical-conduction bus bar 30 may be manufactured by press-working a flat plate. The electrical-conduction bus bar 30 may be manufactured by integrally joining multiple flat plates. The electrical-conduction bus bar 30 may be manufactured by welding multiple flat plates. The electrical-conduction bus bar 30 may be manufactured by pouring a molten-state conductive material into a mold. The manufacturing method of the electrical-conduction bus bar 30 is not particularly limited.

Figure 8:
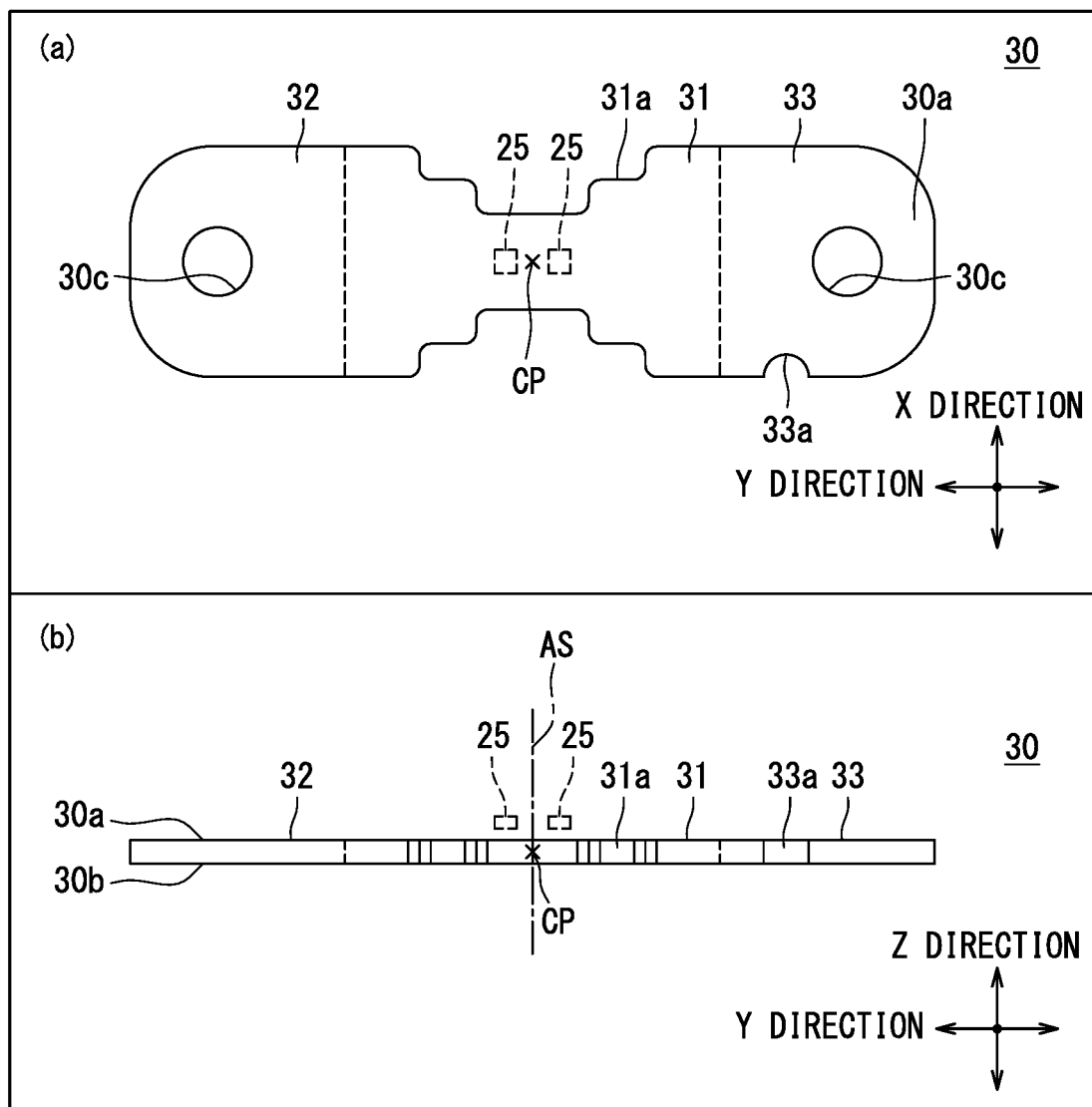
FIG. 8 illustrates diagrams showing an electrical-conduction bus bar.

As shown in FIG. 8, the electrical-conduction bus bar 30 has a thin flat shape having the thickness in the z direction. In the electrical-conduction bus bar 30, a front surface 30a and a rear surface 30b on the rear side of the front surface 30a, respectively, face in the z direction. In FIG. 8, (a) shows a top view of the electrical-conduction bus bar; and (b) shows a side view of the electrical-conduction bus bar.

The electrical-conduction bus bar 30 extends in the y direction. As marked off with two broken lines in FIG. 8, the electrical-conduction bus bar 30 has a covered part 31 covered with the sensor housing 50, and first exposed part 32 and second exposed part 33 exposed from the sensor housing 50. The first exposed part 32 and the second exposed part 33 are aligned via the covered part 31 in the y direction. The first exposed part 32 and the second exposed part 33 are connected integrally via the covered part 31.

As shown in (b) of FIG. 8, the respective dimensions (thicknesses) of the covered part 31, the first exposed part 32, and the second exposed part 33 in the z direction are equal to each other. That is, respective distances in the z direction between the front surfaces 30a and the rear surfaces 30b of the covered part 31, the first exposed part 32, and the second exposed part 33, are equal to each other.

A bolt hole 30c for electrical and mechanical connection via a bolt to the energization bus bar 307 is formed in each of the first exposed part 32 and the second exposed part 33. The bolt hole 30c passes through each of the first exposed part 32 and the second exposed part 33 from the front surface 30a to the rear surface 30b.

As described above, the energization bus bar 307 is divided into the part adjacent to the reactor 313 and the part adjacent to the high side switch 311. An attachment hole corresponding to the bolt hole 30c is formed respectively in the part adjacent to the reactor 313 and in the part adjacent to the high side switch 311 of the energization bus bar 307.

The attachment hole of the energization bus bar 307 in the part adjacent to the reactor 313 and the bolt hole 30c of the first exposed part 32 are aligned in the z direction. The attachment hole of the energization bus bar 307 in the part adjacent to the high side switch 311 and the bolt hole 30c of the second exposed part 33 are aligned in the z direction. In this status, a bolt shaft is inserted through the bolt hole 30c and the attachment hole. Then a nut is fastened from the end of the bolt shaft toward a bolt head. The energization bus bar 307 and the electrical-conduction bus bar 30 are held between the bolt head and the nut. With this configuration, the energization bus bar 307 and the electrical-conduction bus bar 30 are brought into contact, and the energization bus bar 307 and the electrical-conduction bus bar 30 are electrically and mechanically connected to each other. As described above, in the energization bus bar 307, the divided part adjacent to the reactor 313 and the divided part adjacent to the high side switch 311 are bridged with the electrical-conduction bus bar 30. A common current flows through the energization bus bar 307 and the electrical-conduction bus bar 30.

As shown in (a) of FIG. 8, the covered part 31 has a narrow part 31a at which the dimension in the x direction is locally short. In the narrow part 31a of the present embodiment, the dimension in the x direction is reduced in stepwise. In the narrow part 31a, the dimension in the x direction is reduced in two steps, from the first exposed part 32 side of the covered part 31 toward a center point CP of the covered part 31 in the y direction. Similarly, in the narrow part 31a, the dimension in the x direction is reduced in two steps, from the second exposed part 33 side of the covered part 31 toward the center point CP of the covered part 31 in the y direction. Note that the dimension of the narrow part 31a in the x direction may be reduced in more steps, or may be continuously reduced.

The above-described center point CP is equivalent to the center of gravity of the covered part 31. The covered part 31 and the narrow part 31a are in a line-symmetrical shape with a center line passing through the center point CP in the z direction as a symmetry axis AS.

In the narrow part 31a, the dimension in the x direction is shorter than that of the first exposed part 32 and the second exposed part 33. The density of a current flowing through the narrow part 31a is higher than the density of a current flowing through the first exposed part 32 and the second exposed part 33. As a result, the intensity of a measured magnetic field to be measured, caused by the current flowing through the narrow part 31a is high.

As indicated with the magnetoelectric converter 25 in the first sensing unit 21 and the magnetoelectric converter 25 in the second sensing unit 22, schematically surrounded with broken lines respectively, in (a) and (b) of FIG. 8, the first sensing unit 21 and the second sensing unit 22 are each arranged to be opposed to and to be spaced from the narrow part 31a in the z direction. Accordingly, the high-intensity measured magnetic field, caused by the current flowing through the narrow part 31a, permeates the first sensing unit 21 and the second sensing unit 22 respectively.

As described above, the electrical-conduction bus bar 30 extends in the y direction. In the electrical-conduction bus bar 30, the current flows in the y direction. A measured magnetic field in accordance with Ampere's law is generated in a circumferential direction about the y direction by the flow of the current in the y direction. The measured magnetic field flows in a ring shape about the electrical-conduction bus bar 30 in a plane defined by the x direction and the z direction. The first sensing unit 21 and the second sensing unit 22 each detect a component of the measured magnetic field along the x direction.

As indicated with a broken line in FIG. 8, the respective magnetoelectric converters 25 of the first sensing unit 21 and the second sensing unit 22 are aligned in the y direction. The two magnetoelectric converters 25 are symmetrically arranged with respect to the symmetry axis AS. The positions of the two magnetoelectric converters 25 in the x direction and the position of the symmetry axis AS (center point CP) in the x direction are the same. Accordingly, the two magnetoelectric converters 25 are aligned via the center point CP in the y direction.

Further, the distances between the two magnetoelectric converters 25 and the covered part 31 in the z direction are the same. As described above, the covered part 31 and the narrow part 31a are in a line-symmetrical shape with respect to the symmetry axis AS. As described above, measured magnetic fields having equivalent x-direction components permeate the two magnetoelectric converters 25.

Note that the electrical-conduction bus bar 30 of the present embodiment is produced by press-working a conductive flat plate. In the press working, the flat plate is placed on a die, a puncher is brought to be close to the die to apply a tensile force to the flat plate. With this work, the flat plate is divided into the electrical-conduction bus bar 30 and chips, thus the electrical-conduction bus bar 30 is produced.

When the electrical-conduction bus bar 30 is produced by the above-described press working, a shear plane is formed in the electrical-conduction bus bar 30. A sag occurs in the shear plane on the side of a surface of the electrical-conduction bus bar 30, which is brought into contact with the puncher first. With this sag, there is a fear of perpendicularity impairment of the shear plane. As a result, the distribution of the measured magnetic field caused by the current flowing through the electrical-conduction bus bar 30 may be deviated from the design.

In the present embodiment, the electrical-conduction bus bar 30 is arranged such that, not the surface that is brought into contact with the puncher first, but a surface that is lastly separated with the puncher is adjacent to the wiring board 20. That is, the surface that is firstly brought into contact with the puncher is the rear surface 30b, and the surface that is lastly separated from the puncher is the front surface 30a. The shear plane corresponds to a side surface between the front surface 30a and the rear surface 30b. Accordingly, the perpendicularity impairment on the front surface 30a side in the side surface of the electrical-conduction bus bar 30 is suppressed. The front surface 30a of the electrical-conduction bus bar 30 opposes the wiring board 20. With this configuration, the deviation of the distribution of the measured magnetic field which permeates the first sensing unit 21 and the second sensing unit 22 mounted on the wiring board 20 is suppressed.

Note that when the electrical-conduction bus bar 30 is produced by press working as described above, it is necessary to determine whether or not a sag has occurred on any of the front surface 30a side and the rear surface 30b side in the side surface. For the purpose of the above determination, a notch 33a as a mark is formed in the second exposed part 33 of the electrical-conduction bus bar 30. The notch 33a of the present embodiment has a semicircular shape.

<Shield>

Figure 9:
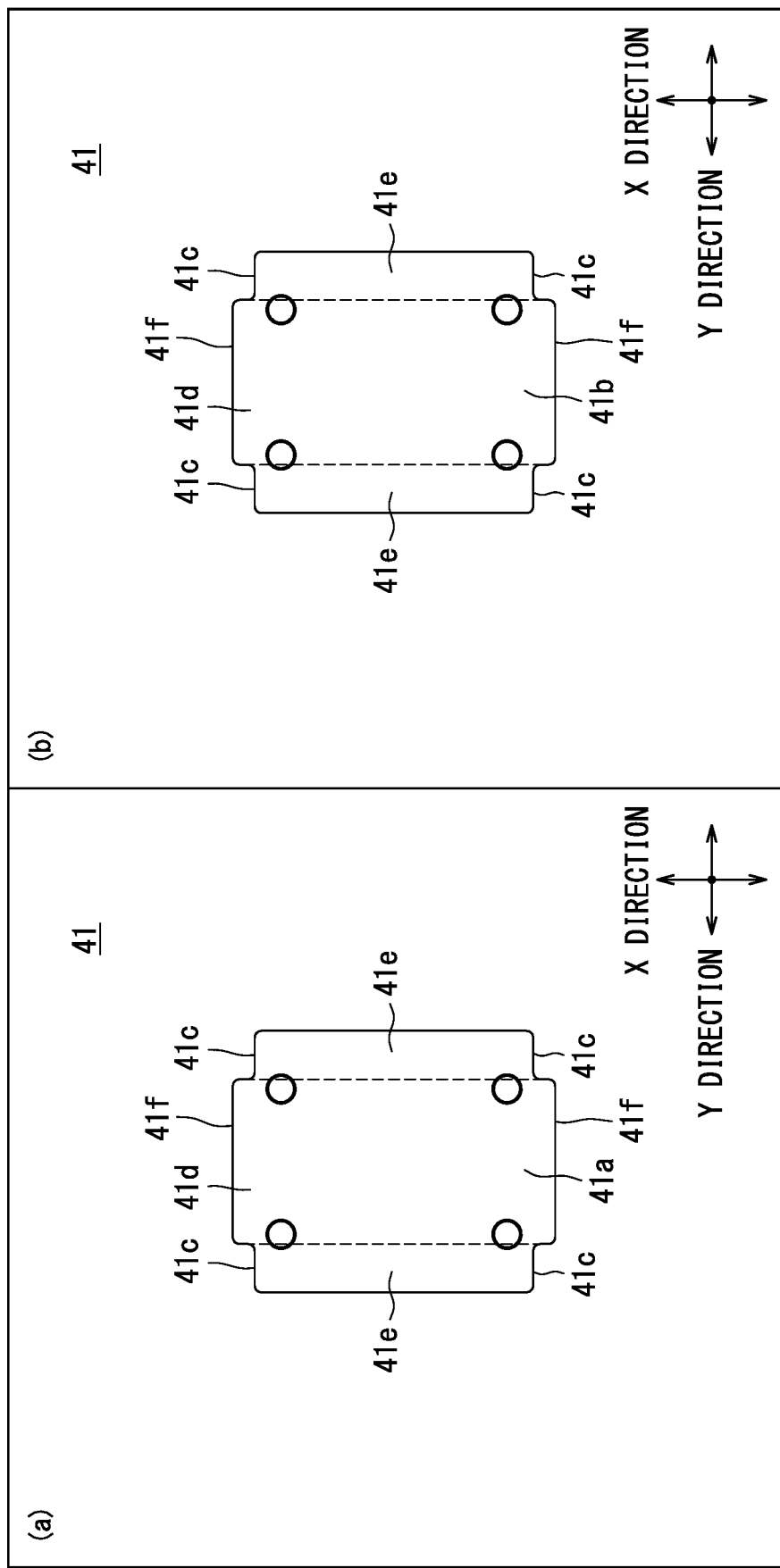
FIG. 9 illustrates diagrams showing a first shield.
Figure 10:
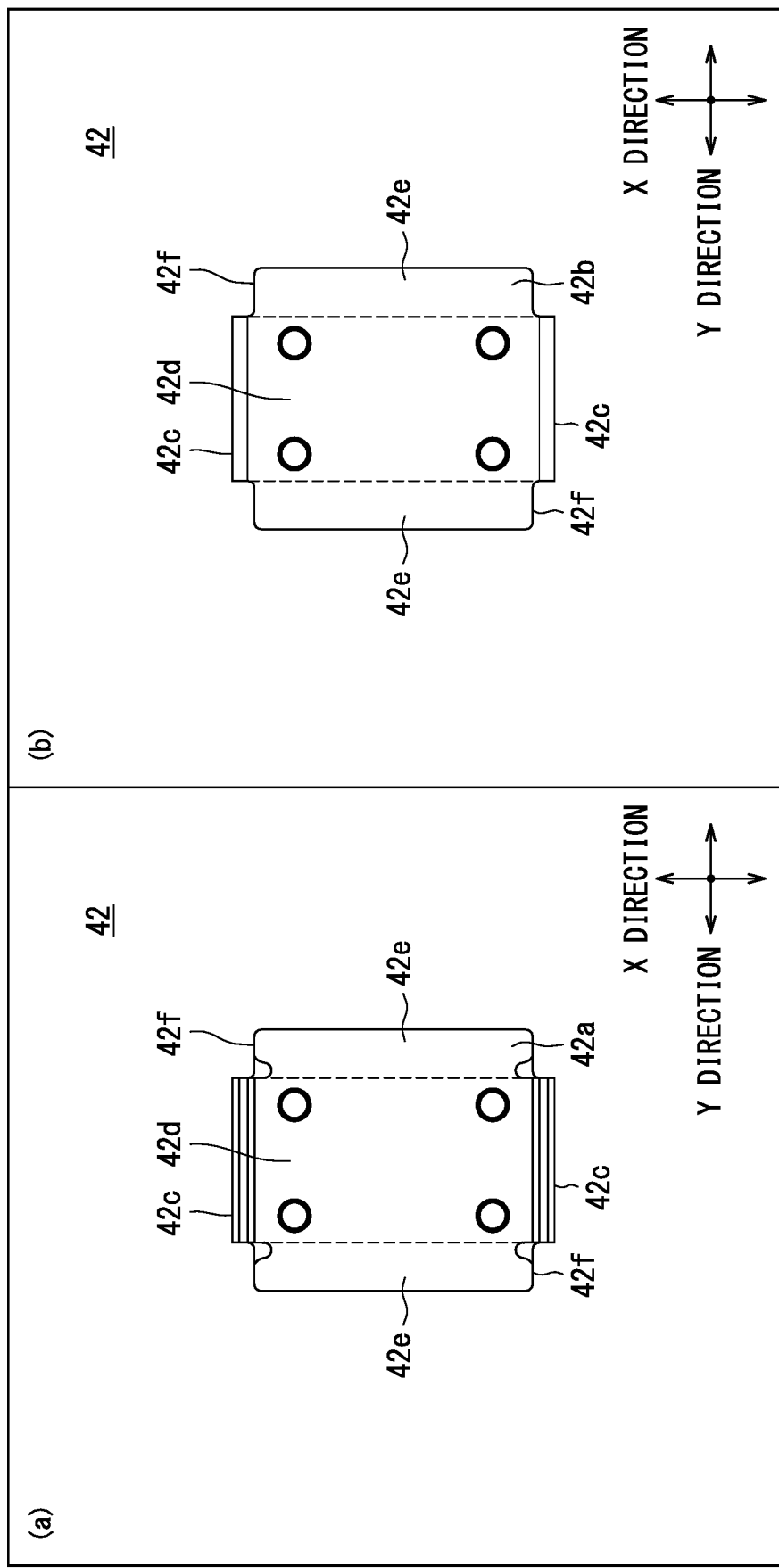
FIG. 10 illustrates diagrams showing a second shield.

As described above, the shield 40 has the first shield 41 and the second shield 42. As shown in FIG. 9 and FIG. 10, the first shield 41 and the second shield 42 each have a thin plate shape having the thickness in the z direction. In the first shield 41, one surface 41a having a largest area and a rear surface 41b on the rear of the one surface 41a face in the z direction respectively. In the second shield 42, one surface 42a having a largest area and a rear surface 42b on the rear of the widest surface 42a face in the z direction respectively.

Figure 2:
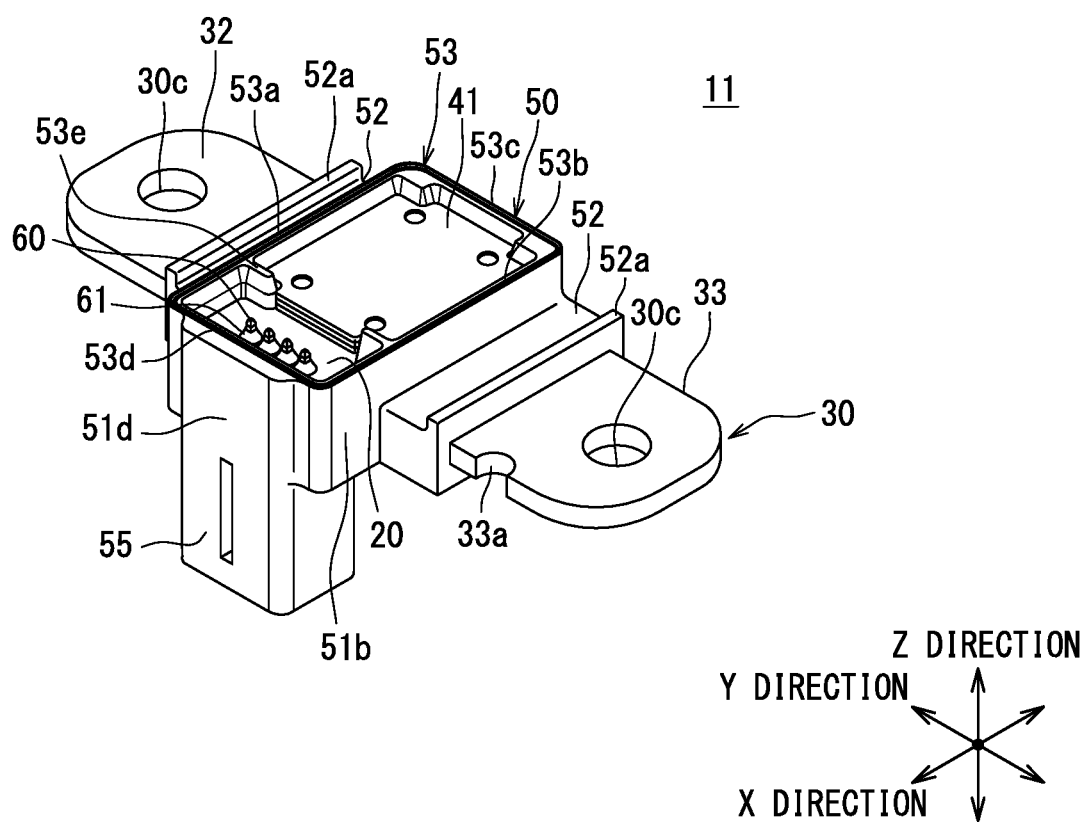
FIG. 2 is a perspective view of a first current sensor.
Figure 3:
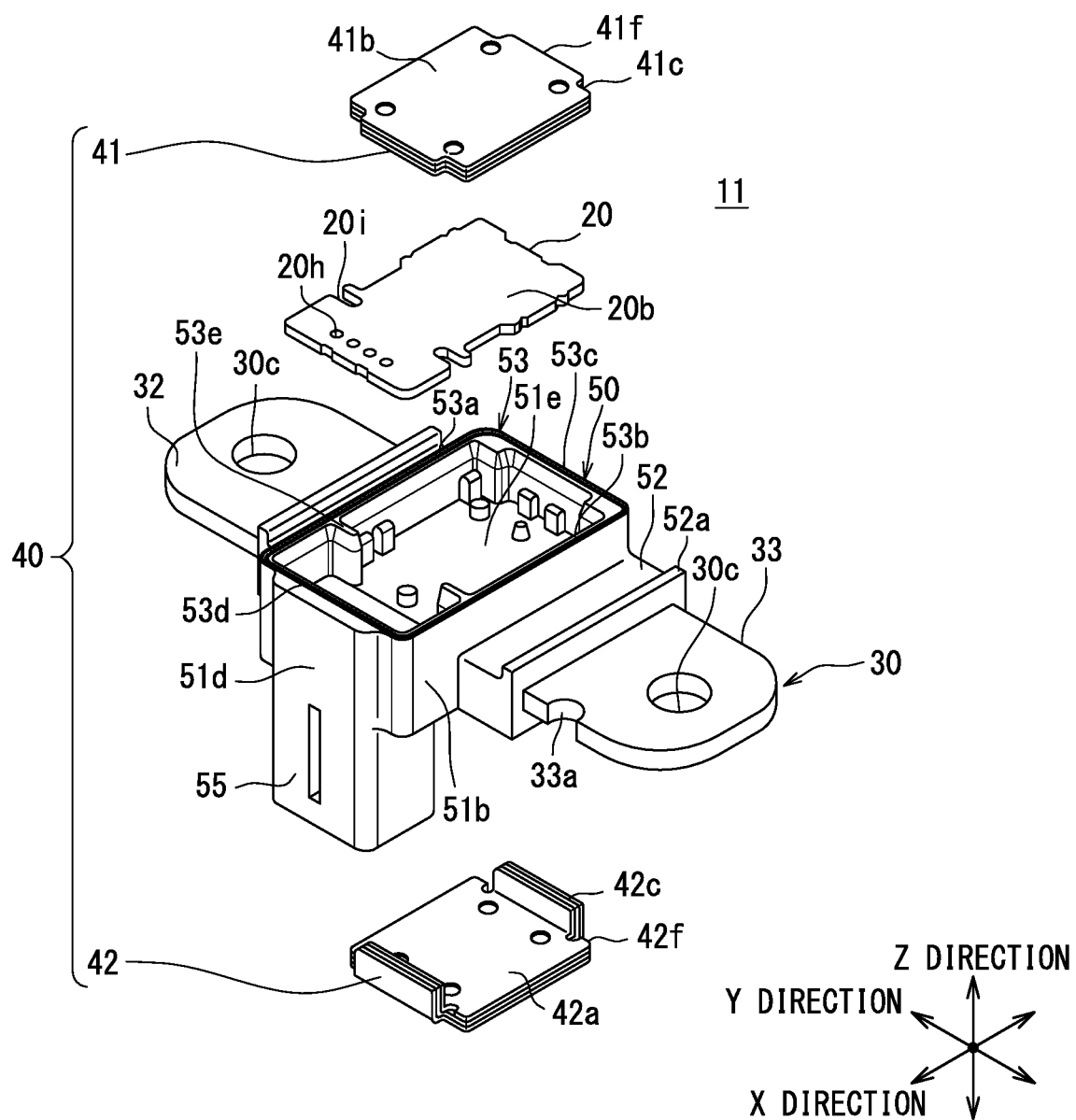
FIG. 3 is an exploded perspective view of the first current sensor.

As shown in FIG. 2 and FIG. 3, the first shield 41 and the second shield 42 are provided, in a state where the one surface 41a and the one surface 42a oppose each other in the z direction, in the sensor housing 50. The rear surface 41b of the first shield 41 and the rear surface 42b of the second shield 42 are exposed to the outside of the sensor housing 50 respectively. The rear surface 41b and the rear surface 42b each form a part of an outer-most surface of the first current sensor 11.

In FIG. 9, (a) shows a top view of the first shield; and (b) shows a bottom view of the first shield. In FIG. 10, (a) shows a top view of the second shield; and (b) shows a bottom view of the second shield.

The first shield 41 and the second shield 42 may be produced by press-joining multiple flat plates made of a soft magnetic material with high magnetic permeability such as permalloy. Otherwise, the first shield 41 and the second shield 42 may be produced by press-extending magnetic steel.

The first shield 41 and the second shield 42 of the present embodiment are each produced by press-joining multiple flat plates made of a soft magnetic material. Each of the multiple flat plates is formed with four protrusions which protrude from a main surface toward a rear surface. In correspondence with the protrusions, each of the multiple flat plates is formed with four recesses which are recessed from the rear surface toward the main surface. The multiple flat plates are respectively arranged such that the main surface and the rear surface oppose to each other. Further, the multiple flat plates are laminated such that the protrusions of one of two opposing flat plates are received in the recesses of the other of the two opposing flat plates. In this laminated state, the multiple flat plates are press-joined. With this configuration, the first shield 41 and the second shield 42 are produced.

Note that, in the case where the first shield 41 and the second shield 42 are produced by press-extending magnetic steel, the direction in which the magnetic steel is extended with the press-extension is, for example, defined in the x direction. In this case, the atomic arrangement (crystal) of the magnetic steel is aligned in the x direction. As a result, the magnetic permeability in the x direction is higher than the magnetic permeability in the y direction. In this manner, it is possible to provide the magnetic permeability of the shield with anisotropy by specifying the extending direction of the magnetic steel.

<First Shield>

As shown in FIG. 9, the planar shape of the first shield 41 is a rectangular shape with the x direction as a longitudinal direction. Notches 41c are formed at four corners of the first shield 41 of the present embodiment. In FIG. 9, to clarify the border between the center of the first shield 41 and the opposite ends of the first shield 41 in the y direction, two broken lines extending in the x direction are given to the first shield 41. In the following description, the center of the first shield 41 in the y direction is indicated as a first center part 41d. The opposite ends of the first shield 41 in the y direction are indicated as a first opposite end part 41e. The first center part 41d is positioned between the two ends of the first opposite end part 41e in the y direction.

As clearly indicated with the broken lines, the first opposite end part 41e has the length in the x direction shorter than that of the first center part 41d. In the first opposite end part 41e, the magnetic permeability in the x direction is thus lower than that in the first center part 41d. The magnetic field hardly enters the first opposite end part 41e. Accordingly, the permeation of the magnetic field, via portions (parallel portions) of the first center part 41d directly connected to the first opposite end part 41e and aligned in the y direction, from one of the two ends of the first opposite end part 41e to the other end, is suppressed. The magnetic field hardly permeates the parallel portions of the first center part 41d. As a result, the parallel portions of the first center part 41d are hardly magnetically saturated.

The parallel portions of the first center part 41d, at which the magnetic saturation is suppressed, are aligned with the first sensing unit 21 and the second sensing unit 22 mounted on the wiring board 20 in the z direction. The respective magnetoelectric converters 25 of the first sensing unit 21 and the second sensing unit 22 are positioned between the first center part 41d and the narrow part 31a.

<Second Shield>

As shown in FIG. 10, the planar shape of the second shield 42 is a rectangular shape with the x direction as a longitudinal direction. In FIG. 10, to clarify the border between the center of the second shield 42 and the opposite ends of the second shield 42 in the y direction, two broken lines extending in the x direction are given to the second shield 42. In the following description, the center of the second shield 42 in the y direction is indicated as a second center part 42d. The opposite ends of the second shield 42 are indicated as a second opposite end part 42e. The second center part 42d is positioned between the two ends of the second opposite end part 42e in the y direction.

The second shield 42 has two sides 42f aligned in the x direction. Each of the two sides 42f is formed with an extending part 42c extending in the z direction in an area adjacent to the second center part 42d. The two extending parts 42c extend in a direction from the rear surface 42b toward the one surface 42a in the z direction. The extending part 42c has a rectangular parallelepiped shape with the y direction as a longitudinal direction. The extending part 42c is formed, upon production of the second shield 42 as described above, after the press-joining of the multiple flat plates made of a soft magnetic material, by bending the joined flat plates.

As described above, the first shield 41 and the second shield 42 are provided, in a state where the one surface 41a of the first shield 41 and the one surface 42a of the second shield 42 are opposed to each other in the z direction, in the sensor housing 50. In this state where the first shield 41 and the second shield 42 are provided in the sensor housing 50, the extending part 42c extends toward the first shield 41. An end surface of the extending part 42c and the one surface 41a of the first center part 41d of the first shield 41 are opposed to each other in the z direction.

With this configuration, the clearance between the first center part 41d of the first shield 41 and the extending part 42c of the second shield 42 in the z direction is shorter than the clearance between the one surface 41a of the first shield 41 and the one surface 42a of the second shield 42 in the z direction. Accordingly, the magnetic field entered the first shield 41 easily permeates the second shield 42 via the extending part 42c.

As described above, the extending part 42c extends from the side 42f in the area adjacent to the second center part 42d in the z direction. The extending part 42c is not formed on the side 42f in the area adjacent to the second opposite end part 42e. Therefore, the magnetic field entered the first shield 41 easily permeates the second center part 42d of the second shield 42 via the extending part 42c.

The second center part 42d is opposed to the first sensing unit 21 and the second sensing unit 22 mounted on the wiring board 20 in the z direction. The magnetoelectric converters 25 and the narrow parts 31a of the first sensing unit 21 and the second sensing unit 22 are positioned between the first center part 41d and the second center part 42d.

Further, the positions of the magnetoelectric converters 25 in the x direction are between the two extending parts 42c of the respective two sides 42f. When external noise along the x direction attempts to permeate a region between the one surface 41a of the first shield 41 and the one surface 42a of the second shield 42 in which the magnetoelectric converters 25 are positioned, the external noise attempts to enter not the magnetoelectric converters 25 but the extending parts 42c. In the extending parts 42c, the external noise bents its permeation direction so as to permeate through the second shield 42. As a result, permeation of the external noise through the magnetoelectric converters 25 is suppressed.

<Sensor Housing>

Figure 11:
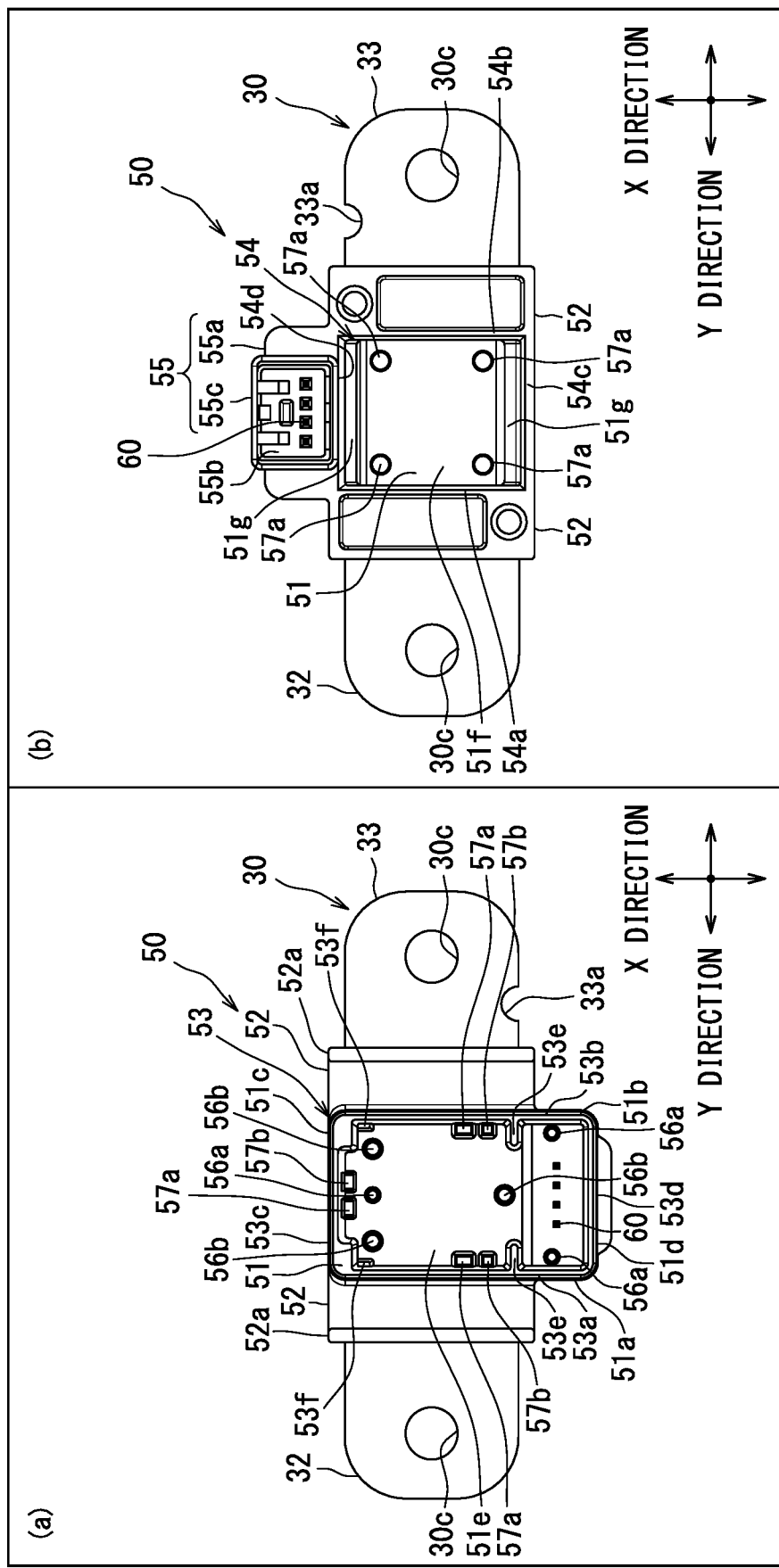
FIG. 11 illustrates diagrams showing a sensor housing.

As shown in FIG. 3 and FIG. 11, the electrical-conduction bus bar 30 and the connection terminal 60 are insert-molded in the sensor housing 50. The wiring board 20 and the shield 40 are provided in the sensor housing 50. The electrical-conduction bus bar 30, the wiring board 20, and the shield 40 are aligned, away from each other, in the z direction. In FIG. 11, (a) shows a top view of the sensor housing; and (b) shows a bottom view of the sensor housing.

As shown in FIG. 5 and FIG. 11, the sensor housing 50 has a base 51, insulating parts 52, a first surrounding part 53, a second surrounding part 54, and a connector part 55.

The base 51 has a rectangular parallelepiped shape with the x direction as a longitudinal direction. The base 51 has six surfaces. The base 51 has a left surface 51a and a right surface 51b facing in the y direction. The base 51 has an upper surface 51c and a lower surface 51d facing in the x direction. The base 51 has an upper end surface 51e and a lower end surface 51f facing in the z direction.

As shown in (a) and (c) of FIG. 5, the insulating parts 52 are formed in a part of the left surface 51a and a part of the right surface 51b in the base 51, respectively. The two insulating parts 52 extend, away from the base 51, in the y direction. The two insulating parts 52 are aligned via the base 51 in the y direction. The covered part 31 of the electrical-conduction bus bar 30 is covered respectively with the two insulating parts 52 and the base 51.

In a broad way, portions of the covered part 31 adjacent to the first exposed part 32 and the second exposed part 33 are covered with the two insulating parts 52. The narrow part 31a of the covered part 31 is covered with the base 51. The narrow part 31a is positioned between the upper end surface 51e and the lower end surface 51f of the base 51 in the z direction. An insulating resin material forming the base 51 is positioned between the narrow part 31a and the upper end surface 51e and between the narrow part 31a and the lower end surface 51f respectively.

As shown in (a) of FIG. 11, the first surrounding part 53 is formed on the upper end surface 51e of the base 51. The first surrounding part 53 has a left wall 53a and a right wall 53b aligned in the y direction. The first surrounding part 53 has an upper wall 53c and a lower wall 53d aligned in the x direction.

These walls forming the first surrounding part 53 are formed along the edge of the upper end surface 51e. In a circumferential direction about the z direction, the left wall 53a, the upper wall 53c, the right wall 53b, and the lower wall 53d are connected in sequence. With this configuration, the first surrounding part 53 has a ring shape opened in the z direction. The first surrounding part 53 surrounds the upper end surface 51e. The wiring board 20 and the first shield 41 are provided in first storage space provided by the first surrounding part 53 and the upper end surface 51e.

As shown in (b) of FIG. 11, the second surrounding part 54 is formed on the lower end surface 51f of the base 51. The second surrounding part 54 has a left wall 54a and a right wall 54b aligned in the y direction. The second surrounding part 54 has an upper wall 54c and a lower wall 54d aligned in the x direction.

These walls forming the second surrounding part 54 are formed around the above-described part of the base 51 aligned with the narrow part 31a in the z direction on the lower end surface 51f. In the circumferential direction about the z direction, the left wall 54a, the upper wall 54c, the right wall 54b, and the lower wall 54d are connected in sequence. With this configuration, the second surrounding part 54 has a ring shape opened in the z direction. The second surrounding part 54 surrounds a part of the lower end surface 51f. The second shield 42 is provided in second storage space provided by the second surrounding part 54 and the lower end surface 51f.

In the second storage space, the size of a plane orthogonal to the z direction is smaller than that of the first storage space. The second storage space is aligned with a part of the first storage space in the z direction. A part of the first storage space, which is not aligned with the second storage space in the z direction, is aligned with the connector part 55 in the z direction.

As shown in (b) of FIG. 5 and (b) of FIG. 11, the connector part 55 is formed on the lower end surface 51f of the base 51. The connector part 55 extends, away from a part of the lower end surface 51f not surrounded with the second surrounding part 54 (non-surrounded part), in the z direction. The connector part 55 forms a part of the lower wall 54d.

The connector part 55 has a pillar part 55a extending from the lower end surface 51f in the z direction, and a surrounding part 55c surrounding an apical surface 55b of the pillar part 55a in the circumferential direction about the z direction. The connection terminal 60 extends in the z direction. The connection terminal 60 is covered respectively with the pillar part 55a and a part of the base 51 aligned with the pillar part 55a in the z direction.

One end of the connection terminal 60 is exposed from the apical surface 55b to the outside of the pillar part 55a. The periphery of the one end of the connection terminal 60 exposed from the apical surface 55b is surrounded by the above-described surrounding part 55c. With this configuration, the surrounding part 55c and the one end of the connection terminal 60 form a connector. A connector of a wire harness or the like is connected to the connector.

The other end of the connection terminal 60 is exposed from the upper end surface 51e to the outside of the base 51. The other end of the connection terminal 60 is provided in the above-described first storage space. The connection terminal 60 is away from the part of the electrical-conduction bus bar 30 covered with the base 51 (narrow part 31a) in the x direction. The other end of the connection terminal 60 is positioned adjacent to the lower wall 53d in the x direction. The narrow part 31a is positioned adjacent to the upper wall 53c. The insulating resin material forming the base 51 is positioned between the part of the connection terminal 60 and the part of the narrow part 31a respectively insert-molded in the sensor housing 50.

As described above, the direct current inputted to or outputted from the battery 200 flows through the electrical-conduction bus bar 30. In the connection terminal 60, an electric signal with a smaller current amount than the direct current flows between the wiring board 20 and the battery ECU 801. When the creepage distance between the electrical-conduction bus bar 30 and the connection terminal 60 is short, there is a fear of short-circuit due to conduction between the electrical-conduction bus bar 30 and the connection terminal 60.

A rib 52a for suppressing such inconvenience is formed in the insulating part 52. The rib 52a protrudes from the insulating part 52 in the z direction. The rib 52a extends in the x direction. The length of the rib 52a in the x direction is longer than the respective lengths of the first exposed part 32 and the second exposed part 33 in the x direction.

The rib 52a is positioned between each of the first exposed part 32 and the second exposed part 33 of the electrical-conduction bus bar 30, which are positioned outside of the insulating part 52, and the other end of the connection terminal 60, which is exposed from the upper end surface 51e to the outside. With the ribs 52a, the creepage distance between the electrical-conduction bus bar 30 and the connection terminal 60 on the surface of the sensor housing 50 is elongated. With this configuration, the short circuit between the electrical-conduction bus bar 30 and the connection terminal 60 is suppressed.

Further, the ribs 52a are positioned, respectively, between the first exposed part 32 and the second exposed part 33, and the first shield 41 and the second shield 42. With this configuration, short circuit between the electrical-conduction bus bar 30 and the shield 40 is also suppressed.

It is possible to reduce the length of the insulating part 52 in the y direction by the extension of the creepage distance with the ribs 52a. The length of the insulating part 52 in the y direction is reduced by about 85%. With this configuration, an increase of the physical constitution of the first current sensor 11 is suppressed.

<Wiring Board Fixing Form to Sensor Housing>

Figure 12:
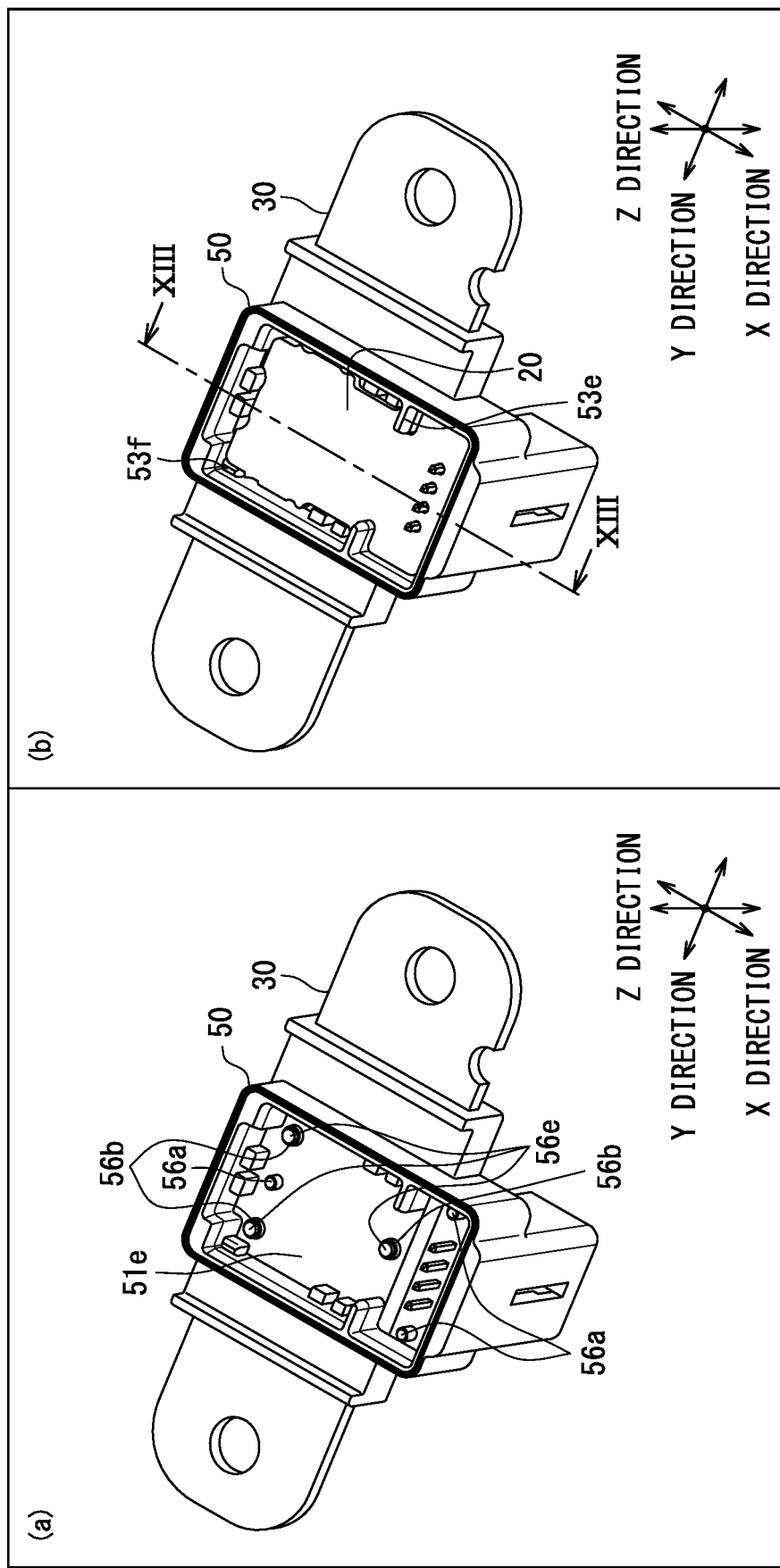
FIG. 12 illustrates diagrams for explaining a board support pin and a board adhesion pin.

As shown in (a) of FIG. 11 and (a) of FIG. 12, a board support pin 56a and a board adhesion pin 56b locally extending in the z direction are formed on the upper end surface 51e of the base 51. Multiple board support pins 56a and board adhesion pins 56b are formed on the upper end surface 51e. In FIG. 12, (a) shows a perspective view of the sensor housing; and (b) shows a perspective view of the sensor housing in which the wiring board is provided. In FIG. 12, for explanation of these pins, a part of reference numerals is omitted.

The multiple board support pins 56a each have an apical surface 56c facing in the z direction. The positions of the multiple apical surfaces 56c in the z direction are equal to each other. Similarly, the multiple board adhesion pins 56b each have an apical surface 56d facing in the z direction. The positions of the multiple apical surfaces 56d in the z direction are equal to each other.

Figure 13:
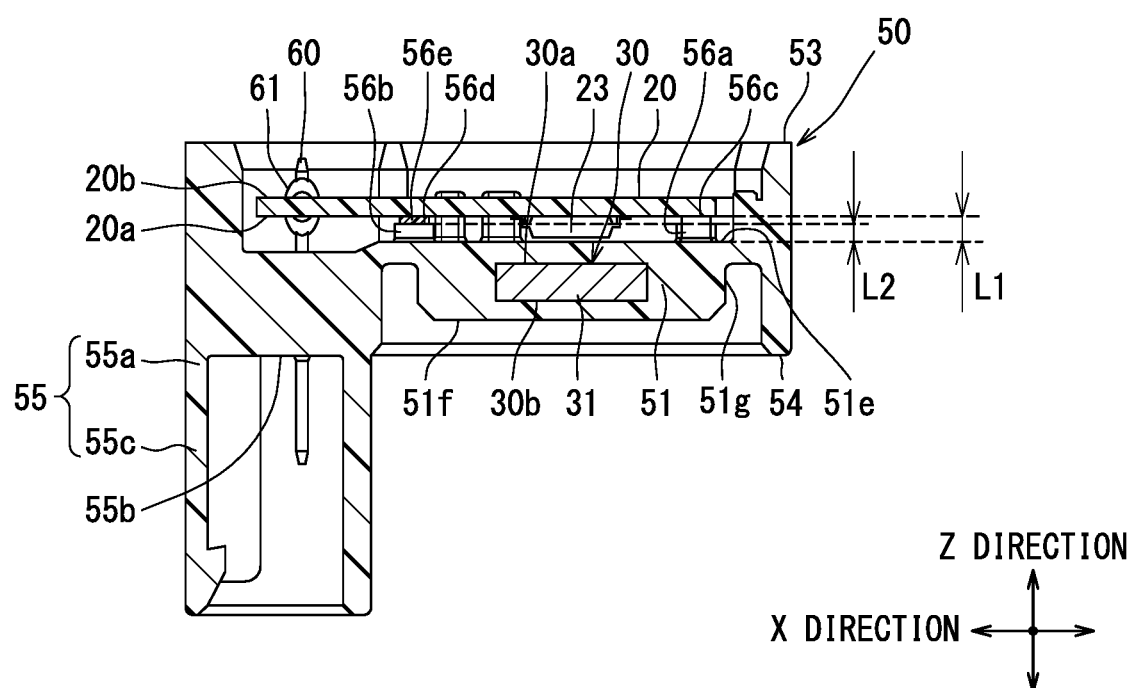
FIG. 13 is a cross-sectional view along a line XIII-XIII shown in (b) of FIG. 12.

As shown in FIG. 13, the length between the apical surface 56c of the board support pin 56a and the upper end surface 51e in the z direction is defined as L1. The length between the apical surface 56d of the board adhesion pin 56b and the upper end surface 51e in the z direction is defined as L2. As clearly indicated in the figure, the length L1 is longer than the length L2.

Therefore, the apical surface 56c of the board support pin 56a is away from the upper end surface 51e, further than the apical surface 56d of the board adhesion pin 56b, in the z direction. The wiring board 20 is mounted, in a state where the opposing surface 20a is in contact with the apical surfaces 56c of the board support pins 56a, in the sensor housing 50. The board support pin 56a corresponds to a board support part. The apical surface 56c corresponds to a support surface.

In the state where the wiring board 20 is mounted on the apical surfaces 56c of the board support pins 56a, the opposing surface 20a of the wiring board 20 is spaced from the apical surfaces 56d of the board adhesion pins 56b in z direction. A board adhesive 56e for adhesion fixing of the wiring board 20 and the board adhesion pin 56b is provided between the wiring board 20 and the board adhesion pin 56b. The board adhesion pin 56b corresponds to a board bonding member. The apical surface 56d corresponds to a mounting surface.

Upon adhesion fixing of the wiring board 20 and the sensor housing 50 with the board adhesive 56e, the temperature of the board adhesive 56e is set to be higher than the temperature of an environment where the first current sensor 11 is provided. In this case, the temperature of the board adhesive 56e may be set to about 150° C., for example. At this temperature, the board adhesive 56e has fluidity. As the board adhesive 56e, a silicone adhesive may be employed.

The board adhesive 56e having fluidity at about 150° C. is applied to the apical surfaces 56d of the board adhesion pins 56b. Then, the wiring board 20 is placed in the sensor housing 50 so that the apical surfaces 56c of the board support pins 56a and the board adhesive 56e are brought into contact with the opposing surface 20a of the wiring board 20. Thereafter, the board adhesive 56e is cooled down to a room temperature to be solidified.

At the temperature of the environment where the first current sensor 11 is provided, a residual stress condensing to its own center occurs to the board adhesive 56e. The wiring board 20 and the board adhesion pin 56b are brought closer to each other with the residual stress. The contact state between the opposing surface 20a of the wiring board 20 and the apical surfaces 56c of the board support pins 56a is maintained.

As a result, misalignment of the wiring board 20 with respect to the sensor housing 50 does not depend on shape variation of the board adhesive 56e having fluidity upon adhesion fixing any longer. The misalignment of the wiring board 20 with respect to the sensor housing 50 is caused by a manufacturing error of the sensor housing 50. In other words, the misalignment of the wiring board 20 with respect to the electrical-conduction bus bar 30 insert-molded in the sensor housing 50 depends on the manufacturing error of the sensor housing 50.

In the present embodiment, three board support pins 56a are formed on the upper end surface 51e. Two of the three board support pins 56a are aligned, away from each other, in the y direction. The remaining one board support pin 56a is away from a middle point between the two board support pins 56a aligned in the y direction, in the x direction. The apical surfaces 56c of the three board support pins 56a form apexes of an isosceles triangle. The narrow part 31a of the electrical-conduction bus bar 30 is positioned between the two board support pins 56a aligned in the y direction and the remaining one board support pin 56a.

In the present embodiment, three board adhesion pins 56b are formed on the upper end surface 51e. Two of the three board adhesion pins 56b are aligned, away from each other, in the y direction. The remaining one board adhesion pin 56b is away from a middle point between the two board support pins 56a aligned in the y direction, in the x direction. The apical surfaces 56d of the three board adhesion pins 56b form apexes of an isosceles triangle.

The other ends of the multiple connection terminals 60 are aligned between the two board support pins 56a aligned in the y direction. The remaining one board support pin 56a is positioned in the middle point between the two board adhesion pins 56b aligned in the y direction. Accordingly, the remaining one board support pin 56a is aligned with the remaining one board adhesion pin 56b in the x direction. The center point CP of the narrow part 31a is positioned between the remaining one board support pin 56a and the remaining one board adhesion pin 56b in the x direction.

With the above-described configuration, the isosceles triangle formed by connecting the apical surfaces 56c of the three board support pins 56a and the isosceles triangle formed by connecting the apical surfaces 56d of the three board adhesion pins 56b overlap each other in the z direction. The center point CP of the narrow part 31a is positioned in the region provided by these two isosceles triangles overlapping in the z direction.

The wiring board 20 is provided in the sensor housing 50 to be opposed to the two isosceles triangles, respectively, in the z direction. In the wiring board 20, the connection between a part opposing to the two isosceles triangles and the sensor housing 50 is more stable, because of the contact with the board support pins 56a and the connection with the board adhesion pins 56b via the board adhesive 56e, than the connection between a part without opposing to the two isosceles triangles and the sensor housing 50. The first sensing unit 21 and the second sensing unit 22 are mounted on the part of the wiring board 20 with stable connection with the sensor housing 50.

In a state where the wiring board 20 is mounted on the board support pins 56a and fixed via the board adhesive 56e to the board adhesion pins 56b, the opposing surface 20a of the wiring board 20 and the upper end surface 51e of the base 51 are opposed to each other and spaced from each other in the z direction. If there is no manufacturing error or the like, the clearance between the opposing surface 20a and the upper end surface 51e is constant over the entire surface, and the opposing surface 20a and the upper end surface 51e are in parallel relationship.

As described above, the narrow part 31a of the electrical-conduction bus bar 30 is insert-molded in the base 51. If there is no manufacturing error or the like, the clearance between the surface 30a of the narrow part 31a and the upper end surface 51e of the base 51 is constant over the entire surface, and the surface 30a of the narrow part 31a and the upper end surface 51e of the base 51 are in parallel relationship.

Because of the parallel relationship described as above, if there is no manufacturing error or the like, the clearance between the opposing surface 20a of the wiring board 20 and the surface 30a of the narrow part 31a is also constant over the entire surface, and the opposing surface 20a of the wiring board 20 and the surface 30a of the narrow part 31a are in parallel relationship.

As described above, the wiring board 20 is formed by laminating multiple resin layers and metal layers in the z direction. Therefore, the manufacturing error of the thickness of the wiring board 20 in the z direction is likely to be large. The manufacturing error of the thickness of the wiring board 20 in the z direction is about twice of the manufacturing error due to the position of the electrical-conduction bus bar 30 insert-molded in the sensor housing 50 in the z direction and the arrangement error of the wiring board 20 in the z direction with respect to the sensor housing 50.

In the wiring board 20, the first sensing unit 21 and the second sensing unit 22 are provided on the opposing surface 20a, which opposes to the electrical-conduction bus bar 30. Therefore, the distance between the first sensing unit 21 and the electrical-conduction bus bar 30 and the distance between the second sensing unit 22 and the electrical-conduction bus bar 30 in the z direction do not depend on the thickness of the wiring board 20 in the z direction. Thus, variations of the distance between the first sensing unit 21 and the electrical-conduction bus bar 30 and the distance between the second sensing unit 22 and the electrical-conduction bus bar 30 in the z direction due to the manufacturing error of the thickness of the wiring board 20 in the z direction are suppressed.

Note that the number of the board support pins 56a and the number of the board adhesion pins 56b are not limited to three. The number of the board support pins 56a may be four or more. The number of the board adhesion pins 56b may be one, two, four or more.

When three or more board support pins 56a and three or more board adhesion pins 56b are provided, it is desirable to configure such that the polygon formed by connecting the apical surfaces 56c of the three or more board support pins 56a and the polygon formed by connecting the apical surfaces 56d of the three or more board adhesion pins 56b overlap each other in the z direction. In this configuration, the first sensing unit 21 and the second sensing unit 22 may be mounted in a region of the wiring board 20 opposing to the two polygons in the z direction. With this configuration, the misalignment of the first sensing unit 21 and the misalignment of the second sensing unit 22 respectively with respect to the sensor housing 50 are suppressed.

As the names of board support pin 56a and board adhesion pin 56b indicate, the example where these pins have pillar shapes extending in the z direction has been shown. However, the shapes of these pins are not limited to the pillar shapes. As long as the apical surface 56c of the board support pin 56a is away from the upper end surface 51e further than the apical surface 56d of the board adhesion pin 56b, the shape is not particularly limited.

<Fixing Form of First Shield to Sensor Housing>

Figure 14:
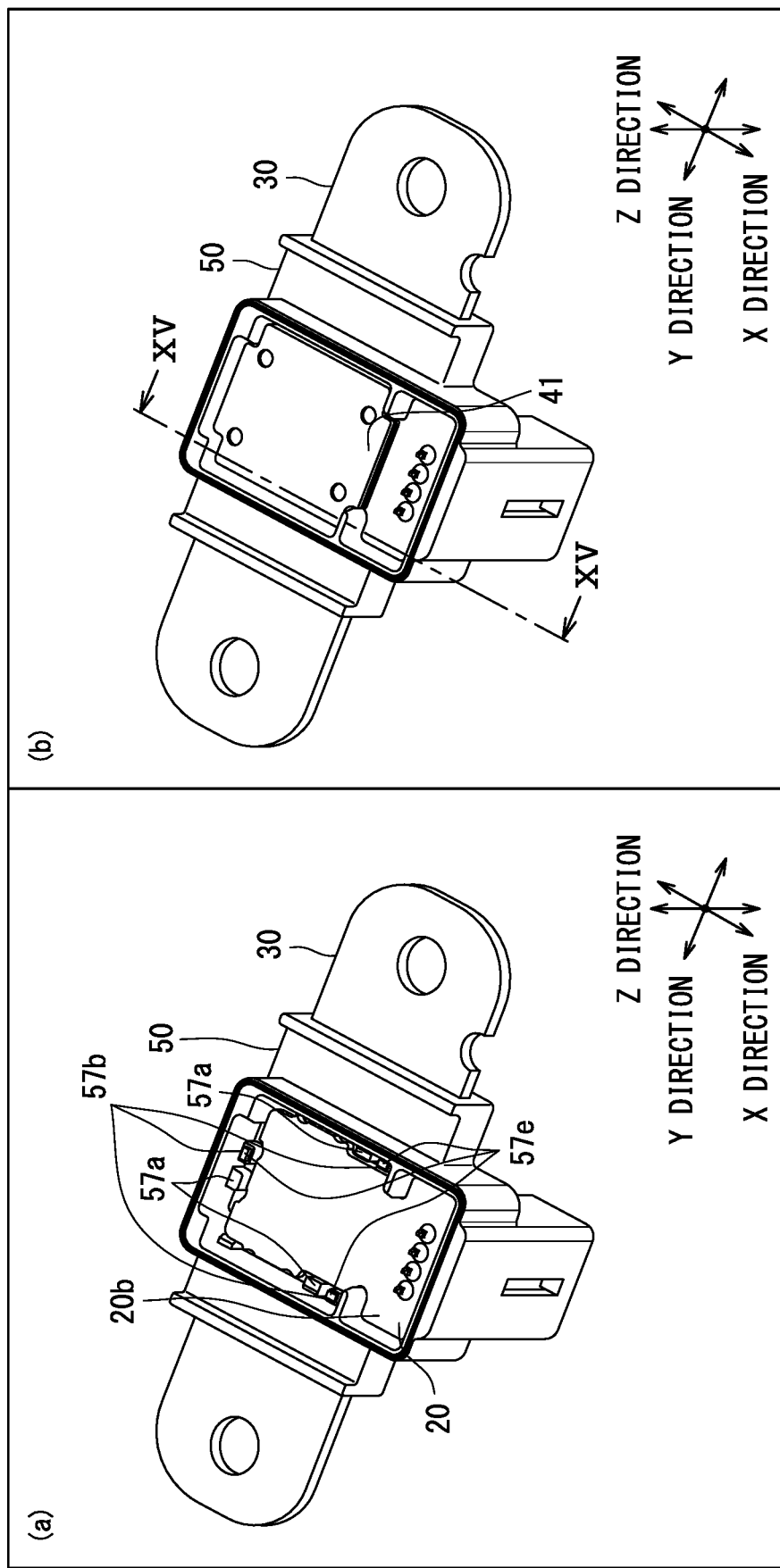
FIG. 14 illustrates diagrams for explaining a shield support pin and a shield adhesion pin.

As shown in (a) of FIG. 11 and (a) of FIG. 14, a shield support pin 57a and a shield adhesion pin 57b are formed on the upper end surface 51e of the base 51 to locally extending in the z direction. Multiple shield support pins 57a and shield adhesion pins 57b are formed on the upper end surface 51e. In FIG. 14, (a) shows a perspective view of the sensor housing provided with the wiring board; and (b) shows a perspective view of the sensor housing provided with the wiring board and the shield. In FIG. 14, a part of reference numerals is omitted for explanation of these pins.

The multiple shield support pins 57a each have an apical surface 57c facing in the z direction. The positions of the multiple apical surfaces 57c in the z direction are equal to each other. Similarly, the multiple shield adhesion pins 57b each have an apical surface 57d facing in the z direction. The positions of the apical surfaces 57d in the z direction are equal to each other.

Figure 15:
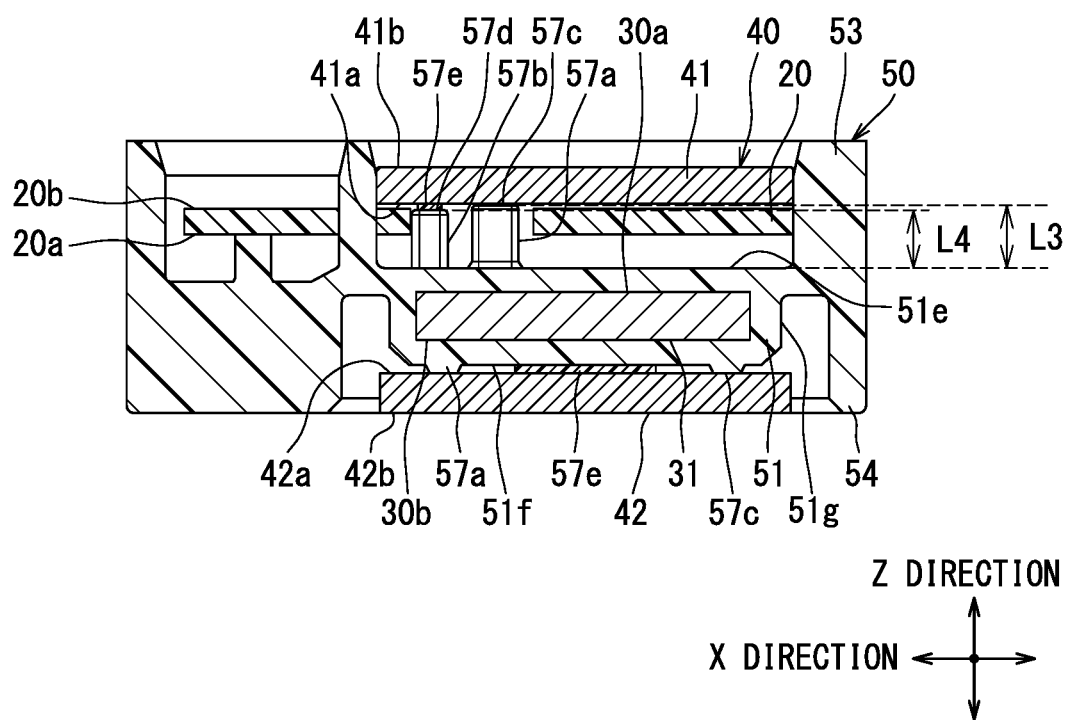
FIG. 15 is a cross-sectional view along a line XV-XV shown in (b) of FIG. 14.

As shown in FIG. 15, in the respective shield support pin 57a and shield adhesion pin 57b, the length in the z direction is longer than that of the board support pin 56a. More specifically, in the respective shield support pin 57a and shield adhesion pin 57b, the length in the z direction is longer than that of the board support pin 56a by an amount equal to or larger than the thickness of the wiring board 20. As described above, in the state where the wiring board 20 is mounted in the sensor housing 50, the apical surface 57c of the shield support pin 57a and the apical surface 57d of the shield adhesion pin 57b are respectively further from the upper end surface 51e than the rear surface 20b of the wiring board 20 in the z direction. Note that a configuration where the difference between the length of the shield adhesion pin 57b and the length of the board support pin 56a in the z direction is shorter than the thickness of the wiring board 20 in the z direction may be employed.

As shown in FIG. 15, the length between the apical surface 57c of the shield support pin 57a and the upper end surface 51e in the z direction is L3. The length between the apical surface 57d of the shield adhesion pin 57b and the upper end surface 51e in the z direction is L4. As clearly indicated in the figure, the length L3 is longer than the length L4.

The apical surface 57c of the shield support pin 57a is away from the upper end surface 51e further than the apical surface 57d of the shield adhesion pin 57b in the z direction. The first shield 41 is mounted in the sensor housing 50 in the state where the one surface 41a is in contact with the apical surface 57c of the shield support pin 57a. The shield support pin 57a corresponds to a shield support part. The apical surface 57c corresponds to the contact surface.

In the state where the one surface 41a of the first shield 41 is mounted on the apical surface 57c of the shield support pin 57a, the one surface 41a of the first shield 41 and the apical surface 57d of the shield adhesion pin 57b are away from each other in the z direction. The board adhesive 56e for adhesion fixing is provided between the first shield 41 and the shield adhesion pin 57b. The shield adhesion pin 57b corresponds to a shield adhesion part. The apical surface 57d corresponds to the application surface.

Upon the adhesion fixing between the first shield 41 and the sensor housing 50 with the shield adhesive 57e, the temperature of the shield adhesive 57e is set to be higher than the temperature of the environment where the first current sensor 11 is provided. The temperature of the shield adhesive 57e in this case may be set to about 150° C., for example. At this temperature, the shield adhesive 57e has fluidity. As the shield adhesive 57e, a silicone adhesive may be employed.

The shield adhesive 57e having fluidity at about 150° C. is applied to the apical surface 57d of the shield adhesion pin 57b. Then, the first shield 41 is placed in the sensor housing 50 so as to bring the apical surface 57c of the shield support pin 57a and the shield adhesive 57e respectively into contact with the one surface 41a of the first shield 41. Thereafter, the shield adhesive 57e is cooled down to the room temperature to be solidified.

Thus, in the shield adhesive 57e, a residual stress condensing to its own center occurs at the temperature of the environment where the first current sensor 11 is provided. The first shield 41 and the shield adhesion pin 57b are brought closer to each other with the residual stress. The contact state between the one surface 41a of the first shield 41 and the apical surface 57c of the shield support pin 57a is maintained.

As a result, the misalignment of the first shield 41 with respect to the sensor housing 50 does not depend on the shape variation of the shield adhesive 57e having fluidity upon adhesion fixing any longer. The misalignment of the first shield 41 with respect to the sensor housing 50 is caused by the manufacturing error of the sensor housing 50. In other words, the misalignment of the first shield 41 with respect to the wiring board 20 fixed to the sensor housing 50 depends on the manufacturing error of the sensor housing 50.

In the present embodiment, three shield support pins 57a are formed on the upper end surfaces 51e. One of the three shield support pins 57a is connected integrally with the left wall 53a. One of the remaining two shield support pins 57a is connected integrally with the right wall 53b. The remaining one shield support pin 57a is connected integrally with the upper wall 53c. The apical surfaces 57c of the three shield support pins 57a form apexes of a triangle.

The shield support pin 57a connected integrally with the left wall 53a and the shield support pin 57a connected integrally with the right wall 53b are aligned in the y direction. The interval between the two shield support pins 57a and the shield support pin 57a connected integrally with the upper wall 53c are away from each other in the x direction. The first sensing unit 21 and the second sensing unit 22 of the wiring board 20 are positioned in the triangular region formed by connecting the apical surfaces 57c of the three shield support pins 57a.

In the present embodiment, three shield adhesion pins 57b are formed on the upper end surface 51e. One of the three shield adhesion pins 57b is connected integrally with the left wall 53a. One of the remaining two shield adhesion pins 57b is connected integrally with the right wall 53b. The remaining one shield adhesion pin 57b is connected integrally with the upper wall 53c. The apical surfaces 57d of the three shield adhesion pins 57b form apexes of a triangle.

The shield adhesion pin 57b connected integrally with the left wall 53a, and the shield adhesion pin 57b connected integrally with the right wall 53b, are aligned in the y direction. The interval between the two shield adhesion pins 57b and the shield adhesion pin 57b connected integrally with the upper wall 53c are away from each other in the x direction. The triangular region formed by connecting the apical surfaces 57d of the three shield adhesion pins 57b is aligned with the first sensing unit 21 and the second sensing unit 22 in the z direction.

Further, one shield support pin 57a and one shield adhesion pin 57b are aligned with each other on each of the left wall 53a and the right wall 53b. One shield support pin 57a and one shield adhesion pin 57b are aligned with each other on the upper wall 53c. The triangle formed by connecting the apical surfaces 57c of the three shield support pins 57a and the triangle formed by connecting the apical surfaces 57d of the three shield adhesion pins 57b overlap each other in the z direction. The overlapping region of the triangles in the z direction and the center point CP of the narrow part 31a are aligned in the z direction.

The first shield 41 is provided in the sensor housing 50 so as to oppose the two triangles in the z direction. In the first shield 41, the connection with the sensor housing 50 of the part opposing to the two triangles is more stable, by the contact with the shield support pin 57a and the connection with the shield adhesion pin 57b via the shield adhesive 57e, than that of the part without opposing to the two triangles.

The part of the first shield 41 with stable connection to the sensor housing 50 is aligned with both of the first sensing unit 21 and the second sensing unit 22 of the wiring board 20 in the z direction. Specifically, the first center part 41d of the first shield 41 is aligned with each of the first sensing unit 21 and the second sensing unit 22 in the z direction.

In the state where the first shield 41 is mounted on the shield support pin 57a and fixed via the shield adhesive 57e to the shield adhesion pin 57b, the one surface 41a of the first shield 41 and the rear surface 20b of the wiring board 20 are opposed to and away from each other in the z direction. If there is no manufacturing error or the like, the distance between the one surface 41a and the rear surface 20b is constant over the entire surface, and the one surface 41a and the rear surface 20b are in parallel relationship. Accordingly, the distance between the opposing surface 20a of the wiring board 20 and the one surface 41a of the first shield 41 is also constant over the entire surface, and the opposing surface 20a of the wiring board 20 and the one surface 41a of the first shield 41 are in parallel relationship.

Note that, as shown in FIG. 6 and (a) in FIG. 14, notches 20g to allow the above-described shield support pins 57a and shield adhesion pins 57b respectively to pass through to positions above the wiring board 20 are formed at ends the wiring board 20. Multiple through holes 20h to allow the other ends of the connection terminals 60 to pass through are formed in the wiring board 20.

As shown in FIG. 6, the multiple through holes 20h are aligned in the y direction. In the wiring board 20, the part in which the multiple through holes 20h are formed is aligned with the part on which the first sensing unit 21 and the second sensing unit 22 are mounted in the x direction. In the wiring board 20, a first notch 20i to guide the position of the wiring board 20 with respect to the sensor housing 50 in the x direction when the wiring board 20 is mounted in the sensor housing 50 is formed between the two parts aligned in the x direction. Further, in the wiring board 20, a second notch 20j to guide the position of the wiring board 20 with respect to the sensor housing 50 in the y direction when the wiring board 20 is mounted in the sensor housing 50 is formed in the part where the first sensing unit 21 and the second sensing unit 22 are mounted.

In correspondence with the above configuration, as shown in (a) of FIG. 11 and (b) of FIG. 12, a first projection 53e to be received in the first notch 20i is formed on each of the left wall 53a and the right wall 53b of the sensor housing 50. A second projection 53f, which is to be opposed to the second notch 20j in the y direction, is formed on each of the left wall 53a and the right wall 53b. The first notch 20i and the first projection 53e have similar shapes and extend in the y direction. The second notch 20j and the second projection 53f have similar shapes and extend in the x direction.

The number of the above-described shield support pins 57a and the number of the shield adhesion pins 57b are not limited to the above-described example. The number of the shield support pins 57a may be four or more. The number of the shield adhesion pins 57b may be one, two, four or more.

When three or more shield support pins 57a and three or more shield adhesion pins 57b are employed, it is desirable to configure such that the polygon formed by connecting the apical surfaces 57c of the three or more shield support pins 57a and the polygon formed by connecting the apical surfaces 57d of the three or more shield adhesion pins 57b overlap each other in the z direction. In this configuration, the part of the first shield 41 opposing to the two polygons in the z direction may be aligned with both of the first sensing unit 21 and the second sensing unit 22 of the wiring board 20 in the z direction. In such a case, the misalignment of the first shield 41 with respect to the first sensing unit 21 and the misalignment of the first shield 41 with respect to the second sensing unit 22 are suppressed.

As the names of shield support pin 57a and shield adhesion pin 57b indicate, the example where these pins have pillar shapes extending in the z direction has been shown. However, the shapes of the pins are not limited to the pillar shapes. As long as the apical surface 57c of the shield support pin 57a is away from the upper end surface 51e further than the apical surface 57d of the shield adhesion pin 57b, the shape is not particularly limited.

<Fixing Form of Second Shield to Sensor Housing>

As shown in (b) of FIG. 11 and FIG. 15, multiple shield support pins 57a are formed also on the lower end surface 51f of the base 51.

Differently from the first shield 41, the wiring board 20 is not provided between the sensor housing 50 and the second shield 42. Therefore, in the shield support pin 57a formed on the lower end surface 51f, the length in the z direction is shorter than that of the shield support pin 57a formed on the upper end surface 51e. The positions of the respective ends of the multiple board support pins 56a in the z direction are equal to each other. The second shield 42 is mounted in the sensor housing 50 in the state where the one surface 42a is in contact with the apical surface 57c of the shield support pin 57a.

The one surface 42a of the second shield 42, mounted on the apical surface 57c of the shield support pin 57a, is away from the lower end surface 51f in the z direction. The shield adhesive 57e is provided between the second shield 42 and the lower end surface 51f.

Upon adhesion fixing between the second shield 42 and the sensor housing 50 with the shield adhesive 57e, the temperature of the shield adhesive 57e is also set to be higher than the temperature of the environment where the first current sensor 11 is provided.

The shield adhesive 57e having fluidity is applied to the lower end surface 51f. Then, the second shield 42 is placed in the sensor housing 50 so as to bring the apical surface 57c of the shield support pin 57a and the shield adhesive 57e respectively into contact with the one surface 42a of the second shield 42. Thereafter, the shield adhesive 57e is cooled down to the room temperature to be solidified.

With this configuration, also in the shield adhesive 57e provided on the lower end surface 51f, a residual stress condensing to its own center occurs at the temperature of the environment where the first current sensor 11 is provided. The second shield 42 and the shield adhesion pin 57b are brought closer to each other with the residual stress. The contact status between the one surface 42a of the second shield 42 and the apical surface 57c of the shield support pin 57a is maintained.

As a result, the misalignment of the second shield 42 with respect to the sensor housing 50 does not depend on the shape variation of the shield adhesive 57e having fluidity upon the adhesion fixing any longer. The misalignment of the second shield 42 with respect to the sensor housing 50 is caused by the manufacturing error of the sensor housing 50. In other words, the misalignment of the second shield 42 with respect to the wiring board 20 fixed to the sensor housing 50 depends on the manufacturing error of the sensor housing 50.

In the present embodiment, four shield support pins 57a are formed on the lower end surface 51f. The apical surfaces 57c of the four shield support pins 57a form vertices of a rectangle. The rectangle formed by connecting the apical surfaces 57c of the four shield support pins 57a is aligned with the center point CP of the narrow part 31a in the z direction. The shield adhesive 57e is applied to a region opposing to the rectangle in the lower end surface 51f.

The second shield 42 is provided in the sensor housing 50 to be opposed to the above-described rectangle in the z direction. In the part of the second shield 42 opposing to the rectangle, the connection to the sensor housing 50 is more stable by the contact with the shield support pin 57a and the connection via the shield adhesive 57e to the lower end surface 51f, than the connection of the part without opposing to the rectangle to the sensor housing 50.

The part of the second shield 42, with stable connection to the sensor housing 50, is aligned with both of the first sensing unit 21 and the second sensing unit 22 of the wiring board 20 in the z direction. Specifically, the second center part 42d of the second shield 42 is aligned respectively with the first sensing unit 21 and the second sensing unit 22 in the z direction.

Note that the number of shield support pins 57a formed on the lower end surface 51f is not limited to four. As long as the number of shield support pins 57a is equal to or larger than three, any number of shield support pins 57a may be employed.

When three or more shield support pins 57a are provided, it may be configured such that a region of the second shield 42, opposing to the polygon formed by connecting the apical surfaces 57c of the three or more shield support pins 57a in the z direction, is aligned respectively with the first sensing unit 21 and the second sensing unit 22 in the z direction. With this configuration, the misalignment of the second shield 42 with respect to the first sensing unit 21 and the misalignment of the second shield 42 with respect to the second sensing unit 22 are suppressed.

As described above, the extending parts 42c extending in the z direction are formed on the two sides 42f of the second shield 42 aligned in the x direction. Two grooves 51g for arranging the extending parts 42c are formed in the lower end surface 51f.

As shown in (b) of FIG. 11 and in FIG. 13, the two grooves 51g are aligned in the x direction between the upper wall 54c and the lower wall 54d. The two grooves 51g are each formed from the lower end surface 51f toward the upper end surface 51e in the z direction. A part of one of the two grooves 51g is formed by the upper wall 54c. A part of the remaining one groove 51g is formed by the lower wall 54d. The covered part 31 is positioned between the two grooves 51g. Accordingly, the covered part 31 is positioned between the two extending parts 42c of the second shield 42.

<Lengths of Support Pin and Adhesion Pin>

The upper end surface 51e of the base 51 is divided into an exposed part from which the other end of the connection terminal 60 expose and a part which covers the narrow part 31a, which are aligned in the x direction but with the above-described first projections 53e in the y direction as a boundary. In the upper end surface 51e, the exposed part from which the other end of the connection terminal 60 expose is positioned adjacent to the lower end surface 51f than the part which covers the narrow part 31a in the z direction. Accordingly, the distance between the exposed part of the upper end surface 51e from which the other end of the connection terminal 60 expose and the opposing surface 20a of the wiring board 20 in the z direction is longer than the distance between the part of the upper end surface 51e which covers the narrow part 31a and the opposing surface 20a of the wiring board 20 in the z direction. The distance between the exposed part of the upper end surface 51e from which the other end of the connection terminal 60 expose and the opposing surface 20a of the wiring board 20 is provided so as to ensure a distance for insertion of the other end of the connection terminal 60 into the through hole 20h of the wiring board 20.

In this manner, in the upper end surface 51e, the position of the exposed part from which the other end of the connection terminal 60 expose and the position of the part which covers the narrow part 31a are different in the z direction. The board support pins 56a are formed respectively in these two parts. In the present embodiment, although the parts of the upper end surface 51e are at different positions in the z direction, the apical surfaces 56c of the multiple board support pins 56a are at the same positions in the z direction. Thus, the lengths of the multiple board support pins 56a in the z direction are different.

The lengths of the multiple board support pins 56a in the z direction are not uniformly equal to the length L1 shown in FIG. 13. The length L1 indicates the length of the board support pin 56a formed on the part of the upper end surface 51e which covers the narrow part 31a in the z direction. The length of the board support pin 56a formed in the exposed part of the upper end surface 51e from which the other end of the connection terminal 60 expose in the z direction is longer than the length L1 by the difference in position of the divided two parts of the upper end surface 51e in the z direction.

As described above, the length of the support pin in the z direction may differ in correspondence with the position of the surface where the pin is formed in the z direction as long as the positions of the respective apical surfaces 56c of the multiple board support pins 56a in the z direction are the same. The configuration is true for the multiple shield support pins 57a.

Note that, when the wiring board 20 is mounted in the sensor housing 50, the board adhesive 56e having fluidity is applied to the apical surfaces 56d of the board adhesion pins 56b. The shape of the board adhesive 56e, having fluidity, is variable in the z direction. Accordingly, the positions of the apical surfaces 56d of the multiple board adhesion pins 56b may be different. This is also true for the multiple shield adhesion pins 57b.

<Second Current Sensor and Third Current Sensor>

Next, the second current sensor 12 will be described in detail. Note that the configuration of the second current sensor 12 and the configuration of the third current sensor 13 are substantially the same. Accordingly, explanation of the third current sensor 13 will be omitted.

Further, the second current sensor 12 has constituent elements common to the first current sensor 11. In the following description, explanation of the points same as those of the first current sensor 11 will be omitted, and the differences will be mainly described.

As described above, the second current sensor 12 is provided on the first energization bus bar 341 and the second energization bus bar 342. To detect the current flowing in the first energization bus bar 341 and the current flowing in the second energization bus bar 342 respectively, the second current sensor 12 has two individual sensors 71 having a function equivalent to the function of the first current sensor 11. Further, the second current sensor 12 has a wiring case 72 accommodating the two individual sensors 71.

One of the two individual sensors 71 detects the magnetic field generated from the alternating current which flows through the first energization bus bar 341. The other one of the two individual sensors 71 detects the magnetic field generated from the alternating current which flows through the second energization bus bar 342.

Figure 16:
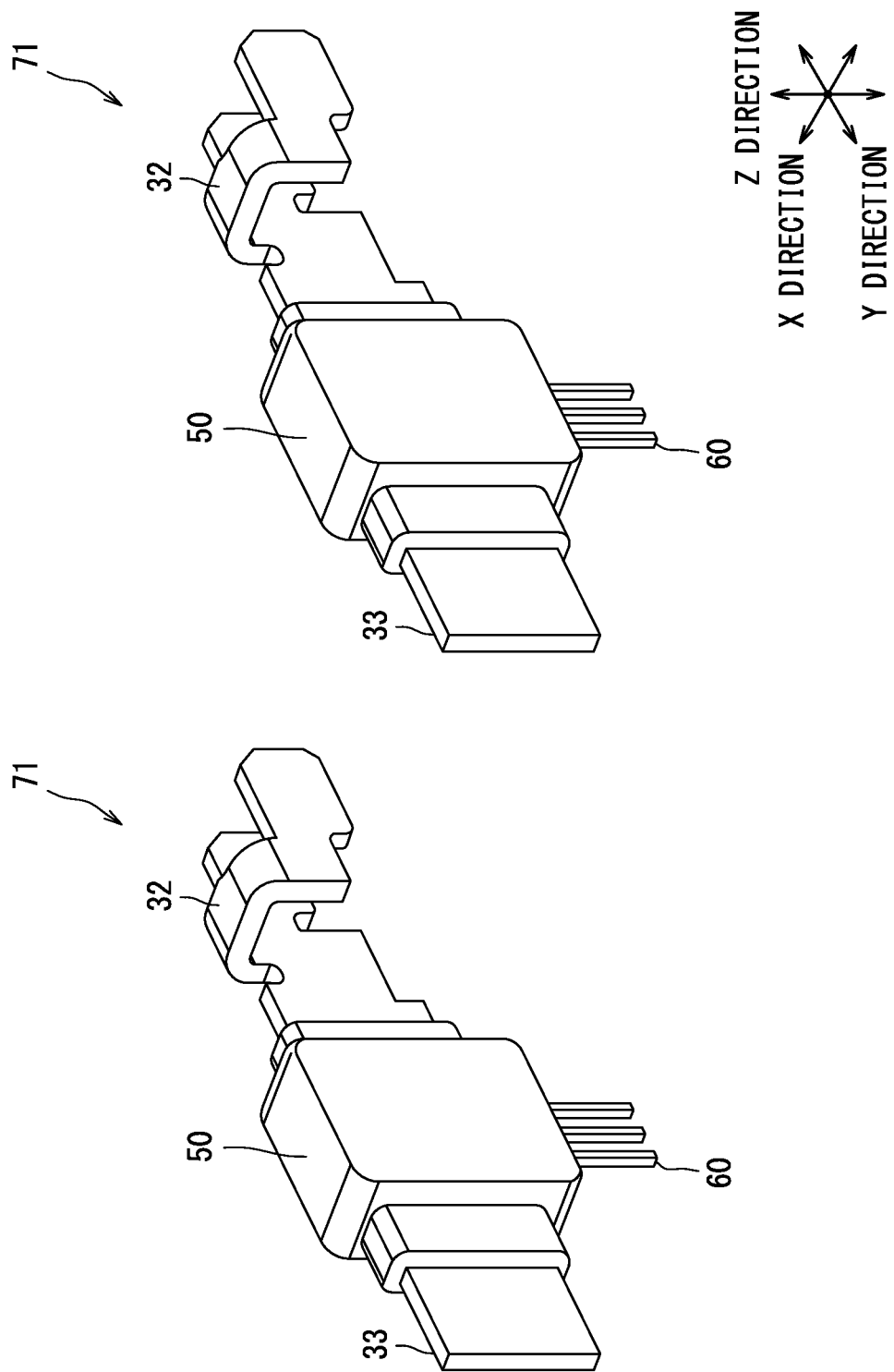
FIG. 16 is a perspective view of two individual sensors.

FIG. 16 shows the two individual sensors 71. The two individual sensors 71 have the same shape. The structural differences between the individual sensor 71 and the first current sensor 11 include the connecting part in the electrical-conduction bus bar 30 with respect to the energization bus bar, the shape of the connector part 55 which covers the connection terminal 60, and the like. That is, the structural differences between the individual sensor 71 and the first current sensor 11 include the shape of the first exposed part 32 and the second exposed part 33 of the electrical-conduction bus bar 30, and elimination of the surrounding part 55c, and the like.

The individual sensor 71 and the first current sensor 11 have the structural differences because the objects to which the individual sensor 71 and the first current sensor 11 are connected are difference. The first current sensor 11 is connected to the energization bus bar 307 of the converter 310. The second current sensor 12 is connected to the first energization bus bar 341 and the second energization bus bar 342 of the first inverter 320. Note that the internal structure of the individual sensor 71 and the internal structure of the first current sensor 11 are the same. Accordingly, the individual sensor 71 achieves similar effects to those of the first current sensor 11.

The multiple individual sensors 71 are accommodated in the wiring case 72 shown in FIG. 17. As shown in FIG. 18, the multiple individual sensors 71 can be accommodated collectively in the wiring case 72. As shown in FIG. 19, the second current sensor 12 is configured by accommodating the multiple individual sensors 71 in the wiring case 72.

Note that in the case of this configuration, the first shields 41 and the second shields 42 of the respective individual sensors 71 are alternately aligned in the x direction. The magnetoelectric converter 25 of the individual sensor 71 has sensing directions of the magnetic field in the z direction and in the y direction.

Further, six individual sensors 71 are accommodated in the wiring case 72 shown in the previously shown FIG. 17 to FIG. 19 and the following figures. The number of the individual sensors 71 accommodated in the wiring case 72 is merely an example. As long as the wiring case 72 is capable of accommodating at least two individual sensors 71, any number of individual sensors 71 may be accommodated in the wiring case 72.

Further, a current sensor that detects a current in another in-vehicle equipment may be accommodated in the wiring case 72 of the second current sensor 12. Further, it is possible to employ a configuration where the second current sensor 12 and the third current sensor 13 share a wiring case 72, and the individual sensors 71 of the second current sensor 12 and the third current sensor 13 are accommodated in the same wiring case 72.

<Wiring Case>

As shown in FIG. 17, the wiring case 72 has an integrated housing 73, a terminal housing 74, and an energization terminal 75. The integrated housing 73 and the terminal housing 74 are made of an insulating resin material. The integrated housing 73 and the terminal housing 74 are integrally connected to each other. As shown in FIG. 18 and FIG. 19, multiple individual sensors 71 are accommodated in the integrated housing 73. Accordingly, the physical constitution of the integrated housing 73 is larger than the physical constitution of the sensor housing 50 of the individual sensor 71. Multiple energization terminals 75 are insert-molded in the terminal housing 74. As shown in FIG. 20 to FIG. 23, one ends and the other ends of the multiple energization terminals 75 are exposed to the outside of the terminal housing 74.

Figure 20:
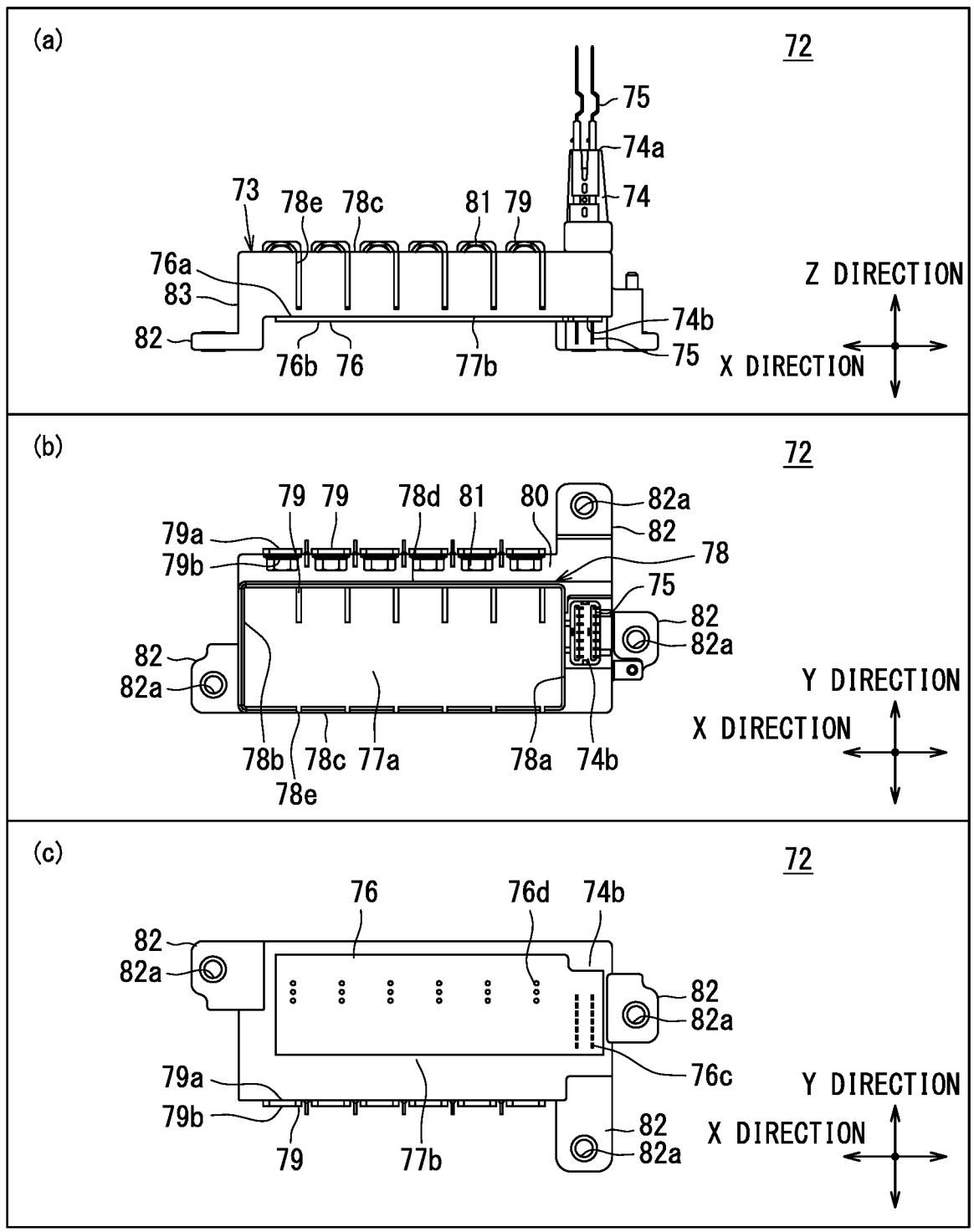
FIG. 20 illustrates diagrams showing the wiring case.
Figure 21:
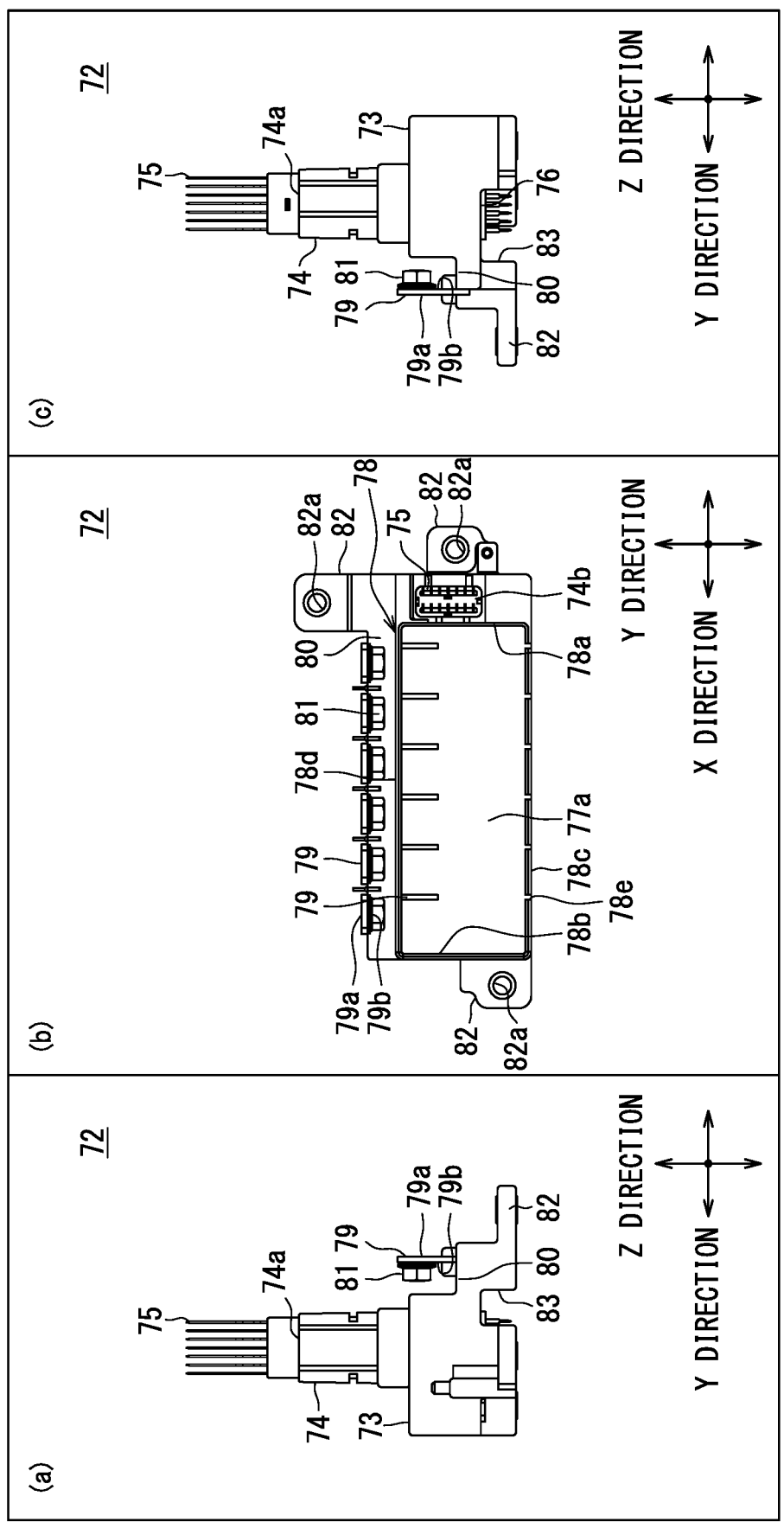
FIG. 21 illustrates diagrams showing the wiring case.

In FIG. 20, (a) shows a rear view of the wiring case; (b) shows a top view of the wiring case; and (c) shows a bottom view of the wiring case. In FIG. 21, (a) shows a left side view of the wiring case; (b) shows a top view of the wiring case; and (c) shows a right side view of the wiring case. Note that (b) of FIG. 20 and (b) of FIG. 21 show the same figure.

Figure 22:
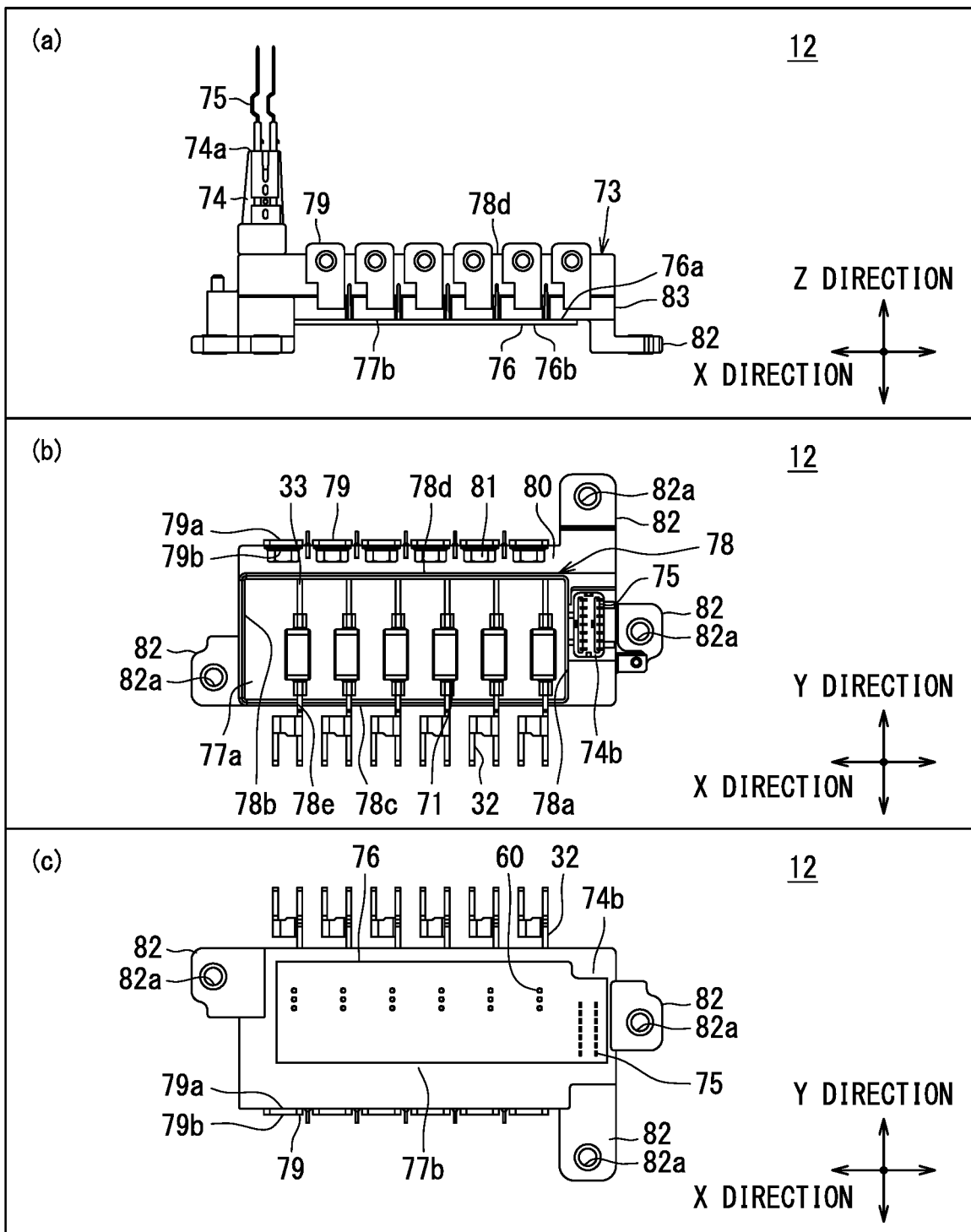
FIG. 22 illustrates diagrams showing the second current sensor.
Figure 23:
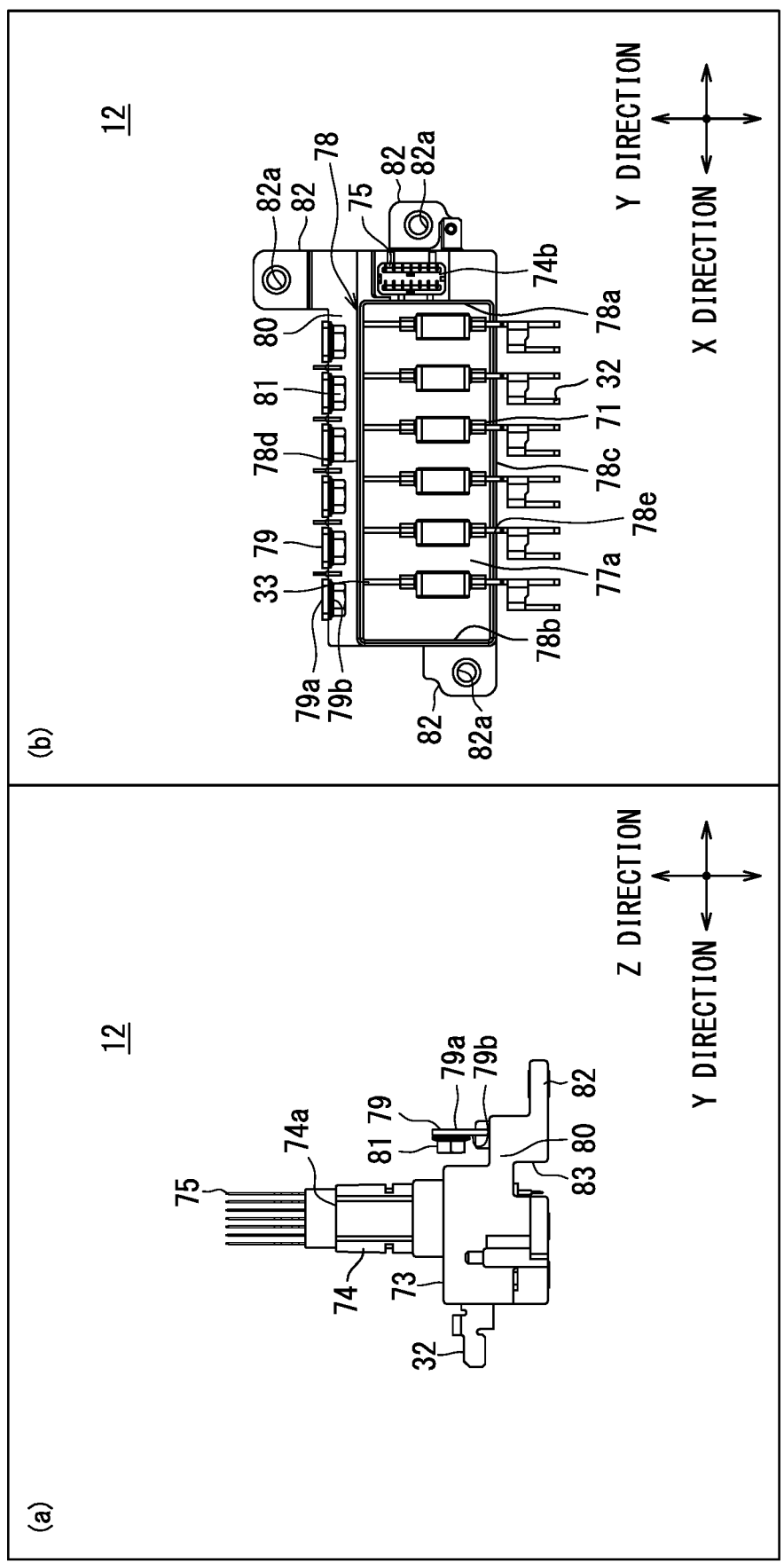
FIG. 23 illustrates diagrams showing the second current sensor.

In FIG. 22, (a) shows a front view of the second current sensor; (b) shows a top view of the second current sensor; and (c) shows a bottom view of the second current sensor. In FIG. 23, (a) shows a side view of the second current sensor; and (b) shows a top view of the second current sensor. Note that (b) of FIG. 22 and (b) of FIG. 23 show the same figure.

As respectively shown in (c) of FIG. 20 and (c) of FIG. 22, the wiring case 72 has an integrated wiring board 76. The one end of the connection terminal 60 of the individual sensor 71 is connected to the integrated wiring board 76. One end of the energization terminal 75 is connected to the integrated wiring board 76. With this configuration, the individual sensor 71 and the energization terminal 75 are electrically connected to each other via the wiring pattern of the integrated wiring board 76. The other end of the energization terminal 75 is electrically connected via a wire harness or the like to the MG ECU 802. As described above, output of the individual sensor 71 is transmitted via the integrated wiring board 76, the energization terminal 75, and the wire harness, into the MG ECU 802. The integrated wiring board 76 and the energization terminal 75 correspond to an input/output wiring.

As described above, the second current sensor 12 is provided on the first energization bus bar 341 and the second energization bus bar 342. These energization bus bars are respectively divided into a part adjacent to the first inverter 320 and a part adjacent to the first motor 400. The energization bus bar has a part to connect the first inverter 320 to the second current sensor 12 and a part to connect the second current sensor 12 to the first motor 400.

In the energization bus bar of the present embodiment, the part to connect the first inverter 320 to the second current sensor 12 is provided by a conductive plate made of a metal material. The part of the energization bus bar to connect the second current sensor 12 to the first motor 400 is provided by a wire. In the following description, the part of the energization bus bar to connect the first inverter 320 to the second current sensor 12 will be simply referred to as the conductive plate. The part of the energization bus bar to connect the second current sensor 12 to the first motor 400 will be simply referred to as the wire.

Note that the form of the energization bus bar is arbitrarily modified in correspondence with respective shapes of the inverter and the motor, and in correspondence with mounting form of the inverter and the motor in the vehicle and the like. Accordingly, the specific form of the energization bus bar is not limited to the above-described example. In correspondence with form of the energization bus bar, the respective forms of the electrical-conduction bus bar 30 in the wiring case 72 and the individual sensor 71 are arbitrarily modified. Especially, the form of the electrical-conduction bus bar 30 in the individual sensor 71 can be modified only by changing the respective shapes of the first exposed part 32 and the second exposed part 33. Accordingly, it is not necessary to modify the internal shape of the individual sensor 71. With this configuration, it is not necessary to change a production line of the individual sensor 71.

As shown in FIG. 20 and FIG. 21, the integrated housing 73 has a bottom wall 77 and a peripheral wall 78. The bottom wall 77 faces in the z direction. The planar shape of the bottom wall 77 is a rectangular shape with the x direction as a longitudinal direction.

The peripheral wall 78 rises in the z direction from an inner bottom surface 77a of the bottom wall 77 facing in the z direction. The peripheral wall 78 has a left wall 78a and a right wall 78b aligned in the x direction. The peripheral wall 78 has an upper wall 78c and a lower wall 78d aligned in the y direction. The left wall 78a, the upper wall 78c, the right wall 78b, and the lower wall 78d are connected in sequence in the circumferential direction about the z direction. With this configuration, the peripheral wall 78 forms a cylindrical shape having an opening in the z direction. The multiple individual sensors 71 can be housed in the storage space provided by the bottom wall 77 and the peripheral wall 78.

As shown in FIG. 18, the individual sensor 71 is inserted along the z direction into the storage space of the integrated housing 73. As shown in FIG. 19, the multiple individual sensors 71 are aligned in the x direction in the storage space.

Similarly to the first current sensor 11, the multiple individual sensors 71 each have the first shield 41 and the second shield 42. The first shield 41 and the second shield 42 are opposed to and away from each other in the x direction. Accordingly, in the storage space, the first shields 41 and the second shields 42 of the multiple individual sensors are alternately aligned.

As shown in FIG. 16, the first exposed part 32 and the second exposed part 33 extend in the y direction from the sensor housing 50 of the individual sensor 71. The upper wall 78c of the integrated housing 73 is formed with slits 78e for allowing the ends of the first exposed parts 32 of the sensor housings 50 of the individual sensors 71 accommodated in the storage space to be placed outside of the storage space. The slits 78e are each formed along the z direction from the apical surface of the upper wall 78c toward the bottom wall 77.

In the stats where the individual sensor 71 is accommodated in the integrated housing 73, the end of the first exposed part 32 of the individual sensor 71 is positioned via the slit 78e on the outside of the storage space. The end of the first exposed part 32 is electrically connected to the above-described conductive plate by laser welding or the like.

Further, a conductive terminal 79 is insert-molded in the bottom wall 77 of the integrated housing 73. As shown in (b) of FIG. 20 and (b) of FIG. 21, a part of the conductive terminal 79 is exposed from the inner bottom surface 77a of the bottom wall 77.

In the state where the individual sensor 71 is accommodated in the integrated housing 73, the second exposed part 33 of the individual sensor 71 is opposed to the part of the conductive terminal 79 exposed from the inner bottom surface 77a. The second exposed part 33 and the conductive terminal 79 are electrically connected to each other by laser welding or the like.

Further, the integrated housing 73 has a terminal block 80 to support the multiple conductive terminals 79. The terminal block 80 is formed integrally with the lower wall 78d adjacent to the bottom wall 77. The terminal block 80 has a rectangular parallelepiped shape extending in the x direction. The multiple conductive terminals 79 are insert-molded also in the terminal block 80. The multiple conductive terminals 79 are partly exposed from the terminal block 80. The part of the conductive terminal 79 exposed from the terminal block 80 extends away from the terminal block 80 in the z direction. The part of the conductive terminal 79 exposed from the terminal block 80 opposes the lower wall 78d in the y direction. The parts of the multiple conductive terminals 79 exposed from the terminal block 80 are aligned with each other across spaces in the x direction.

The part of the conductive terminal 79 exposed from the terminal block 80 has a flat shape in which the thickness in the y direction is thin. The part of the conductive terminal 79 exposed from the terminal block 80 has an energization surface 79a facing in the y direction and its rear surface 79b. In the conductive terminal 79, a bolt hole 79c is formed to pass through from the energization surface 79a to the rear surface 79b in the y direction.

Further, the rear surface 79b of the conductive terminal 79 is provided with a nut 81 opened in the y direction. The opening of the nut 81 and the opening of the bolt hole 79c are aligned in the y direction.

A terminal of the wire is disposed on the energization surface 79a of the conductive terminal 79. The terminal of the wire also has a bolt hole penetrating in the y direction. In the terminal of the wire, the surface on which the bolt hole is formed is opposed to the energization surface 79a of the conductive terminal 79. In this state, a bolt shaft (not illustrated) is inserted through the bolt holes of the conductive terminal 79 and the terminal of the wire. Then, the end of the bolt shaft is fastened to the nut 81. The bolt is fastened to the nut 81 from the end of the bolt shaft toward a bolt head. The conductive terminal 79 and the terminal of the wire are held between the bolt head and the nut 81. With this configuration, the terminal of the wire and the conductive terminal 79 are brought into contact and electrically and mechanically connected to each other. As described above, the second exposed part 33 of the individual sensor 71 and the wire terminal are electrically connected to each other via the conductive terminal 79.

The connection terminal 60 extends from the sensor housing 50 of the individual sensor 71 in the z direction. An insertion hole for allowing the one end of the connection terminal 60 to be placed on the outside of the storage space is formed in the bottom wall 77 of the integrated housing 73. The insertion hole is formed to pass through from the inner bottom surface 77a of the bottom wall 77 to an outer bottom surface 77b on the rear side of the inner bottom surface 77a. The one end of the connection terminal 60 protrudes, away from the outer bottom surface 77b via the insertion hole, to the outside of the storage space. Since the insertion hole is a minute hole, it is not shown in the figure.

The terminal housing 74 is aligned with the integrated housing 73 in the x direction. The terminal housing 74 is connected integrally with the left wall 78a of the integrated housing 73. The terminal housing 74 extends in the z direction. The terminal housing 74 has an upper surface 74a and a lower surface 74b aligned in the z direction.

The multiple energization terminals 75 insert-molded in the terminal housing 74 extend in the z direction. One end of the energization terminal 75 projects from the lower surface 74b of the terminal housing 74. The other end of the energization terminal 75 projects from the upper surface 74a of the terminal housing 74.

As shown in (a) and (c) of FIG. 20, the outer bottom surface 77b of the bottom wall 77 of the integrated housing 73 and the lower surface 74b of the terminal housing 74 continuous each other in the x direction and the y direction. The integrated wiring board 76 is provided on the outer bottom surface 77b and the lower surface 74b, which are continuous to each other.

The integrated wiring board 76 has a flat shape in which the thickness in the z direction is thin. The integrated wiring board 76 has a mounting surface 76a facing in the z direction and a rear surface 76b. The integrated wiring board 76 is fixed, in a state where the mounting surface 76a opposes respectively to the outer bottom surface 77b and the lower surface 74b in the z direction, to the integrated housing 73 and the terminal housing 74.

As described above, the one end of the energization terminal 75 projects from the lower surface 74b. The one end of the connection terminal 60 projects from the outer bottom surface 77b. On the other hand, a first through hole 76c is formed in the integrated wiring board 76 to receive the one end of the energization terminal 75. A second through hole 76d is formed in the integrated wiring board 76 to receive the one end of the connection terminal 60. The first through hole 76c and the second through hole 76d penetrate the integrated wiring board 76 from the mounting surface 76a to the rear surface 76b in the z direction. Further, a wiring pattern which electrically connects the first through hole 76c to the second through hole 76d is formed on the integrated wiring board 76.

The integrated wiring board 76 is arranged on the outer bottom surface 77b and the lower surface 74b such that the one end of the energization terminal 75 is inserted into the first through hole 76c. Then, the first through hole 76c and the energization terminal 75 are electrically connected to each other via solder or the like.

The individual sensor 71 is arranged in the storage space such that the one end of the connection terminal 60 is inserted through the insertion hole of the bottom wall 77 and the second through hole 76d. Then, the second through hole 76d and the connection terminal 60 are electrically connected to each other via solder or the like. As described above, the connection terminal 60 of the individual sensor 71 is electrically connected via the second through hole 76d, the wiring pattern on the integrated wiring board 76, and the first through hole 76c, to the energization terminal 75.

The wiring case 72 has multiple flanges 82 for mounting the second current sensor 12 in the vehicle. The multiple flanges 82a each have a bolt hole 82a for bolt-fixing the second current sensor 12 to the vehicle.

The wiring case 72 of the present embodiment has three flanges 82. One of the three flanges 82 is formed on the bottom wall 77 adjacent to the right wall 78b. One of the remaining two flanges 82 is formed on the terminal housing 74 adjacent to the lower wall 78d. This flange 82 is connected integrally with the terminal block 80. The remaining one flange 82 is formed on the opposite side to the connection part of the terminal housing 74 to the integrated housing 73.

As described above, the two of the three flanges 82 are aligned via the integrated housing 73 and the terminal housing 74 in the x direction. The remaining one flange 82 is away from the two flanges 82 that are aligned in the x direction, in the y direction. In this manner, the three flanges 82 form apexes of a triangle.

As described above, the one end of the connection terminal 60 projects from the outer bottom surface 77b, and the one end of the energization terminal 75 projects from the lower surface 74b. Further, the integrated wiring board 76 is disposed on the outer bottom surface 77b and the lower surface 74b. To avoid contacts with the vehicle of the one end of the connection terminal 60, the one end of the energization terminal 75, and the integrated wiring board 76, the three flanges 82 each have a leg 83 extending in the z direction. In the state where the second current sensor 12 is mounted in the vehicle, the one end of the connection terminal 60, the one end of the energization terminal 75, and the integrated wiring board 76 are separated from the vehicle, with the legs 83, in the z direction.

<Advantageous Effects of Current Sensor>

Next, the advantageous effects of the current sensor according to the present embodiment will be described. As described above, the first current sensor 11 and the individual sensor 71 of the second current sensor 12 and third current sensor 13 have equivalent configurations. Accordingly, the respective sensors achieve the similar advantageous effects. In the following description, to avoid complications, the first current sensor 11 and the individual sensor 71 are not discriminated but merely referred to as a current sensor. The degradation of detection accuracy to detect the current is suppressed with the following various advantageous effects.

<Magnetic Saturation of Shield>

As described above, in the first opposite end part 41e of the first shield 41, the length in the x direction is shorter than that of the first center part 41d. Accordingly, entrance of magnetic field into the first opposite end part 41e is suppressed. The permeation of magnetic field through the portions of the first center part 41d, directly connected to and aligned with the first opposite end part 41e in the y direction (parallel portions), from one to the other of the two ends of the first both end part 41e, is suppressed. As a result, magnetic saturation in the parallel portions of the first center part 41d is suppressed. Leakage of electromagnetic noise from the first center part 41d is suppressed.

Figure 24:
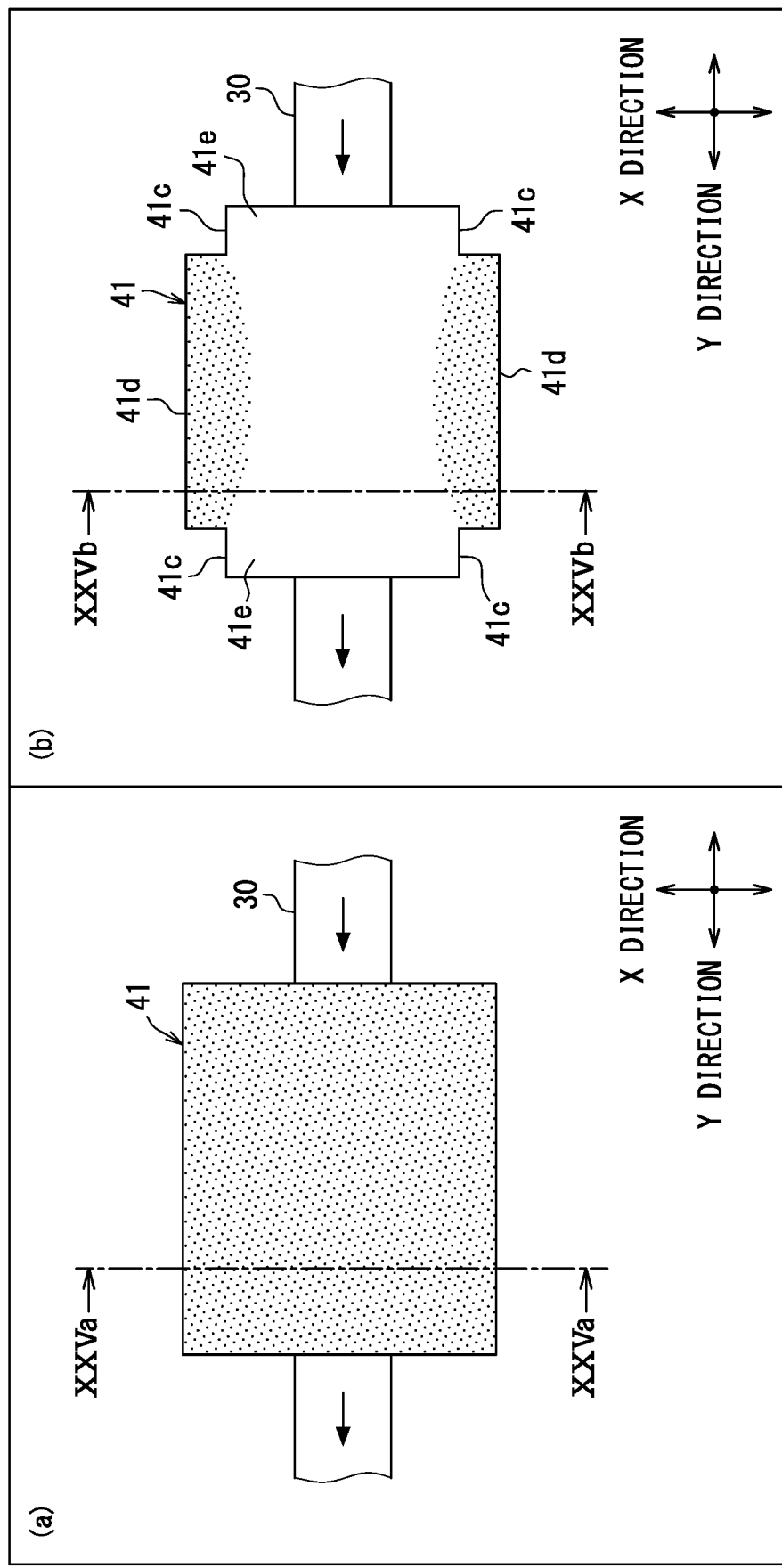
FIG. 24 illustrates diagrams for explaining magnetic saturation of the first shield.

FIG. 24 shows, by schematically hatching, a region of the first shield 41 easily magnetically saturated by magnetic field permeation. In FIG. 24, (a) schematically shows the magnetic saturation occurring in the first shield without notch as a comparative configuration; and (b) schematically shows a magnetically saturated region of the first shield 41 according to the present embodiment. In FIG. 24, a bold solid arrow indicates a current which flows through the electrical-conduction bus bar 30.

As shown in the figure, in the first shield without notch, magnetic saturation uniformly and easily occurs. On the other hand, in the first shield 41 in which the notches 41c are formed, even when magnetic saturation occurs in a region other than the parallel portions of the first center part 41d, the occurrence of magnetic saturation is suppressed in the parallel portions.

Figure 25:
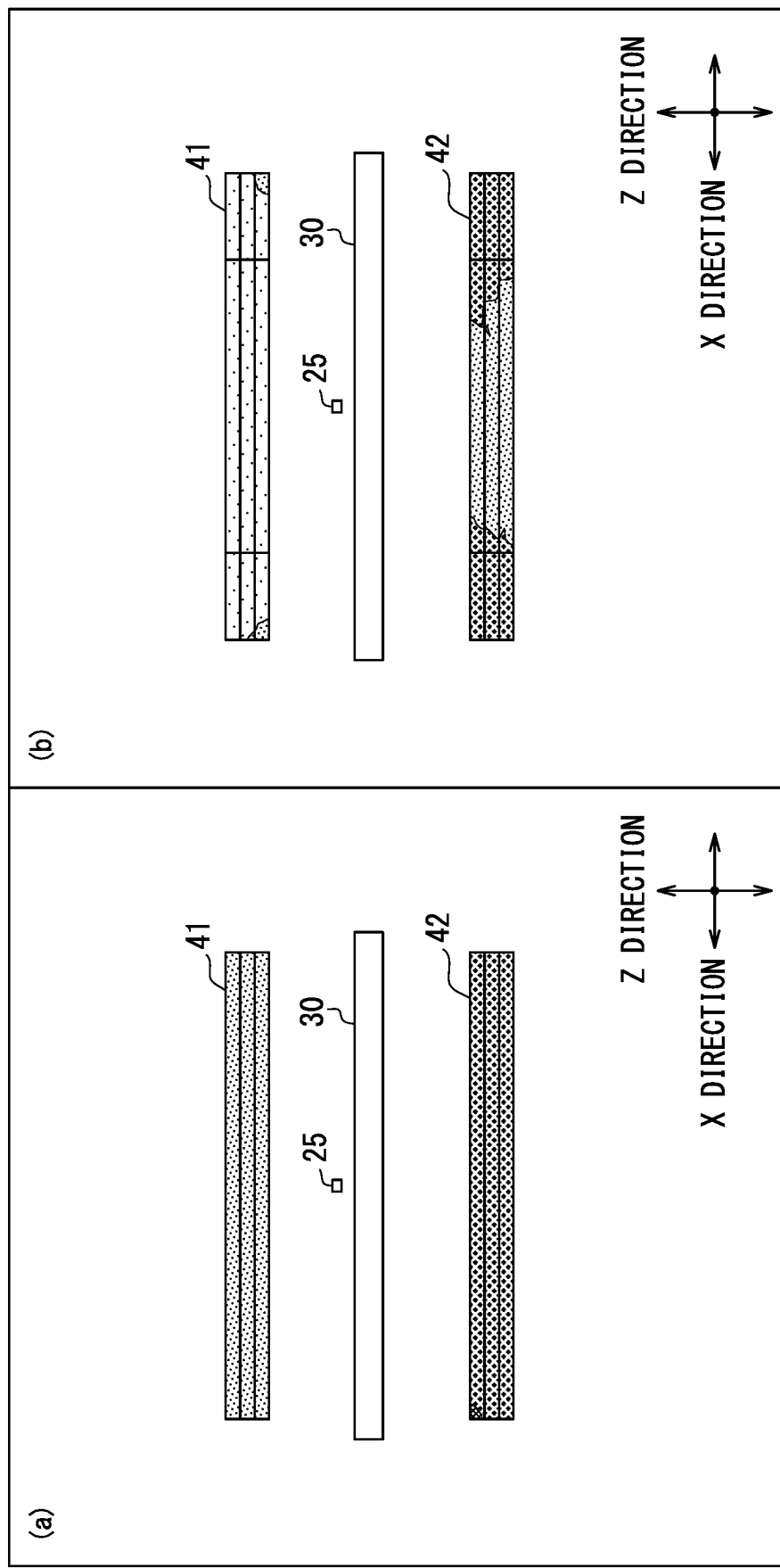
FIG. 25 illustrates diagrams showing a result of magnetic saturation simulation.

FIG. 25 shows a simulation result of distribution of the magnetic field which permeates the shield. In FIG. 25, (a) shows the magnetic field distribution in a cross section along an XXVa-XXVa line shown in FIG. 24; and (b) shows the magnetic field distribution in a cross section along an XXVb-XXVb line shown in FIG. 24.

Note that in FIG. 25, (a) shows a simulation result when the first shield 41 and the second shield 42 each have a rectangular shape; and (b) shows a simulation result when the notches 41c are formed in the first shield 41 and the second shield 42. The intensity of the magnetic field is expressed with coarseness/fineness of hatching. As the coarseness of the hatching is increased, the intensity of the magnetic field becomes lower, while as the fineness of the hatching is increased, the intensity of the magnetic field becomes higher.

As it is obvious from the simulation result, when the notch 41c is omitted, the magnetic field distributions in the first shield and the second shield are uniform. The intensities of the respective entire magnetic fields in the first shield and the second shield are high. On the other hand, when the notches 41c are formed, the intensities of the respective entire magnetic fields in the first shield and the second shield are low. Especially, the intensities of magnetic field distributions in the respective parallel portions in the first center part 41d and the second center part 42d are low. With this configuration, the leakage of the electromagnetic noise from the first center part 41d and the second center part 42d by the magnetic saturation is suppressed.

Note that as shown in FIG. 25, the intensities of the respective magnetic field distributions in the first shield 41 and the second shield 42 are different. The difference is caused since the distance between the first shield 41 and the electrical-conduction bus bar 30 and the distance between the second shield 42 and the electrical-conduction bus bar 30 are different. In both of the magnetic field distributions, the intensity is low in the parallel portions, while the intensity is high in the other region than the parallel portions.

The parallel portions of the first center part 41d where the magnetic saturation is suppressed, and the first sensing unit 21 and the second sensing unit mounted on the wiring board 20, are aligned in the z direction. Accordingly, the input of the electromagnetic noise, leaked by the magnetic saturation in the first center part 41d, into the magnetoelectric converter 25 of the first sensing unit 21 and the second sensing unit 22, is suppressed.

<Misalignment of Shield>

The first shield 41 is mounted on the shield support pin 57a, and fixed via the shield adhesive 57e to the shield adhesion pin 57b. The second shield 42 is mounted on the shield support pin 57a, and fixed via the shield adhesive 57e to the base 51.

With this configuration, the misalignment of the first shield 41 and the misalignment of the second shield 42 respectively with respect to the sensor housing 50 do not depend on the shape variation of the shield adhesive 57e having fluidity upon the adhesion fixing any longer. The misalignment of the first shield 41 and the misalignment of the second shield 42 respectively with respect to the sensor housing 50 are caused by the manufacturing error of the sensor housing 50. It is possible to shift the factor of the misalignment of the first shield 41 and the misalignment of the second shield 42 respectively with respect to the wiring board 20 fixed to the sensor housing 50 to the manufacturing error of the sensor housing 50. As a result, it is possible to suppress reduction of input suppression of electromagnetic noise caused by the first shield 41 and the second shield 42 into the magnetoelectric converter 25.

The temperature of the shield adhesive 57e upon the adhesion fixing of the first shield 41 and the second shield 42 respectively to the sensor housing 50 is set to be higher than the temperature of the environment where the current sensor is provided. The shield adhesive 57e is cooled down to the room temperature and is thus solidified. With this configuration, in the shield adhesive 57e, a residual stress condensing to its own center occurs at the temperature of the environment where the first current sensor is provided. The contact state between the first shield 41 and the shield support pin 57a and the contact status between the second shield 42 and the shield support pin 57a are respectively maintained.

With this configuration, the displacement of the first shield 41 and the displacement of the second shield 42 respectively with respect to the sensor housing 50 in the z direction are suppressed. In other words, the displacement of the first shield 41 and the displacement of the second shield 42 respectively with respect to the wiring board 20 fixed to the sensor housing 50 in the z direction are suppressed. With this configuration, the reduction of input suppression of electromagnetic noise, cased in the first shield 41 and the second shield 42 into the magnetoelectric converter 25, is suppressed.

<Misalignment of Wiring Board>

The wiring board 20 is mounted on the board support pin 56a and is fixed via the board adhesive 56e to the board adhesion pin 56b.

With this configuration, the misalignment of the wiring board 20 with respect to the sensor housing 50 does not depend on the shape variation of the board adhesive 56e having fluidity upon the adhesion fixing any longer. The misalignment of the wiring board 20 with respect to the sensor housing 50 is caused by the manufacturing error of the sensor housing 50. It is possible to shift the factor of the misalignment of the wiring board 20 with respect to the electrical-conduction bus bar 30 fixed to the sensor housing 50 to the manufacturing error of the sensor housing 50. As a result, the variation of the measurement current which permeates the magnetoelectric converter 25 mounted on the wiring board 20 is suppressed.

The temperature of the board adhesive 56e upon the adhesion fixing of the wiring board 20 to the sensor housing 50 is set to be higher than the temperature of the environment where the current sensor is provided. The board adhesive 56e is cooled down to the room temperature and is thus solidified. With this configuration, in the board adhesive 56e, a residual stress condensing to its own center occurs at the temperature of the environment where the current sensor is provided. The contact status between the wiring board 20 and the board support pin 56a is maintained with the residual stress.

With this configuration, the displacement of the wiring board 20 with respect to the sensor housing 50 in the z direction is suppressed. In other words, the displacement of the wiring board 20 with respect to the electrical-conduction bus bar 30 fixed to the sensor housing 50 in the z direction is suppressed. With this configuration, the variation of the measurement current which permeates the magnetoelectric converter 25 mounted on the wiring board 20 is suppressed.

<Manufacturing Error of Wiring Board>

The first sensing unit 21 and the second sensing unit 22 are provided on the opposing surface 20a of the wiring board 20 with respect to the electrical-conduction bus bar 30. With this configuration, the distances between the first sensing unit 21 and the electrical-conduction bus bar 30 and between the second sensing unit 22 and the electrical-conduction bus bar 30 in the z direction do not depend on the thickness of the wiring board 20 in the z direction any longer. The variation of the distances between the sensing units and the electrical-conduction bus bar 30 in the z direction, due to the manufacturing error of the thickness of the wiring board 20 in the z direction, is suppressed.

<Separation of Wiring Case and Individual Sensor>

In a case where an electrical-conduction bus bar is fixed to a housing made of an insulating resin material, misalignment occurs in the bus bar with respect to the housing due to a manufacturing error of the housing or time deterioration such as creep of the housing. The larger the physical constitution of the housing is, the larger the misalignment is.

As described above, the second current sensor 12 and the third current sensor 13 have the integrated housing 73, the physical constitution of which is larger than that of the sensor housing 50 of the current sensor (individual sensor 71). The current sensor is accommodated in the integrated housing 73. The electrical-conduction bus bar 30 is fixed, not to the integrated housing 73 having the large physical constitution, but to the sensor housing 50. The magnetoelectric converter 25 detects the current which flows through the electrical-conduction bus bar 30.

According to the configuration, the occurrence of relative misalignment between the electrical-conduction bus bar 30 and the magnetoelectric converter 25, due to the above-described manufacturing error of the housing or time deterioration such as creep of the housing, is suppressed.

Second Embodiment

Next, a second embodiment will be described with reference to FIG. 26 and FIG. 27. The current sensors of the following respective embodiments have many points common to the above-described embodiment. Accordingly, in the following descriptions, explanation of the common parts will be omitted, and the differences will be mainly explained. Further, in the following descriptions, the constituent elements the same as the constituent elements shown in the above-described embodiment will have the same reference numerals.

<Extending Part at Both Ends>

In the first embodiment, the example where the second shield 42 has the extending parts 42c, which extends in the z direction, at the two sides 42f aligned in the x direction and adjacent to the second center part 42d has been shown. In the present embodiment, as shown in FIG. 26, in the second shield 42, the extending parts 42c are formed at the two sides 42f and adjacent to second opposite end parts 42e. In FIG. 26, (a) is a perspective view for explaining the arrangement of the shield, the magnetoelectric converter, and the electrical-conduction bus bar; and (b) is a side view for explaining the arrangement of the shield, magnetoelectric converter, and the electrical-conduction bus bar.

With this configuration, the magnetoelectric field entered the second shield 42 easily permeates via the extending parts 42c formed at the second opposite end parts 42e in the first shield 41. As schematically shown in FIG. 27, in the first shield 41, the permeation pathway is adjacent to the first opposite end parts 41e. Similarly, the permeation pathway of the magnetic field in the second shield 42 is adjacent to the second opposite end parts 42e.

Figure 27:
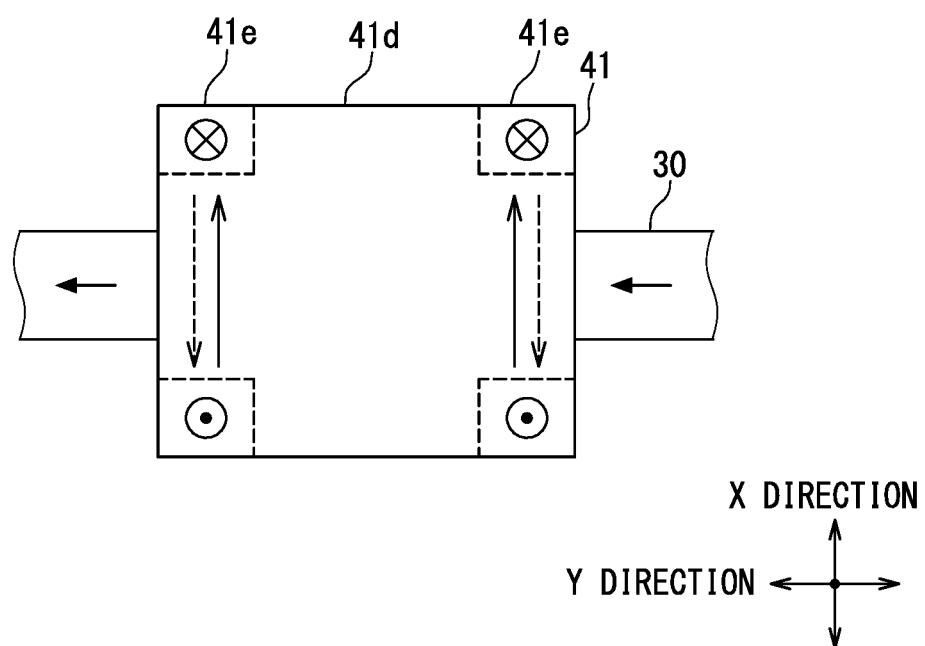
FIG. 27 is a schematic diagram for explaining a magnetic field to transmit a shield.

In FIG. 27, a bold solid arrow indicates the current which flows through the electrical-conduction bus bar 30; a solid arrow indicates the magnetic field which permeates the first shield 41; and a broken arrow indicates the magnetic field which permeates the second shield 42. In the figure, an enclosed middle dot symbol indicates the magnetic field which directs from the second shield 42 toward the first shield 41 in the z direction; and an enclosed cross symbol indicates the magnetic field which directs from the first shield 41 toward the second shield 42 in the z direction.

Accordingly, the electromagnetic noise entered the second shield 42 hardly flows via the second center part 42d to the first shield 41. Similarly, the electromagnetic noise entered the first shield 41 hardly permeates via the first center part 41d to the second shield 42.

The second center part 42d and the first center part 41d are hardly magnetically saturated respectively. As a result, the leakage of the magnetic field respectively from the second center part 42d and the first center part 41d due to magnetic saturation is suppressed.

Figure 26:
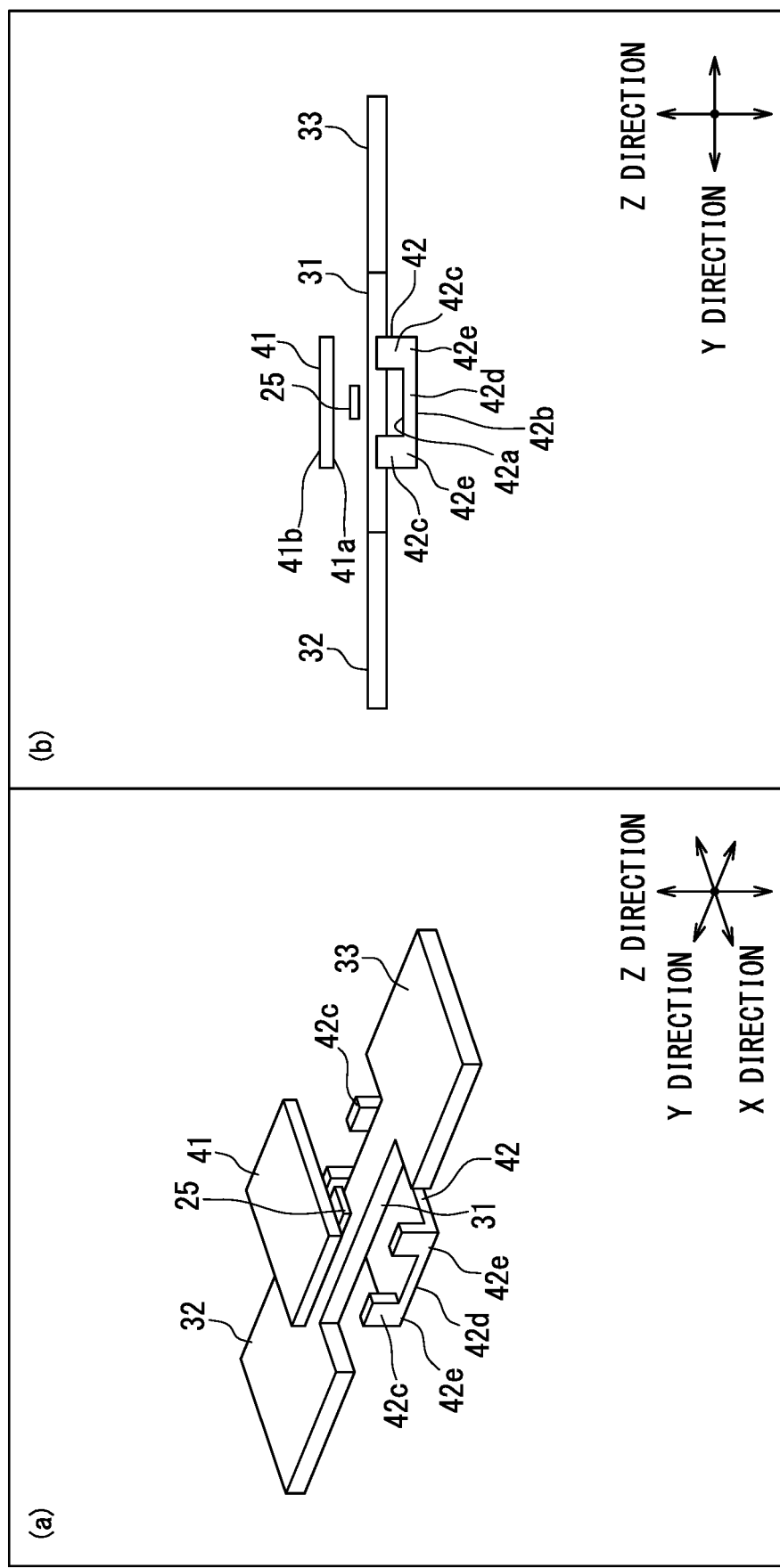
FIG. 26 illustrates diagrams for explaining the second shield according to a second embodiment.

Further, as clearly indicated in (b) of FIG. 26, the magnetoelectric converters 25 of the first sensing unit 21 and the second sensing unit 22 are positioned between the two extending parts 42c in the y direction. That is, the magnetoelectric converters 25 are positioned between the second center part 42d and the first center part 41d in the z direction. Accordingly, input of the magnetic field, leaked respectively due to magnetic saturation of the second center part 42d and the first center part 41d, into the magnetoelectric converters 25, is suppressed. As a result, the degradation of accuracy in the measurement current detection is suppressed.

In the present embodiment, the example where the extending part 42c is formed respectively on the second opposite end parts 42e of the two sides 42f of the second shield 42 has been shown. However, as shown in (a) of FIG. 28, for example, a configuration where the extending part 42c is also formed on the second center part 42d of the two sides 42f of the second shield 42 may be employed. Note that in the extending part 42c formed on the second center part 42d, the length in the z direction is shorter than that of the extending part 42c formed on the second opposite end parts 42e. With this configuration, the magnetic field entered the shield 40 permeates the end part more easily than the center part.

Figure 28:
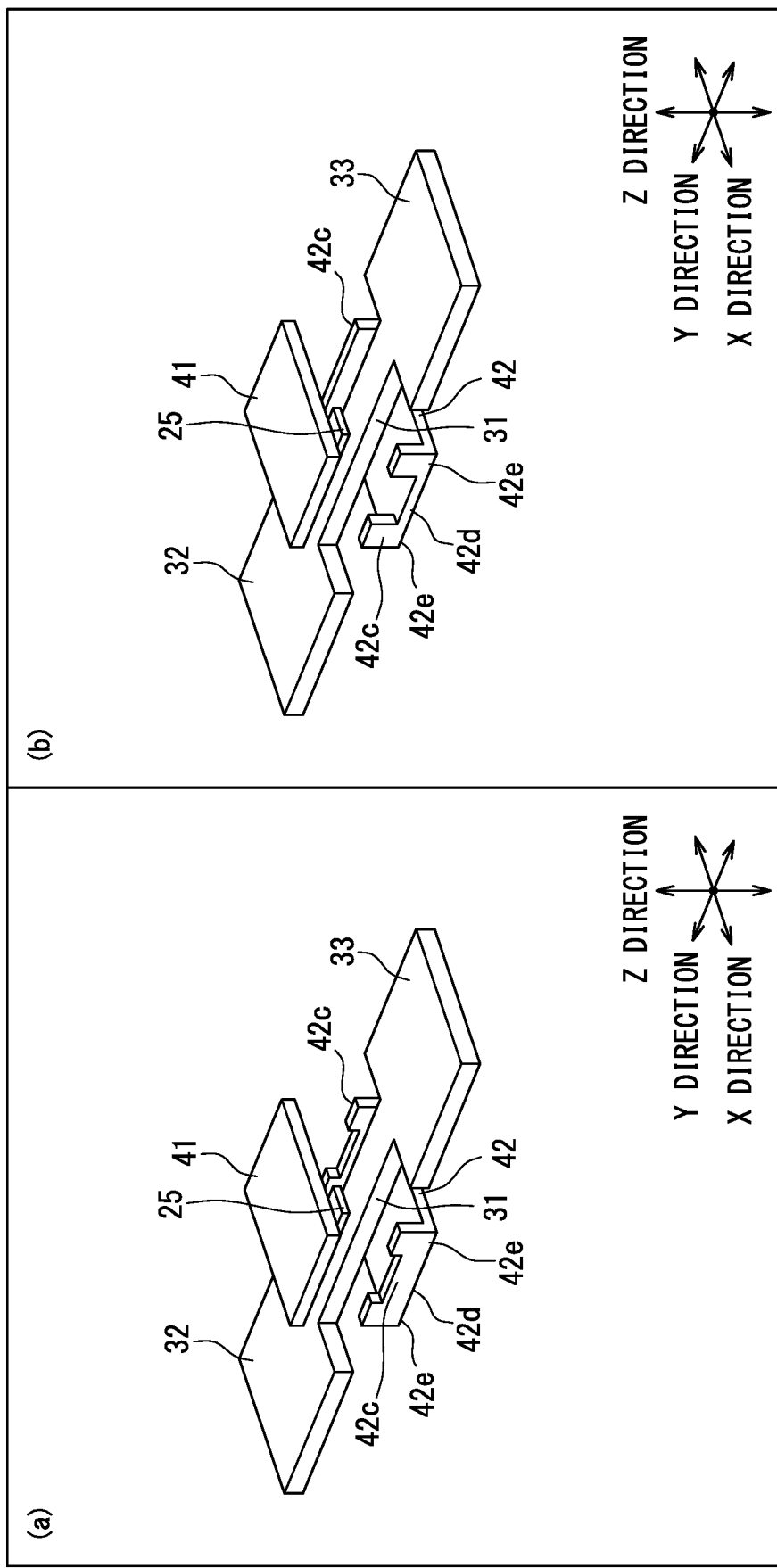
FIG. 28 illustrates diagrams showing a modification of the shield.

Further, as shown in (b) of FIG. 28, a configuration where the extending part 42c is formed on the second opposite end parts 42e of one of the two sides 42f, and the extending part 42c is formed on the second opposite end parts 42e and the second center part 42d of the other one of the two sides 42f, may be employed. Note that in the other one of the two sides 42f, the lengths of the extending parts 42c, formed on the second opposite end parts 42e and the second center part 42d, in the z direction, are the same. With this configuration, the magnetic field entered the shield 40 also permeates the end part more easily than the center part. In FIG. 28, (a) and (b) shows a perspective view for explaining the arrangement of the shield, the magnetoelectric converter, and the electrical-conduction bus bar.

Figure 29:
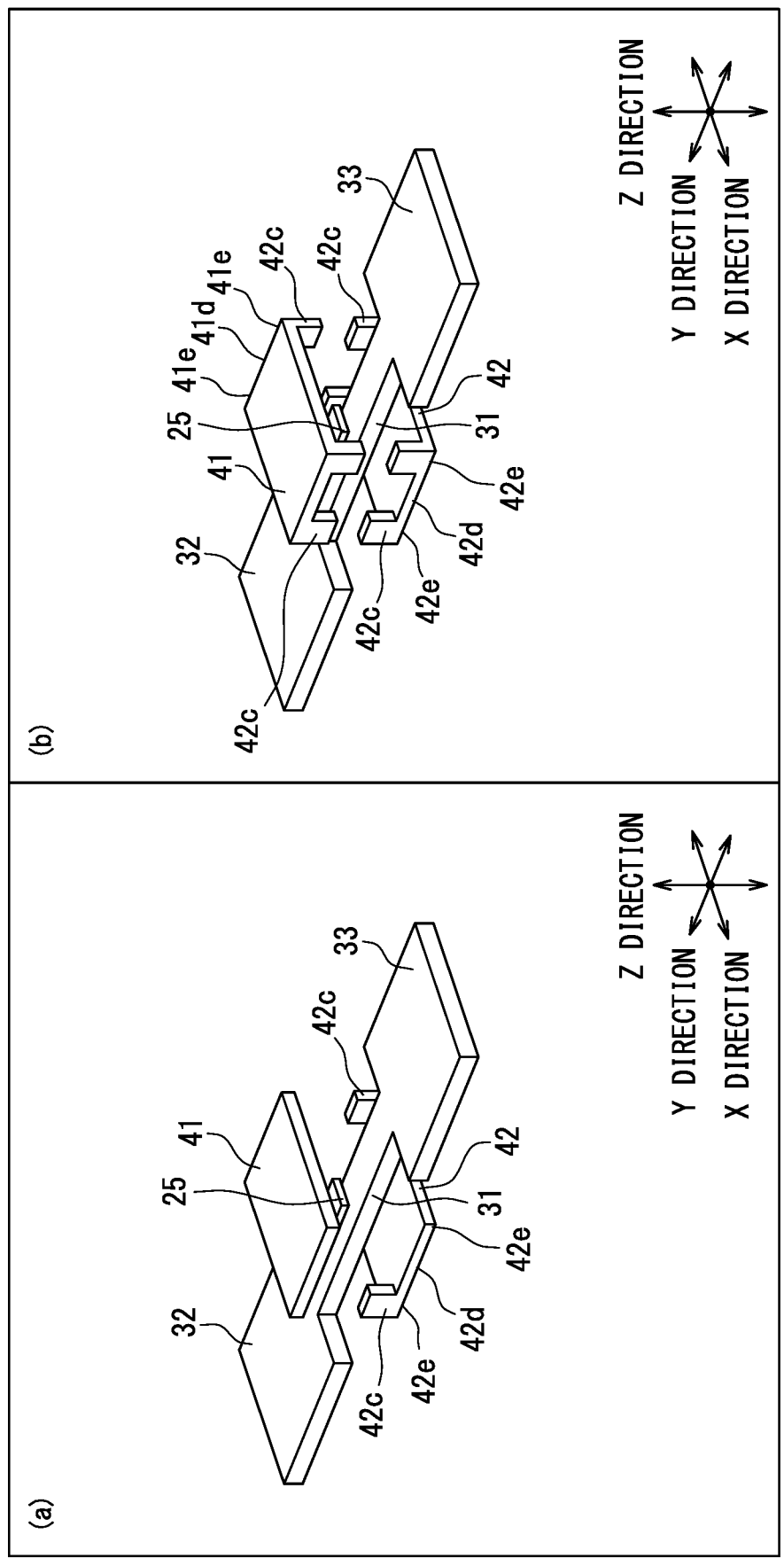
FIG. 29 illustrates diagrams showing another modification of the shield.

Further, as shown in (a) of FIG. 29, a configuration where the extending part 42c is formed on one of the two second opposite end parts 42e of one of the two sides 42f, and on the other one of the two second opposite end parts 42e of the other one of the two sides 42f, may be employed. The extending part 42c formed on one of the two sides 42f and the extending part 42c formed on the other one of the two sides 42f are away from each other respectively in the y direction and in the x direction.

Further, a configuration where the extending part 42c is formed on the first shield 41 in addition to the second shield 42 may be employed. The first shield 41 has two opposing sides 41f aligned in the x direction. For example, as shown in (b) of FIG. 29, a configuration where the extending parts 42c are formed on the first opposite end parts 41e of the two opposing sides 41f in the first shield 41 may be employed. In FIG. 29, (a) and (b) show a perspective view for explaining the arrangement of the shield, magnetoelectric converter, and the electrical-conduction bus bar.

As the form of the extending part 42c which can be formed on the first shield 41, a form equivalent to the extending part 42c formed on the second shield 42 shown above may be employed. The extending part 42c formed on the first shield 41 corresponds to an extension part.

Note that the current sensor according to the present embodiment and the following embodiments include constituent elements equivalent to the constituent elements of the current sensor described in the first embodiment. Therefore, it goes without saying that the current sensor according to the present embodiment and the following embodiments achieve the similar advantageous effects.

Third Embodiment

Figure 30:
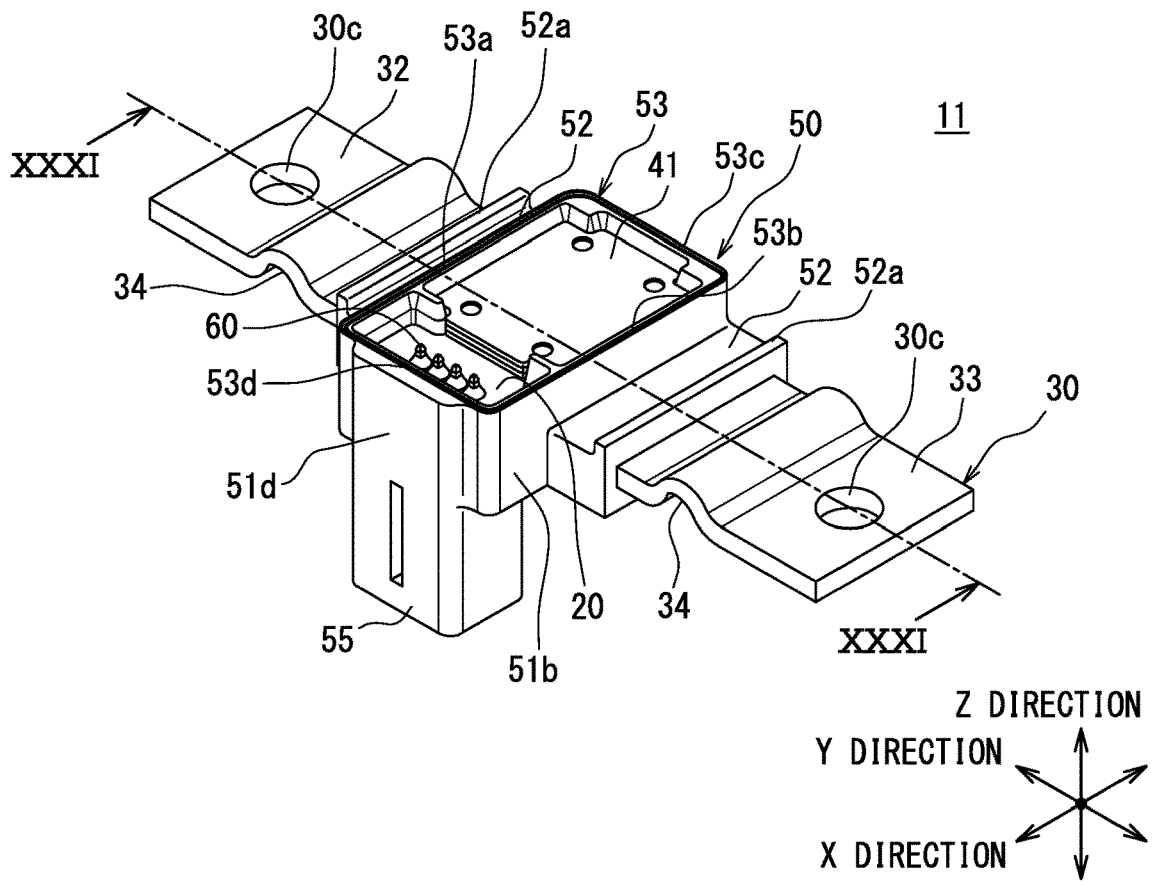
FIG. 30 is a perspective view of a first current sensor according to a third embodiment.

Next, a third embodiment will be described based on FIG. 30 to FIG. 32.

<Stress Relaxation Member>

In the present embodiment, a stress relaxation member 34 is formed in the electrical-conduction bus bar 30 of the first current sensor 11. The stress relaxation member 34 is formed in the first exposed part 32 and the second exposed part 33 of the electrical-conduction bus bar 30.

As described above, the electrical-conduction bus bar 30 has the covered part 31 covered with the sensor housing 50. The first exposed part 32 and the second exposed part 33 are respectively exposed from the sensor housing 50, and connected integrally with the covered part 31. The bolt hole 30c for electrical and mechanical connection with the energization bus bar 307 via the bolt is formed respectively in the first exposed part 32 and the second exposed part 33. The stress relaxation member 34 is formed respectively in the connection parts between the first exposed part 32 and the covered part 31 and between the second exposed part 33 and the covered part 31, and in the connection parts between the first exposed part 32 and the forming part of the bolt hole 30c and between the second exposed part 33 and the forming part of the bolt hole 30c.

Figure 31:
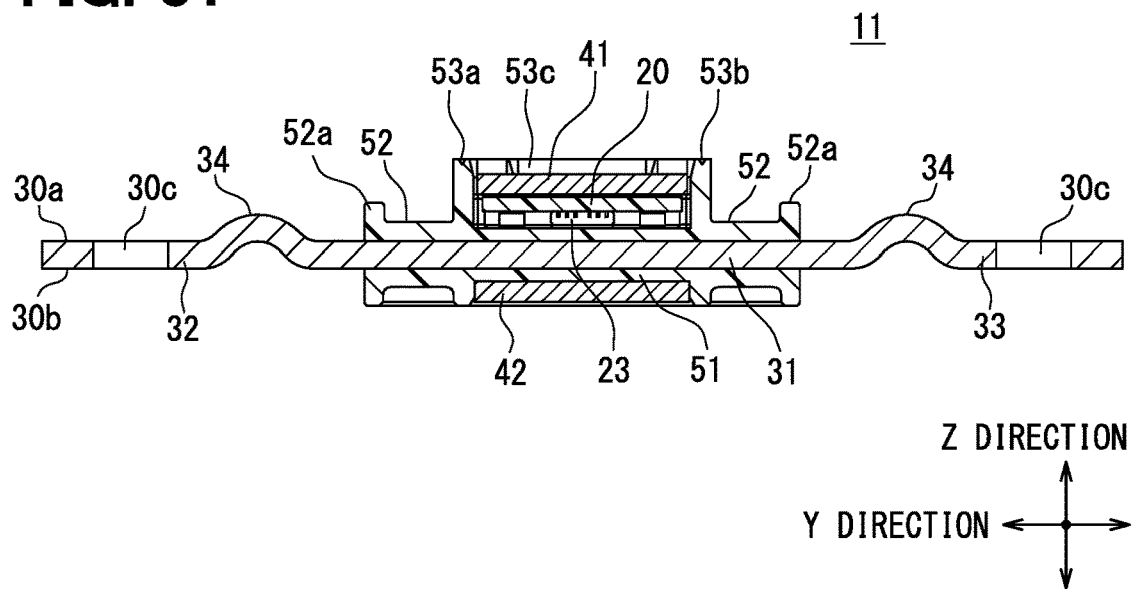
FIG. 31 is a cross-sectional view along a line XXXI-XXXI shown in FIG. 30.

As shown in FIG. 31, the stress relaxation member 34 is locally bent from the rear surface 30b of the electrical-conduction bus bar 30 toward the front surface 30a. With this bending, the stress relaxation member 34 is elastically deformable by bending with respect to a force in the z direction applied to the electrical-conduction bus bar 30. In FIG. 31, the stress relaxation member 34 is bent like a weaving at once. The number of times of waving and the bending form are not limited to the above described example.

As described above, the electrical-conduction bus bar 30 is bolt-fixed to the energization bus bar 307. The energization bus bar 307 of the present embodiment corresponds to a first terminal block 307a and a second terminal block 307b shown in FIG. 32. The electrical-conduction bus bar 30 is bolt-fixed to the first terminal block 307a and the second terminal block 307b. With this configuration, the first terminal block 307a and the second terminal block 307b are bridged with the energization bus bar 307. The first terminal block 307a and the second terminal block 307b are electrically connected to each other via the energization bus bar 307. Note that in the following description, as shown in FIG. 32, the bolt inserted through the bolt hole 30c of the electrical-conduction bus bar 30 is denoted by a reference numeral 307c. The first terminal block 307a and the second terminal block 307b correspond to an external energization unit.

The first terminal block 307a has a first mounting surface 307d facing in the z direction. Similarly, the second terminal block 307b has a second mounting surface 307e facing in the z direction. A fastening hole 307f for fastening the shaft of the bolt 307c is formed in each of the first mounting surface 307d and the second mounting surface 307e. The fastening holes 307f are opened in the first mounting surface 307d and the second mounting surface 307e. The fastening hole 307f extends in the z direction. In FIG. 32, (a) shows a case where the positions of the first mounting surface and the second mounting surface in the z direction correspond with each other; and (b) shows a case where the positions of the first mounting surface and the second mounting surface in the z direction do not correspond with each other.

The rear surface 30b of the first exposed part 32 opposes to the first mounting surface 307d in the z direction. The rear surface 30b of the second exposed part 33 opposes to the second mounting surface 307e in the z direction. In this state, the first current sensor 11 is provided on the first terminal block 307a and the second terminal block 307b.

Figure 32:
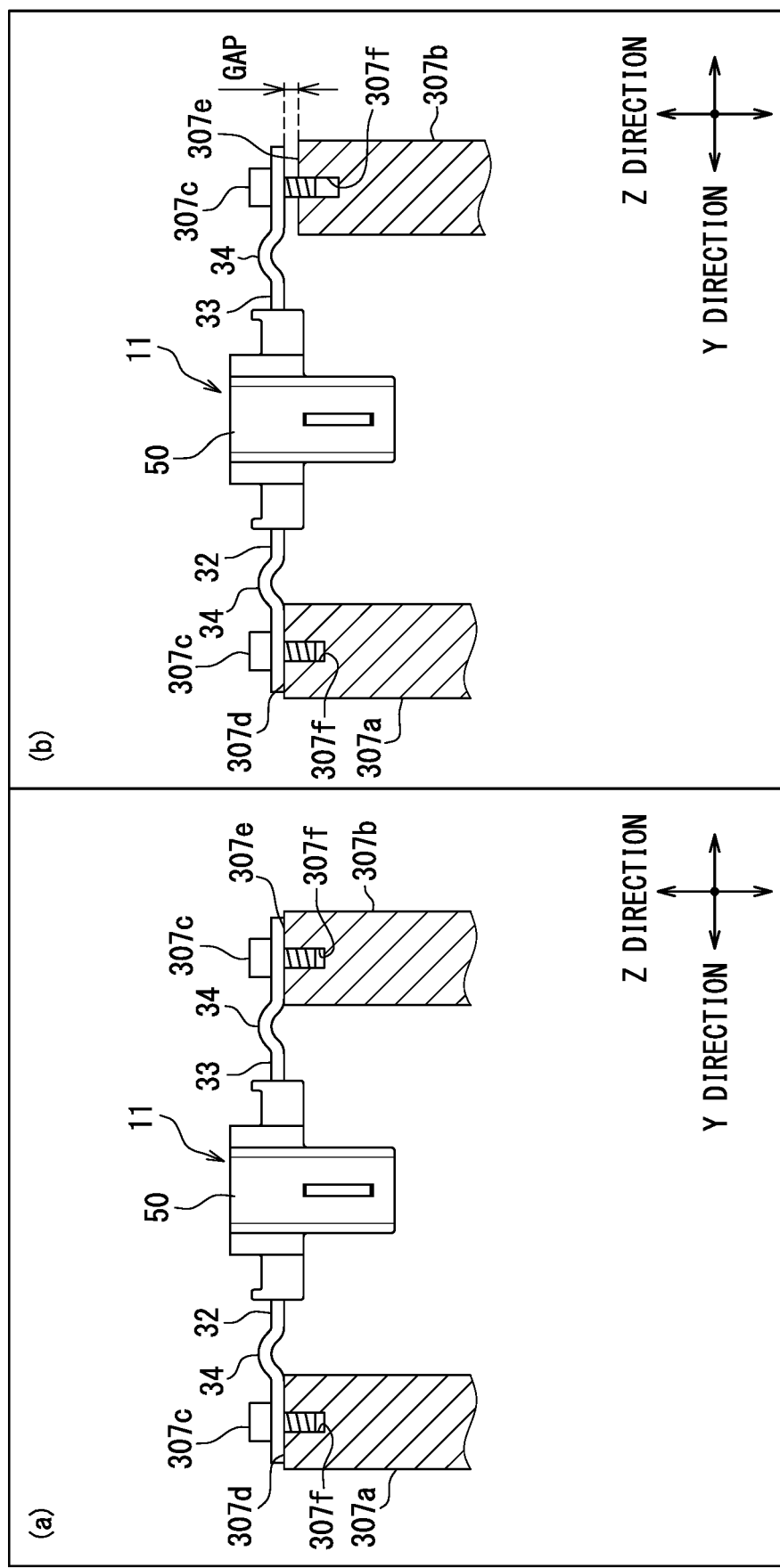
FIG. 32 illustrates diagrams for explaining a fixing form of the first current sensor.

As shown in (a) of FIG. 32, when the positions of the first mounting surface 307d and the second mounting surface 307e in the z direction correspond with each other, the rear surface 30b of the first exposed part 32 is in contact with the first mounting surface 307d, and the rear surface 30b of the second exposed part 33 is in contact with the second mounting surface 307e. In this contact state, the end of the shaft of the bolt 307c is inserted into the bolt hole 30c of the electrical-conduction bus bar 30 and the fastening hole 307f of the terminal block along the z direction. Then, the bolt 307c is fastened to the terminal block so as to bring the head of the bolt 307c closer to the first mounting surface 307d (second mounting surface 307e). The first exposed part 32 and the second exposed part 33 are held between the head of the bolt 307c and the terminal block. With is configuration, the first current sensor 11 is mechanically and electrically connected to the terminal block.

On the other hand, as shown in (b) of FIG. 32, when the positions of the first mounting surface 307d and the second mounting surface 307e in the z direction do not correspond with each other, upon contact between the rear surface 30b of the first exposed part 32 and the first mounting surface 307d, the rear surface 30b of the second exposed part 33 is not in contact with the second mounting surface 307e. The second mounting surface 307e and the rear surface 30b of the second exposed part 33 are away from each other in the z direction, and a gap is formed between the second mounting surface 307e and the rear surface 30b.

In this separated state, when the shaft of the bolt 307c is inserted into the bolt hole 30c and the fastening hole 307f and the head of the bolt 307c is brought into contact with the front surface 30a of the second exposed part 33, a force toward the z direction acts on the second exposed part 33.

As described above, to enhance the intensity of the measurement current which permeates the magnetoelectric converter 25, the narrow part 31a in which the length in the x direction is locally short is formed in the covered part 31. Since the length of the narrow part 31a in the x direction is short, the rigidity of the narrow part 31a is lower than that of other parts. The narrow part 31a can be easily deformed.

Accordingly, when the force toward the z direction upon fastening of the bolt 307c acts on the second exposed part 33 as described above, there is a fear of deformation of the narrow part 31a due to the force. There is a fear of position displacement of the narrow part 31a in the sensor housing 50. Even when the narrow part 31a is not formed in the covered part 31, there is a fear of position displacement of the covered part 31 in the sensor housing 50. With the position displacement, there is a fear of change of distribution of the measurement current which permeates the magnetoelectric converter 25.

As described above, the stress relaxation member 34 is formed in each of the first exposed part 32 and the second exposed part 33. Accordingly, with the above-described positional difference in the z direction between the first mounting surface 307d and the second mounting surface 307e, even when there is a gap between the second mounting surface 307e and the rear surface 30b of the second exposed part 33, the stress relaxation member 34 is elastically deformed in correspondence with the force of the bolt 307c in the z direction. With this configuration, the deformation of the narrow part 31a is suppressed. The position displacement of the narrow part 31a in the sensor housing 50 is suppressed. As a result, the change of the distribution of the measurement current which permeates the magnetoelectric converter 25 is suppressed. The degradation of accuracy in the measurement current detection is suppressed.

Note that the length (thickness) of the stress relaxation member 34 between the front surface 30a and the rear surface 30b is equal to the respective thicknesses of the covered part 31, the first exposed part 32, and the second exposed part 33. With this configuration, different from a configuration where, e.g. the thickness of the stress relaxation member is locally thin in comparison with the thicknesses of the covered part and the exposed part, local heat generation in the stress relaxation member 34 by the current energization is suppressed. As a result, life reduction of the electrical-conduction bus bar 30 is suppressed.

Fourth Embodiment

Figure 33:
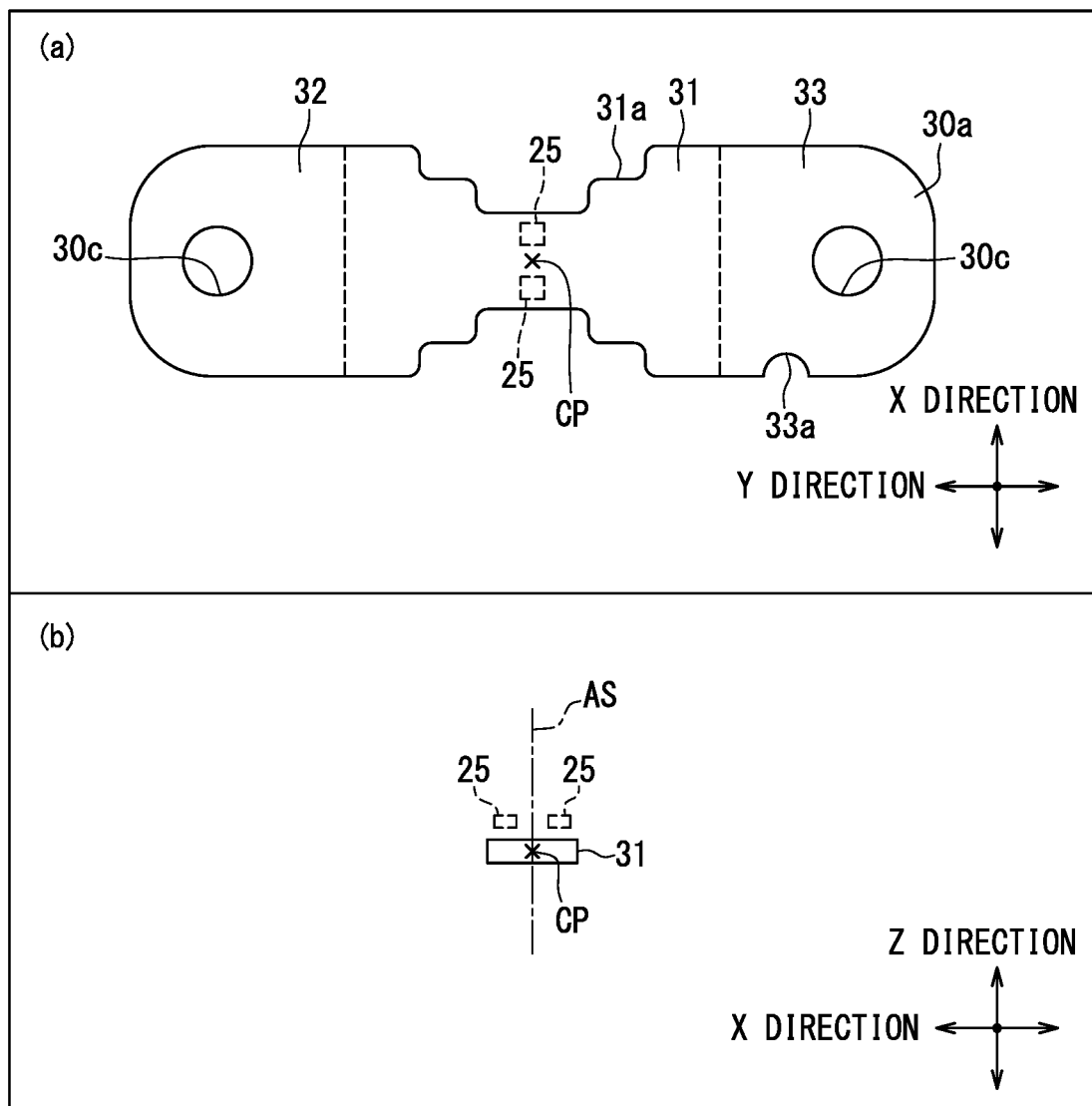
FIG. 33 illustrates diagrams showing arrangement of a magnetoelectric converter and the electrical-conduction bus bar according to a fourth embodiment.
Figure 34:
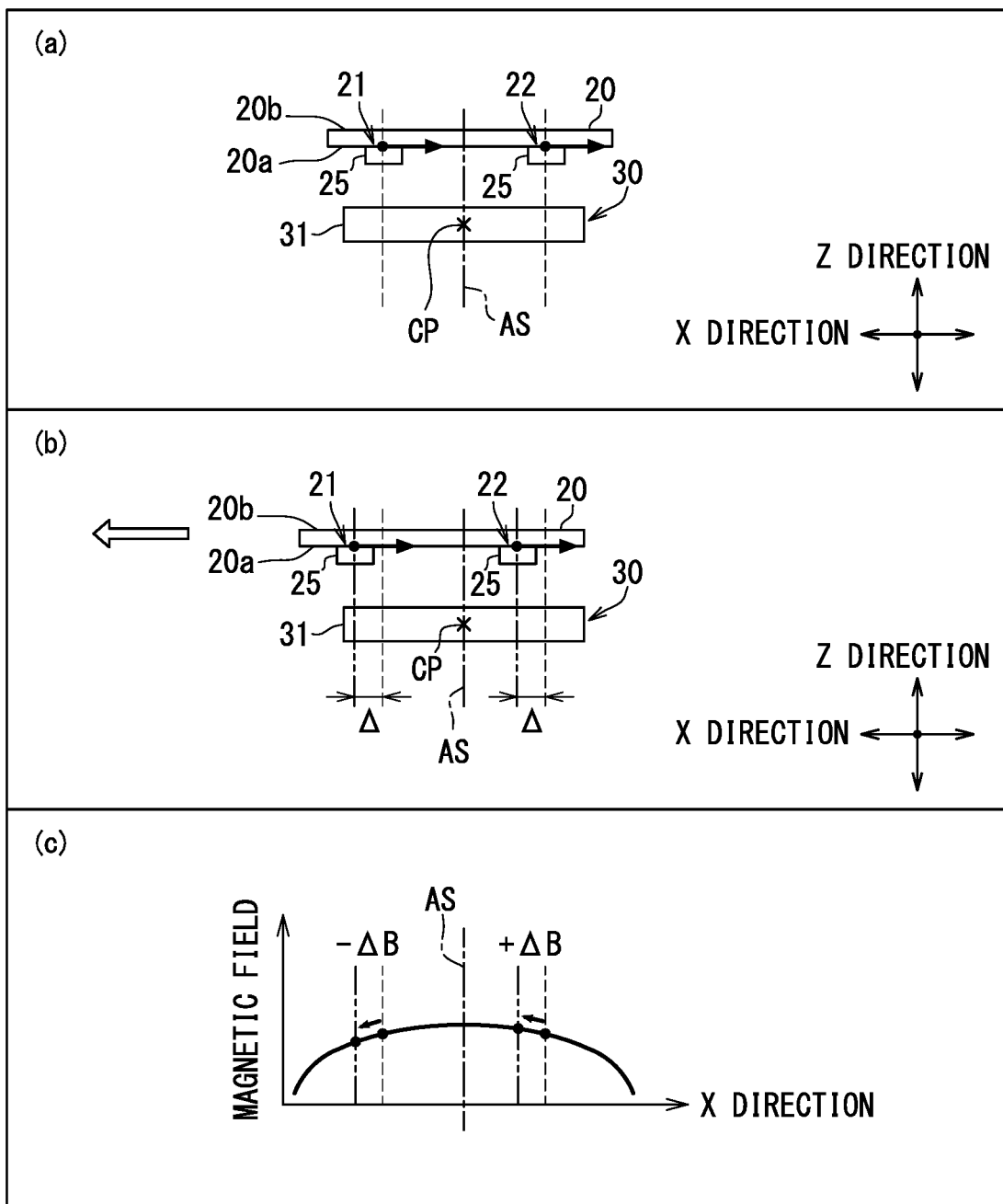
FIG. 34 illustrates diagrams for explaining output change of the magnetoelectric converter.
Figure 35:
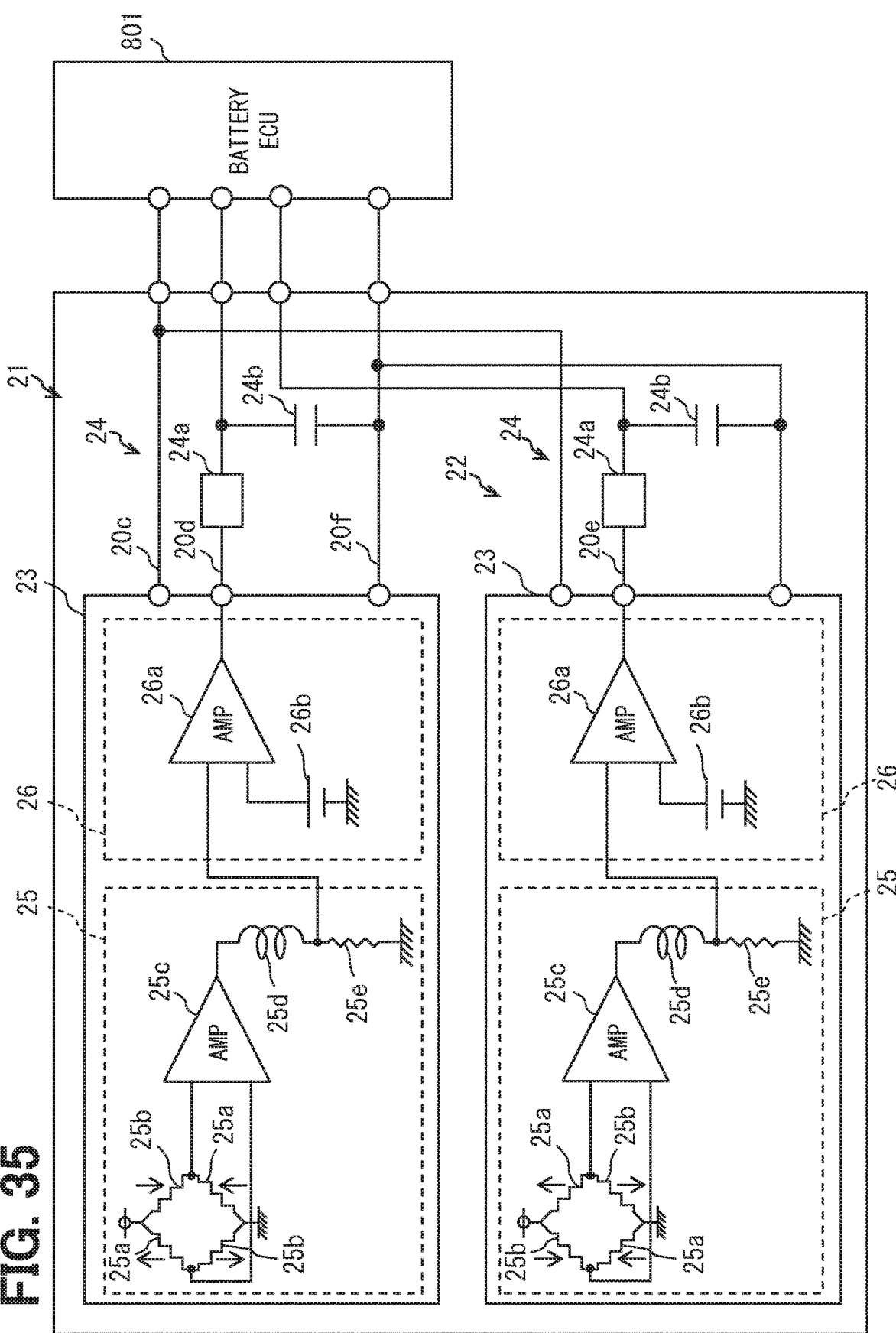
FIG. 35 is a block diagram for explaining a sensing unit according to the fourth embodiment.

Next, a fourth embodiment will be described with reference to FIG. 33 to FIG. 35. In FIG. 33, (a) shows a top view of the electrical-conduction bus bar; and (b) shows a side view of the electrical-conduction bus bar. In FIG. 34, (a) shows the position of the wiring board 20 on which the respective magnetoelectric converters 25 of the first sensing unit 21 and the second sensing unit 22 are mounted and the position of the electrical-conduction bus bar 30; (b) shows displacement of the wiring board 20 with respect to the electrical-conduction bus bar 30; and (c) shows a magnetic field which permeates the respective magnetoelectric converters 25 of the first sensing unit 21 and the second sensing unit 22.

<Difference Cancellation>

In the first embodiment, the example where the respective magnetoelectric converters 25 of the first sensing unit 21 and the second sensing unit 22 are aligned in the y direction has been shown. In the present embodiment, as indicated with a broken line in FIG. 33, the respective magnetoelectric converters 25 of the first sensing unit 21 and the second sensing unit 22 are aligned in the x direction. The magnetoelectric converter 25 of the first sensing unit 21 corresponds to a first magnetoelectric converter. The magnetoelectric converter 25 of the second sensing unit 22 corresponds to a second magnetoelectric converter.

The two magnetoelectric converters 25 are symmetrically arranged via the symmetry axis AS. The positions of the two magnetoelectric converters 25 in the y direction and the position of the symmetry axis AS (center point CP) in the y direction are the same. Accordingly, the two magnetoelectric converters 25 are aligned via the center point CP in the x direction.

Further, the distances between the two magnetoelectric converters 25 and the covered part 31 in the z direction are the same. The covered part 31 and the narrow part 31a form a line-symmetrical shape via the symmetry axis AS. Accordingly, measurement currents, having different z-direction components but equivalent x-direction components, permeate the two magnetoelectric converters 25. The absolute values of electric signals outputted from the two magnetoelectric converters 25 are equivalent to each other.

As described above, the covered part 31 is covered with the base 51 of the sensor housing 50. The wiring board 20 on which the two magnetoelectric converters 25 are mounted is mounted on the board support pin 56a formed on the sensor housing 50. Accordingly, the displacement of the wiring board 20 in the z direction is regulated with the board support pin 56a.

However, the wiring board 20 is fixed via the board adhesive 56e to the board adhesion pin 56b. In the board adhesive 56e, time deterioration such as creep or expansion due to change of the environmental temperature may occur. There is a fear of displacement of the wiring board 20 relatively in the x direction and the y direction with respect to the covered part 31.

When the wiring board 20 is displaced in the y direction, with the above-described symmetrical arrangement of the two magnetoelectric converters 25 in the x direction, the x-direction component of the measurement currents which permeate the two magnetoelectric converters 25 is not changed. However, as shown in FIG. 34, when the wiring board 20 is displaced in the x direction, the x-direction component of the measurement currents which permeate the two magnetoelectric converters 25 is changed. As a result, the absolute values of the electric signals outputted from the two magnetoelectric converters 25 are not equivalent to each other any longer.

In FIG. 34, a broken line indicates the placement locations of the two magnetoelectric converters 25 with respect to the electrical-conduction bus bar 30. An alternate long and short dash line indicates the symmetry axis AS passing through the center point CP of the electrical-conduction bus bar 30. An alternate long and two short dashes line indicates the positions of the two magnetoelectric converters 25 displaced with respect to the electrical-conduction bus bar 30. An outlined arrow indicates the direction of the displacement of the wiring board 20 on which the two magnetoelectric converters 25 are mounted, caused with the board adhesive 56e, with respect to the electrical-conduction bus bar 30. In (a) and (b) of FIG. 34, a solid arrow indicates the magnetic field which passes through the magnetoelectric converter 25. In (c) of FIG. 34, a solid arrow indicates the direction of change of the magnetic field which permeates the magnetoelectric converter 25.

As described above, both of the two magnetoelectric converters 25 are mounted on the wiring board 20. Even when the relative positions of the wiring board 20 and the covered part 31 in the x direction are changed by deformation of the board adhesive 56e as described above, the relative distance between the two magnetoelectric converters 25 mounted on the wiring board 20 is not changed. Accordingly, when the relative positions of the wiring board 20 and the covered part 31 are changed in the x direction by the deformation of the board adhesive 56e, one of the two magnetoelectric converters 25 is closer to the symmetry axis AS, while the other one of the two magnetoelectric converters 25 is away from the symmetry axis AS. The perspective distances are equivalent to each other. In (b) of FIG. 34, the perspective distance is denoted by A.

As shown in (c) of FIG. 34, the measurement current which permeates one of the two magnetoelectric converters 25 is reduced, while the measurement current which permeates the other one of the two magnetoelectric converters 25 is increased. It is expected that the decrement and the increment of the measurement currents which permeate the two magnetoelectric converters 25 become equivalent to each other. In (b) of FIG. 34, the change amount of the measurement current is indicated as AB.

In the present embodiment, the polarity of the electric signals outputted from the two magnetoelectric converters 25 is inverted. The inversion of the polarity is realized by, for example as shown in FIG. 35, reversing the arrangement of the first magnetoresistive effect element 25a and the second magnetoresistive effect element 25b in the two magnetoelectric converters 25. Otherwise, it is possible to invert the polarity of the two electric signals by, more simply, reversing the inverted input terminal and the non-inverted input terminal of the differential amplifier 25c shown in FIG. 7 in the first sensing unit 21 and the second sensing unit 22.

As described above, the electric signals, having absolute values of increment/decrement equivalent to each other, and different polarities, are outputted from the two magnetoelectric converters 25. The two electric signals generated respectively with the first current sensor 11 are inputted into the battery ECU 801. The two electric signals generated in the second current sensor 12 and the third current sensor 13 are inputted into the MG ECU 802.

The battery ECU 801 and the MG ECU 802 take the difference between the two electric signals. Assuming that the absolute values of the electric signals outputted from the two magnetoelectric converters 25 are B, and that the absolute values of change amounts of the electric signals due to the displacement are ΔB, as the difference processing, B+ΔB−(−(B−ΔB))=2B holds. Otherwise, as the difference processing, B−ΔB−(−(B+ΔB))=2B holds. "+" corresponds to one of the first polarity and the second polarity, and "−" corresponds to the other one of the first polarity and the second polarity.

The decrement and the increment of the electric signal caused by the change of the relative positions of the wiring board 20 and the covered part 31 due to the above-described deformation of the board adhesive 56e are cancelled by performing the difference processing in this manner. The battery ECU 801 and the MG ECU 802 correspond to a difference part.

Figure 36:
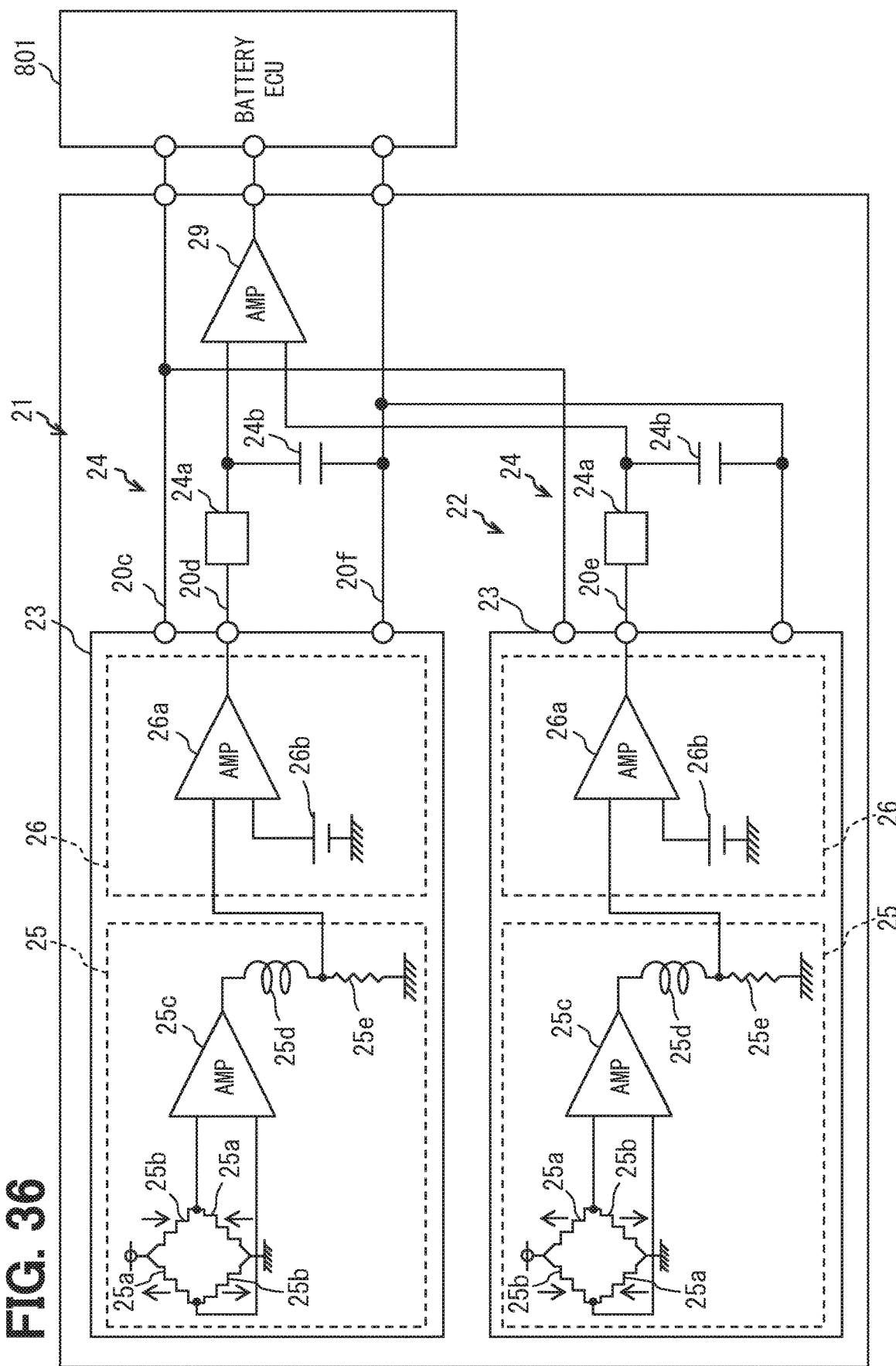
FIG. 36 is a block diagram showing a difference circuit.

Note that as shown in FIG. 36, for example, a configuration where a difference circuit 29 to take the difference between the outputs from the two magnetoelectric converters 25 is mounted on the wiring board 20 may be employed. The first output wiring 20d and the second output wiring 20e are connected to the inverted input terminal and the non-inverted input terminal of the difference circuit 29. In this case, the difference circuit 29 corresponds to the difference part.

The above-described change of the relative positions of the wiring board 20 and the covered part 31 in the x direction may be caused, not only by the above-described deformation of the board adhesive 56e, but also by vibration by external stress which acts on the vehicle or driving of the engine 600 and the like. However, even when the relative positions of the wiring board 20 and the covered part 31 in the x direction are changed by these factors, the difference between the two electric signals outputted from the two magnetoelectric converters 25 is taken as described above. With this configuration, the decrement and the increment of the electric signals by change of the relative positions of the wiring board 20 and the covered part 31 are cancelled. Accordingly, the degradation of detection accuracy of the measurement magnetic field is suppressed.

Fifth Embodiment

Next, a fifth embodiment will be described with reference to FIG. 37 and FIG. 38.

<Anisotropy of Magnetic Permeability>

In the first embodiment, the example where the first shield 41 and the second shield 42 are respectively manufactured by press-joining multiple flat plates made of a soft magnetic material has been shown. In the present embodiment, the first shield 41 and the second shield 42 are respectively manufactured by rolling magnetic steel.

As described in the first embodiment, it is possible to provide the magnetic permeability of the shield with anisotropy by specifying the rolling direction of the magnetic steel. In the present embodiment, the rolling direction of the first shield 41 and the second shield 42 is along the z direction. With this configuration, the magnetic permeability of the first shield 41 and the second shield 42 has anisotropy. Note that the manufacturing method of the first shield 41 and the second shield 42 is not limited to the above-described example. The first shield 41 and the second shield 42 may be manufactured with a material, the magnetic permeability of which has anisotropy. Further, it may be configured such that the magnetic permeability of one of the first shield 41 and the second shield 42 has anisotropy.

Figure 37:
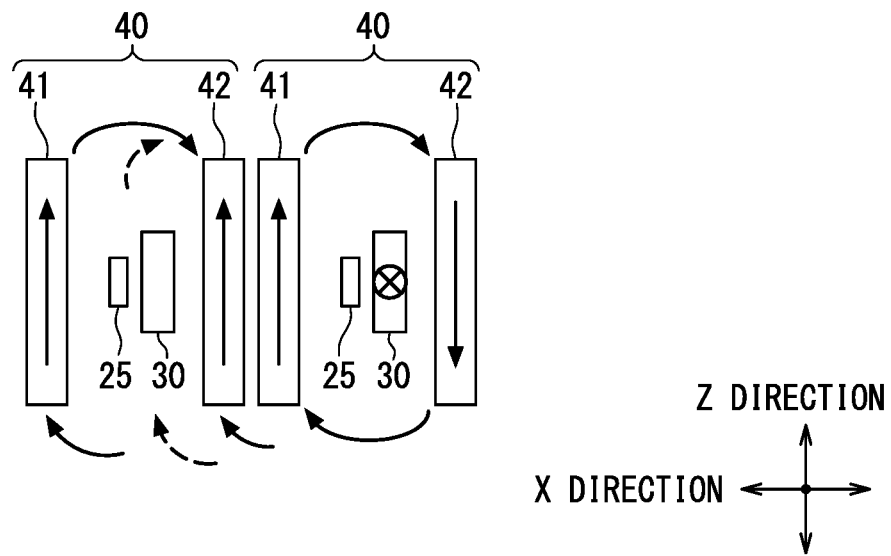
FIG. 37 is a schematic diagram for explaining shielding performance of a shield according to a fifth embodiment.

As described in FIG. 37, in the second current sensor 12 and the third current sensor 13, the respective individual sensors 71 are aligned in the x direction. The first shield 41 and the second shield 42 of the respective individual sensors 71 are alternately aligned in the x direction. In this configuration, the directions of the magnetic-field detection of the magnetoelectric converters 25 of the individual sensor 71 are the z direction and the y direction. Note that a configuration where, in two individual sensors 71 aligned in the x direction, the first shield 41 of the one of the two individual sensors 71 and the second shield 42 of the other one of the two individual sensors 71 may be bundled together as one may be employed.

In the configuration where the multiple individual sensors 71 are aligned in the x direction, the measured magnetic field emitted from the electrical-conduction bus bar 30 of one individual sensor 71 becomes external noise to the other individual sensor(s) 71. The external noise is formed in a ring shape in a plane regulated with the x direction and the z direction about the electrical-conduction bus bar 30. The external noise has components along the x direction and the z direction. In this manner, in the environment of the configuration, the external noise along the x direction and the z direction easily permeates the individual sensor 71.

FIG. 37 shows two individual sensors 71. The measurement current flows through one of the two individual sensor 71 having the electrical-conduction bus bar 30 with an enclosed cross symbol. The measured magnetic field is emitted from this electrical-conduction bus bar 30. To the adjacent individual sensor 71, the measured magnetic field emitted from the electrical-conduction bus bar 30 with the enclosed cross symbol is electromagnetic noise. FIG. 37 indicates the magnetic field with an arrow.

As described above, the first shield 41 and the second shield 42 respectively have anisotropy in the z direction. Accordingly, the component of the external noise along the z direction attempts to enter the first shield 41 and the second shield 42 respectively. On the other hand, the component of the external noise along the x direction does not depend on the anisotropy of the first shield 41 and the second shield 42 any longer. The component along the x direction attempts to permeate the magnetoelectric converter 25.

For example, when the magnetic field indicated with a broken arrow in FIG. 37 attempts to pass through the magnetoelectric converter 25, the component of the magnetic field along the z direction actively attempts to pass through the first shield 41 and the second shield 42 respectively. However, the component of the magnetic field in the x direction somewhat remains. Accordingly, the component of the magnetic field in the x direction attempts to permeate the magnetoelectric converter 25.

On the other hand, the detecting directions of measured magnetic field of the magnetoelectric converter 25 are the z direction and the y direction. The magnetoelectric converter 25 does not detect the magnetic field in the x direction. Even when the above-described component of the magnetic field in the x direction permeates the magnetoelectric converter 25, the degradation of detection accuracy of the measurement magnetic field, due to the permeation of the electromagnetic noise, is suppressed.

The alignment of the individual sensors 71 is not limited to the above-described example. For example, as shown in FIG. 38, a configuration where the individual sensors 71 are aligned in the x direction is conceivable. In this configuration, the first shields 41, the second shields 42, and the magnetoelectric converters 25, of the individual sensors 71, are aligned in the x direction. The magnetic-field detection directions of the magnetoelectric converter 25 of the individual sensor 71 are the x direction and the y direction. In this configuration, it may be configured such that the first shields 41 of the multiple individual sensors 71 aligned in the x direction are bundled together as one. Similarly, it may be configured such that the second shields 42 of the multiple individual sensors 71 are bundled together as one.

Figure 38:
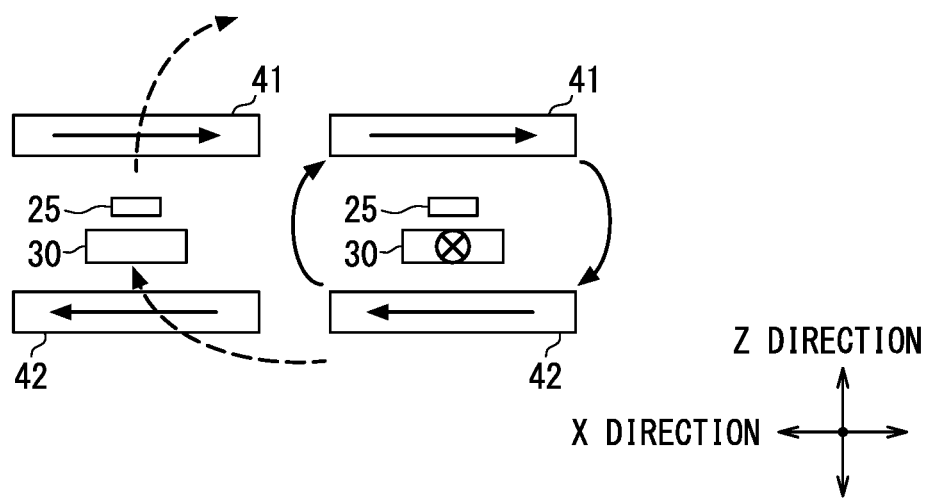
FIG. 38 is a schematic diagram for explaining the shielding performance of a shield.

FIG. 38 also shows two individual sensors 71. The measurement current flows through one of the two individual sensor 71 having the electrical-conduction bus bar 30 with an enclosed cross symbol. FIG. 38 also indicates the magnetic field with an arrow. The magnetic field has components along the x direction and the z direction. Accordingly, the configuration has an environment where the external noise along the x direction and the z direction easily permeates the individual sensor 71.

In this configuration, the magnetic permeability of the first shield 41 and the second shield 42 in the x direction is higher than that in the y direction. Accordingly, the component of the external noise along the x direction attempts to enter the first shield 41 and the second shield 42 respectively. On the other hand, the component of the external noise along the z direction does not depend on the anisotropy of the first shield 41 and the second shield 42 any longer. The component along the z direction attempts to permeate the magnetoelectric converter 25.

For example, when the magnetic field indicated with a broken arrow in FIG. 38 attempts to pass through the magnetoelectric converter 25, the component of the magnetic field along the x direction actively attempts to pass through the first shield 41 and the second shield 42 respectively. However, the component of the magnetic field in the x direction somewhat remains. Accordingly, the component of the magnetic field in the z direction attempts to permeate the magnetoelectric converter 25.

The detecting directions of the measurement magnetic field of the magnetoelectric converter 25 are the z direction and the y direction. The magnetoelectric converter 25 does not detect the magnetic field in the z direction. Even when the above-described component of the electromagnetic noise in the z direction permeates the magnetoelectric converter 25, the degradation of detection accuracy of the measured magnetic field, due to the permeation of the electromagnetic noise, is suppressed.

The embodiments of the present disclosure have been explained hereinabove. The present disclosure is not limited to the above-described embodiments, but various changes can be made and implemented within the gist of the present disclosure.

(First Modification)

In the first embodiment, the example where the notches 41c are formed at the four corners of the first shield 41 has been shown. In this example, in the first opposite end part 41e of the first shield 41, the length in the x direction is shorter than that of the first center part 41d. The extending part 42c is formed in the second shield 42.

Figure 39:
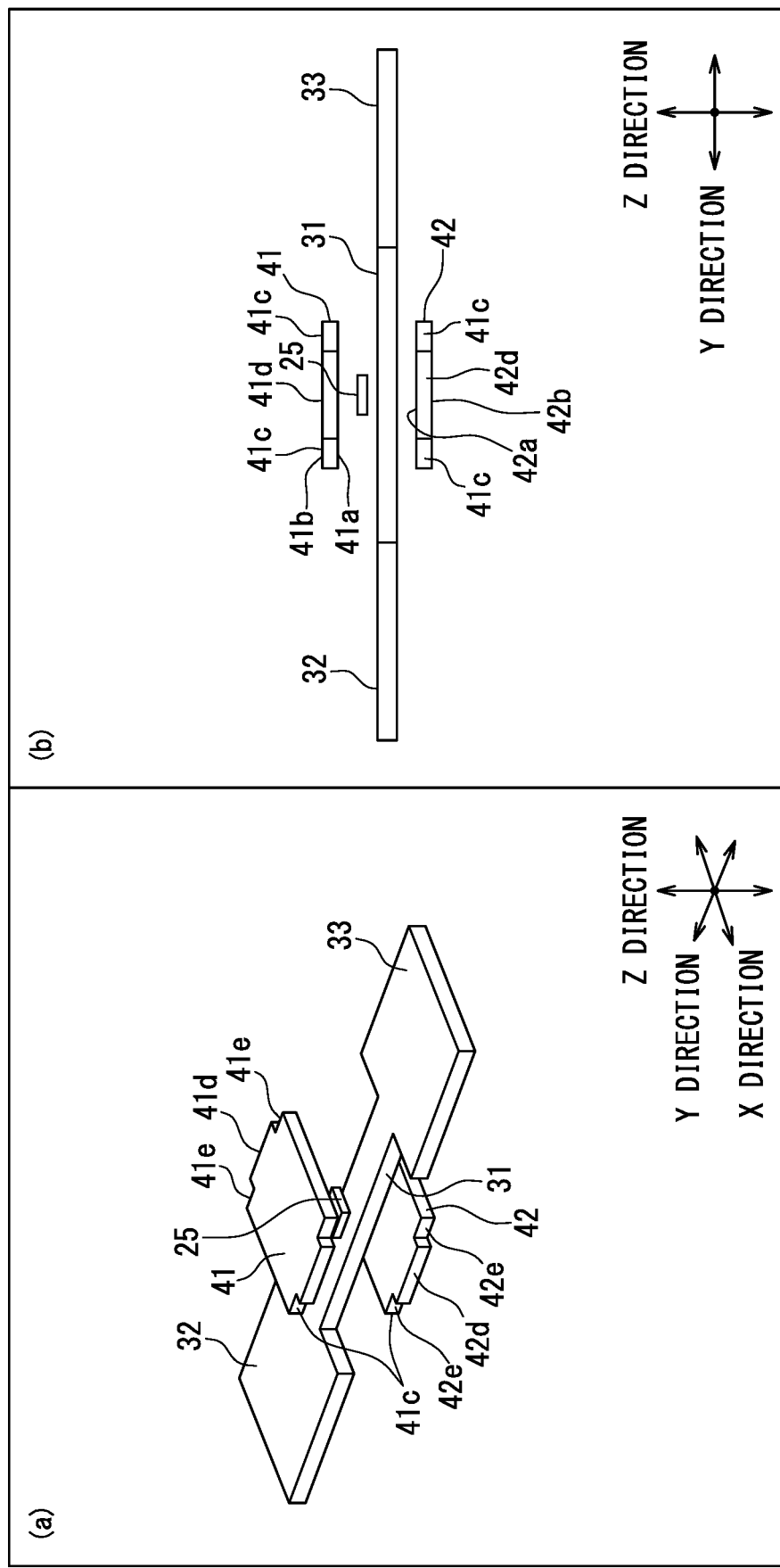
FIG. 39 illustrates diagrams showing another modification of the shield.

As shown in FIG. 39, a configuration where the notches 41c are formed at the four corners of each of the first shield 41 and the second shield 42 may be employed. In the second opposite end part 42e, the length in the x direction is shorter than that of the second center part 42d. As shown in (b) of FIG. 39, the magnetoelectric converters 25 of the first sensing unit 21 and the second sensing unit 22 mounted on the wiring board 20 are positioned between the first center part 41d and the second center part 42d. In FIG. 39, (a) shows a perspective view for explaining the arrangement of the shield, the magnetoelectric converter, and the electrical-conduction bus bar; and (b) is a side view for explaining the arrangement of the shield, the magnetoelectric converter, and the electrical-conduction bus bar.

Figure 40:
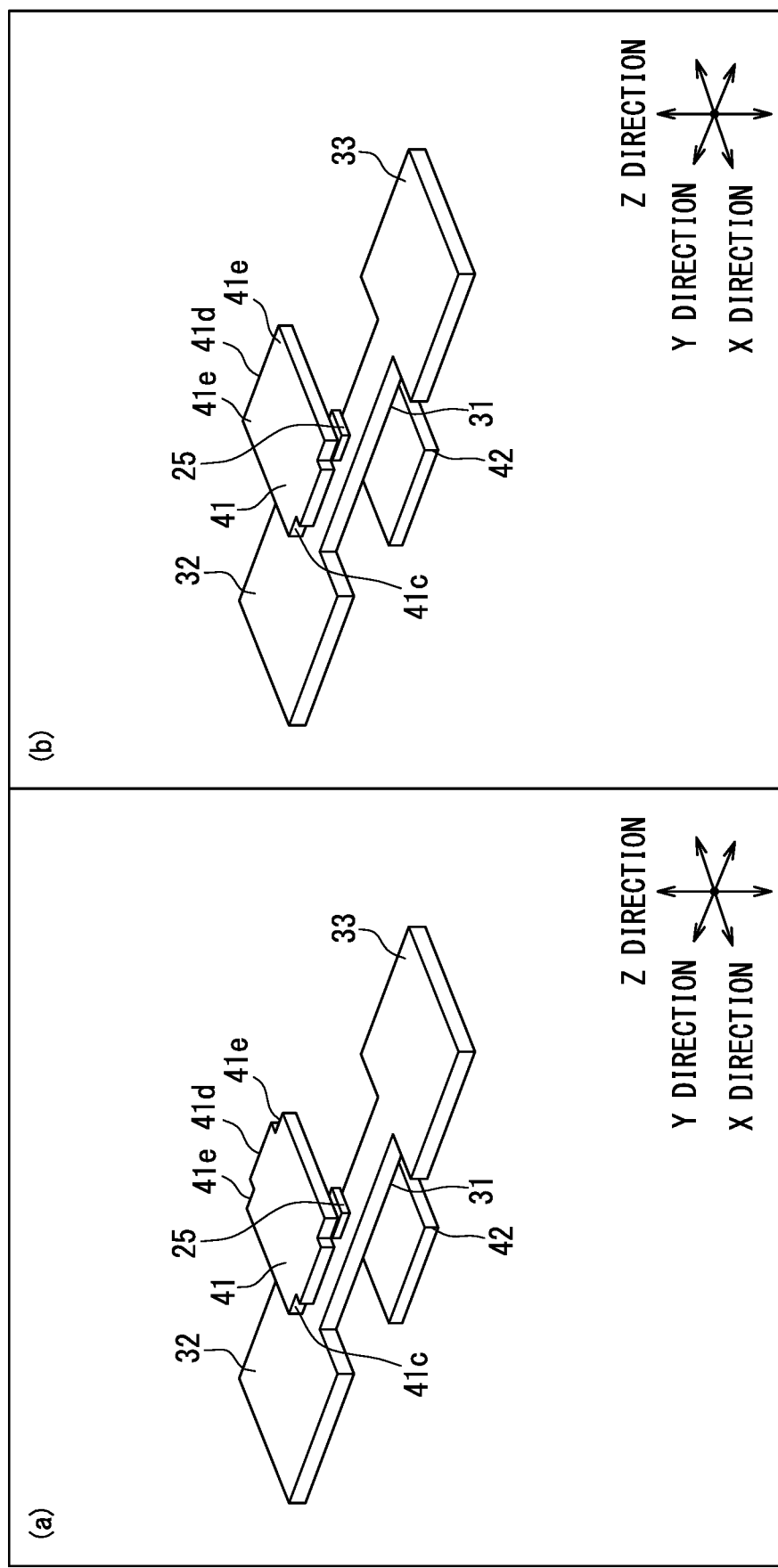
FIG. 40 illustrates diagrams showing another modification of the shield.

Further, as shown in (a) of FIG. 40, it may be configured such that the extending part 42c and the notch 41c are not formed in the second shield 42. As shown in (b) of FIG. 40, a configuration where the notches 41c are formed at two of the four corners of the first shield 41 may be employed. Note that in (b) of FIG. 40, two notches 41c are aligned in the x direction. In FIG. 40, (a) and (b) are perspective views for explaining the arrangement of the shield, the magnetoelectric converter, and the electrical-conduction bus bar. As shown above, the forming position of the notch 41c is not particularly limited as long as the length of the first both end part 41e of the first shield 41 in the x direction is shorter than that of the first center part 41d.

(Second Modification)

Figure 41:
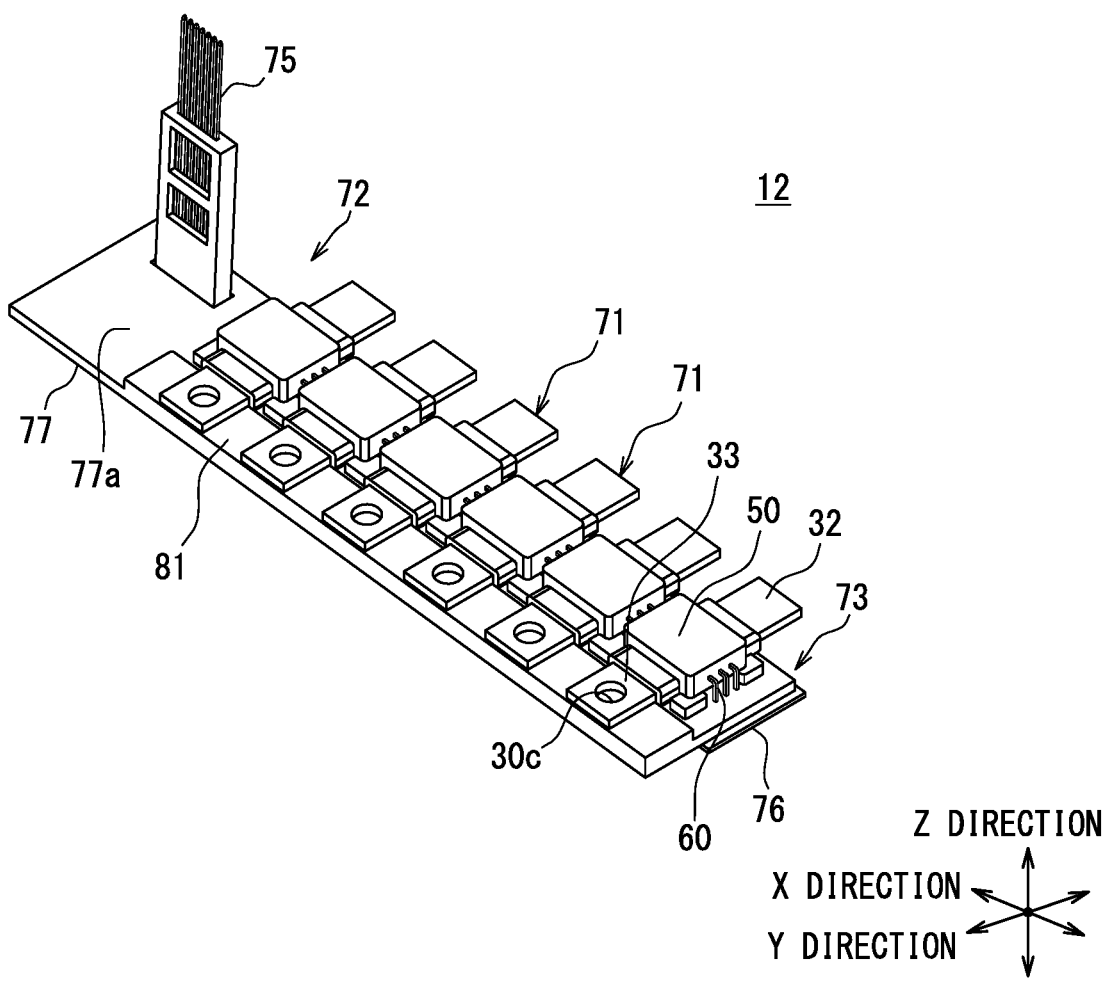
FIG. 41 is a perspective view showing a modification of the second current sensor.
Figure 42:
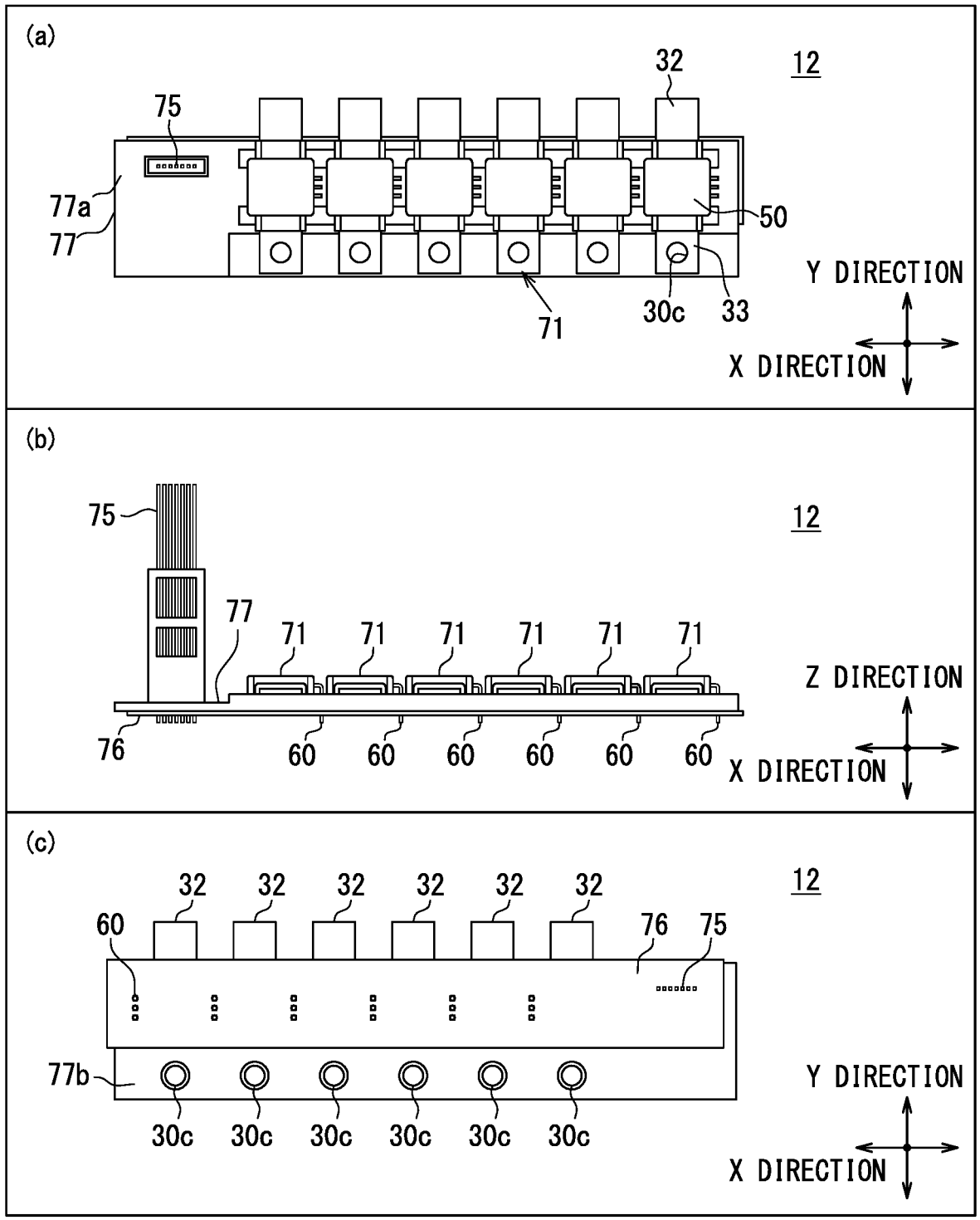
FIG. 42 illustrates diagrams showing another modification of the second current sensor.
Figure 43:
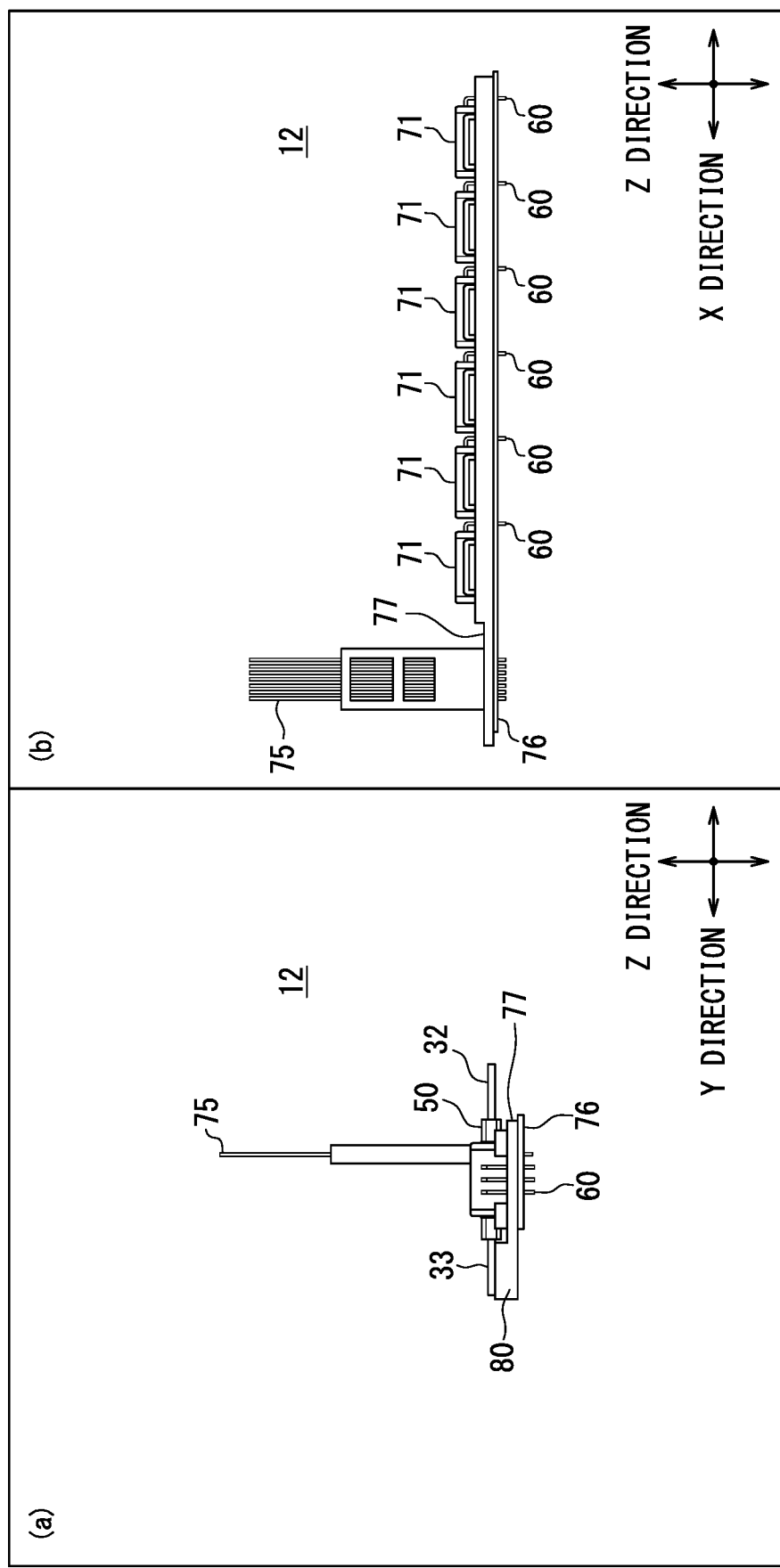
FIG. 43 illustrates diagrams showing another modification of the second current sensor.

In the first embodiment, the example where the integrated housing 73 has the bottom wall 77 and the peripheral wall 78, and the multiple individual sensors 71 are accommodated in the storage space provided by the bottom wall 77 and the peripheral wall 78 of the integrated housing 73, has been shown. However, as shown in FIG. 41 to FIG. 43, it may be configured such that the integrated housing 73 does not have the peripheral wall 78. In this case, the individual sensor 71, rotated at 90°, is provided with respect to the bottom wall 77. Thus, the front surface 30a and the rear surface 30b of the electrical-conduction bus bar 30 in the individual sensor 71 respectively face in the z direction. The one surface 41a and the rear surface 41b of the first shield 41 respectively face in the z direction. Similarly, the one surface 42a and the rear surface 42b of the second shield 42 respectively face in the z direction. The detection directions of the magnetoelectric converters 25 of the individual sensor 71 are the x direction and the y direction.

With this configuration, as shown in FIG. 38, the first shields 41 of the multiple individual sensors 71 are aligned in the x direction. The second shields 42 of the multiple individual sensors 71 are aligned in the x direction. The magnetoelectric converters 25 of the multiple individual sensors 71 are aligned in the x direction.

Note that in FIG. 42, (a) shows a top view of the second current sensor; (b) shows a front view of the second current sensor; and (c) shows a bottom view of the second current sensor. In FIG. 43, (a) shows a side view of the second current sensor; and (b) shows a front view of the second current sensor. (b) of FIG. 42 and (b) of FIG. 43 show the same figure.

In the present modification, bolt holes, the number of which is the same as the number of the individual sensors 71, are formed along the z direction in the terminal block 80. The bolt hole 30c is formed in the second exposed part 33 of the individual sensor 71. The bolt is inserted through the bolt hole in the terminal block 80, the bolt hole 30c in the second exposed part 33, and the bolt hole formed in the wire terminal. Further, the nut is fastened to the end of the bolt. The nut is fastened to the bolt from the end of the bolt shaft toward the bolt head. The second exposed part 33 and the wire terminal are held between the bolt head and the terminal block 80. With this configuration, the second exposed part 33 and the wire terminal are brought into contact, and electrically and mechanically connected to each other.

Third Embodiment

Figure 44:
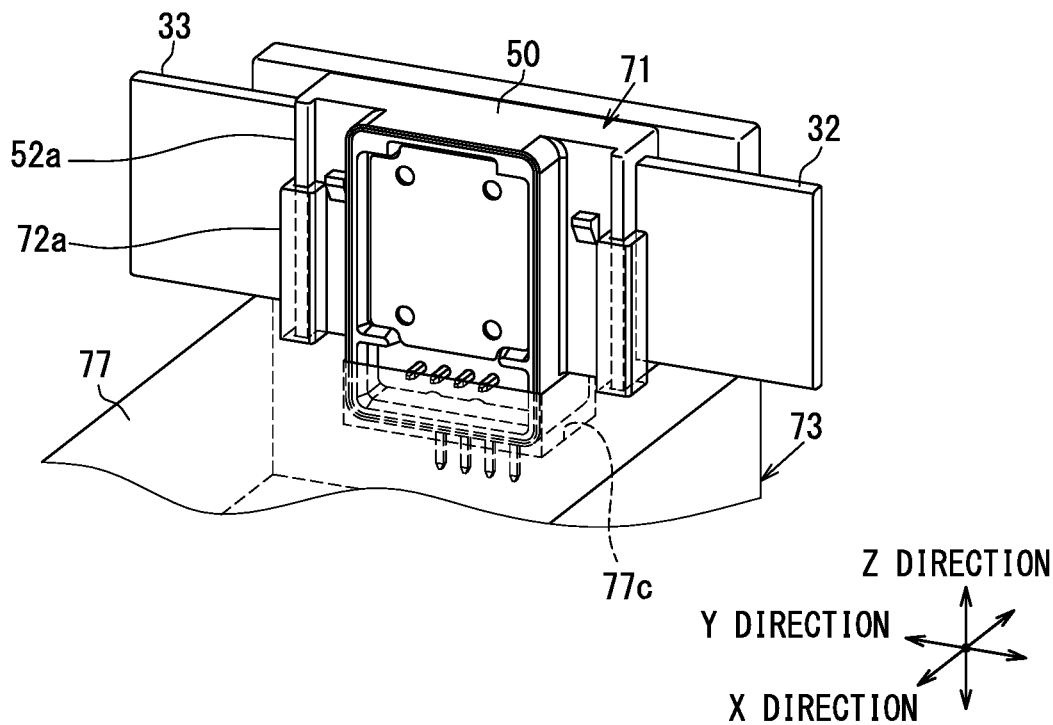
FIG. 44 is a perspective view showing assembling of an individual sensor to a wiring case.

As shown in the first embodiment, the rib 52a is formed in the sensor housing 50 of the first current sensor 11. Similarly, as shown in FIG. 44, the rib 52a may be formed in the sensor housing 50 of the individual sensor 71. A guide part 72a for insertion of the individual sensor 71 into the wiring case 72 may be formed on the bottom wall 77 of the integrated housing 73. The guide part 72a forms a groove having a hollow part in a similar shape to that of the rib 52a. The guide part 72a is opened in the z direction. The rib 52a is passed via the opening into the hollow part of the guide part 72a. With this configuration, the individual sensor 71 is easily assembled to the integrated housing 73 of the individual sensor 71. Note that in the modification shown in FIG. 44, a groove 77c for providing the protruding end of the connection terminal 60 in the individual sensor 71 is formed in the bottom wall 77.

(Fourth Modification)

Figure 45:
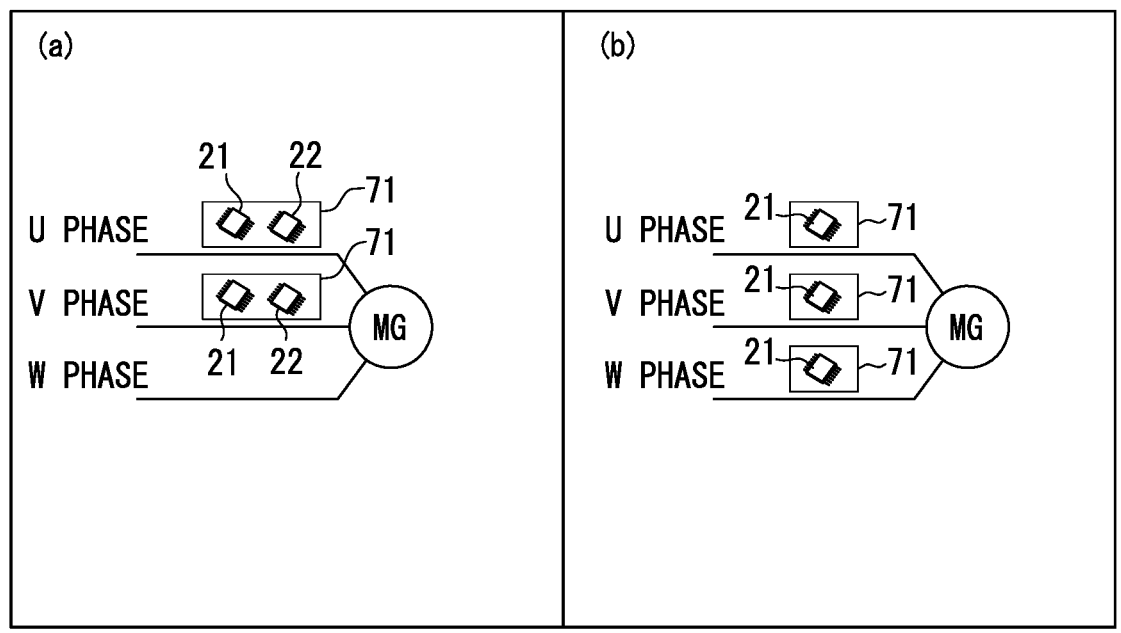
FIG. 45 illustrates diagrams for explaining types of detection form.

As schematically shown in (a) of FIG. 45, in the respective embodiments, the example where the individual sensors 71 are provided on the U phase stator coil and the V phase stator coil of the motor has been shown. In the example, these individual sensors 71 have the first sensing unit 21 and the second sensing unit 22.

However, as schematically shown in (b) of FIG. 45, a configuration where the individual sensors 71 are provided on the U phase stator coil, the V phase stator coil, and the W phase stator coil of the motor may be employed. These individual sensors 71 may only have the first sensing units 21.

As described above, in the three phase stator coils, based on the currents which flow through the two stator coils, the remaining one current can be detected. Accordingly, based on outputs from two of the first sensing units 21 of the three individual sensors 71 provided on the three phase stator coils, the current which flows through the remaining one stator coil can be detected. Further, with the first sensing unit 21 of the individual sensor 71 provided on this remaining one stator coil, the current which flows through the remaining one stator coil can be detected. It is possible to determine whether or not an abnormality occurs in one of the two stator coils by comparing the two detected currents.

(Other Modifications)

In the respective embodiments, the example where the current sensor is applied to the in-vehicle system 100 which forms a hybrid system has been shown. However, the in-vehicle system to which the current sensor is applied is not limited to the above-described example. For example, the current sensor may be applied to the in-vehicle system of an electric vehicle or an engine vehicle. The system to which the current sensor is applied is not particularly limited.

While only the selected exemplary embodiments and examples have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiment and examples according to the present disclosure is provided for illustration only, and not for the purpose of limiting the disclosure as defined by the appended claims and their equivalents.

What is claimed is:

1. A current sensor comprising:
    a plurality of individual sensors, each including:
        an electrical-conduction member through which a measurement current to be measured flows;
        a magnetoelectric converter that converts a measurement magnetic field caused by a flow of the measurement current into an electric signal; and
        an insulating sensor housing that accommodates the electrical-conduction member and the magnetoelectric converter therein; and
    a wiring case being larger than the sensor housing, and including:
        an insulating integrated housing in which the plurality of individual sensors is fixed; and
an input/output wiring disposed in the integrated housing and electrically connected to the magnetoelectric converter of each of the plurality of individual sensors, wherein
each of the plurality of individual sensors includes a shield that restricts an electromagnetic noise into the magnetoelectric converter, wherein
the shield includes a first shield and a second shield each having a plate shape, the first shield and the second shield being arranged such that surfaces are opposed to and spaced away from each other,
a part of the electrical-conduction member and the magnetoelectric converter are located between the surface of the first shield and the surface of the second shield,
the part of the electrical-conduction member located between the first shield and the second shield extends in an extension direction along the surface of the first shield, and
the magnetoelectric converter is configured to detect the measurement magnetic field in a direction along the surface of the first shield, and
at least one of the first shield and the second shield has an anisotropy in magnetic permeability in which the magnetic permeability in the lateral direction that is along the surface of the first shield and perpendicular to the extension direction is higher than the magnetic permeability in the extension direction.

2. The current sensor according to claim 1, wherein the plurality of individual sensors fixed in the integrated housing are aligned with each other in a direction perpendicular to the surface of the first shield.

3. The current sensor according to claim 1, wherein the plurality of individual sensors fixed in the integrated housing are aligned with each other in the lateral direction that is along the surface of the first shield and perpendicular to the extension direction.

* * * * *